(12) United States Patent
Zonenberg et al.

(10) Patent No.: US 9,728,699 B2
(45) Date of Patent: Aug. 8, 2017

(54) THERMAL TRANSPIRATION DEVICE AND METHOD OF MAKING SAME

(75) Inventors: Andrew D. Zonenberg, Troy, NY (US); Jason D. Sanchez, Delmar, NY (US); Piotr A. Garbuz, New York, NY (US)

(73) Assignee: GAME CHANGERS, LLC, New York, NY (US)

( * ) Notice: Subject to any disclaimer, the term of this patent is extended or adjusted under 35 U.S.C. 154(b) by 889 days.

(21) Appl. No.: 14/001,919

(22) PCT Filed: Mar. 1, 2012

(86) PCT No.: PCT/US2012/027325
§ 371 (c)(1),
(2), (4) Date: Dec. 6, 2013

(87) PCT Pub. No.: WO2012/118995
PCT Pub. Date: Sep. 7, 2012

(65) Prior Publication Data
US 2014/0083670 A1 Mar. 27, 2014

Related U.S. Application Data

(60) Provisional application No. 61/448,615, filed on Mar. 2, 2011.

(51) Int. Cl.
*F04B 17/00* (2006.01)
*H01L 35/02* (2006.01)
(Continued)

(52) U.S. Cl.
CPC ............ *H01L 35/02* (2013.01); *F04B 19/006* (2013.01); *F04B 43/043* (2013.01); *B82Y 30/00* (2013.01); *Y10T 156/10* (2015.01)

(58) Field of Classification Search
CPC ...... H01L 35/02; F04B 43/043; F04B 19/006; Y10T 156/10; B82Y 30/00
(Continued)

(56) References Cited

U.S. PATENT DOCUMENTS 5,180,288 A * 1/1993 Richter ................. B05B 5/16
417/413.3
5,871,336 A * 2/1999 Young ................... F04B 37/06
417/207
(Continued)

FOREIGN PATENT DOCUMENTS

JP 2007-332794 A 12/2007
KR 20100036749 * 4/2010
(Continued)

OTHER PUBLICATIONS

International Search Report (PCT/ISA/210) issued on Jun. 21, 2012, by the Russian Patent Office as the International Searching Authority for International Application No. PCT/US2012/027325.

*Primary Examiner* — Charles Freay
(74) *Attorney, Agent, or Firm* — Buchanan Ingersoll & Rooney PC

(57) ABSTRACT

A thermal transpiration device and method of making the same. The device includes a pair of membranes having predetermined thicknesses in order to provide the device with strength and rigidity. The thickness of a portion of each membrane is reduced in the area where thermal transpiration occurs in order to optimize the effectiveness of the thermal transpiration device without scarifying structural integrity of the device.

20 Claims, 40 Drawing Sheets

(51) Int. Cl.
*F04B 19/00* (2006.01)
*F04B 43/04* (2006.01)
*B82Y 30/00* (2011.01)

(58) Field of Classification Search
USPC .................................................. 417/413.3
See application file for complete search history.

(56) References Cited

U.S. PATENT DOCUMENTS

| | | | | |
|---|---|---|---|---|
| 6,147,438 | A * | 11/2000 | Nishiwaki | H01L 41/0973 310/363 |
| 6,395,638 | B1 * | 5/2002 | Linnemann | F04B 43/043 417/413.1 |
| 6,422,823 | B2 * | 7/2002 | Bernard | 414/217 |
| 7,572,110 | B2 * | 8/2009 | Bernard | F04B 19/24 219/209 |
| 2004/0179946 | A1 | 9/2004 | Gianchandani et al. | |
| 2004/0244356 | A1 | 12/2004 | Ronney | |

FOREIGN PATENT DOCUMENTS

RU 2335334 C1 10/2008
WO WO 2004/065788 A1 8/2004

* cited by examiner

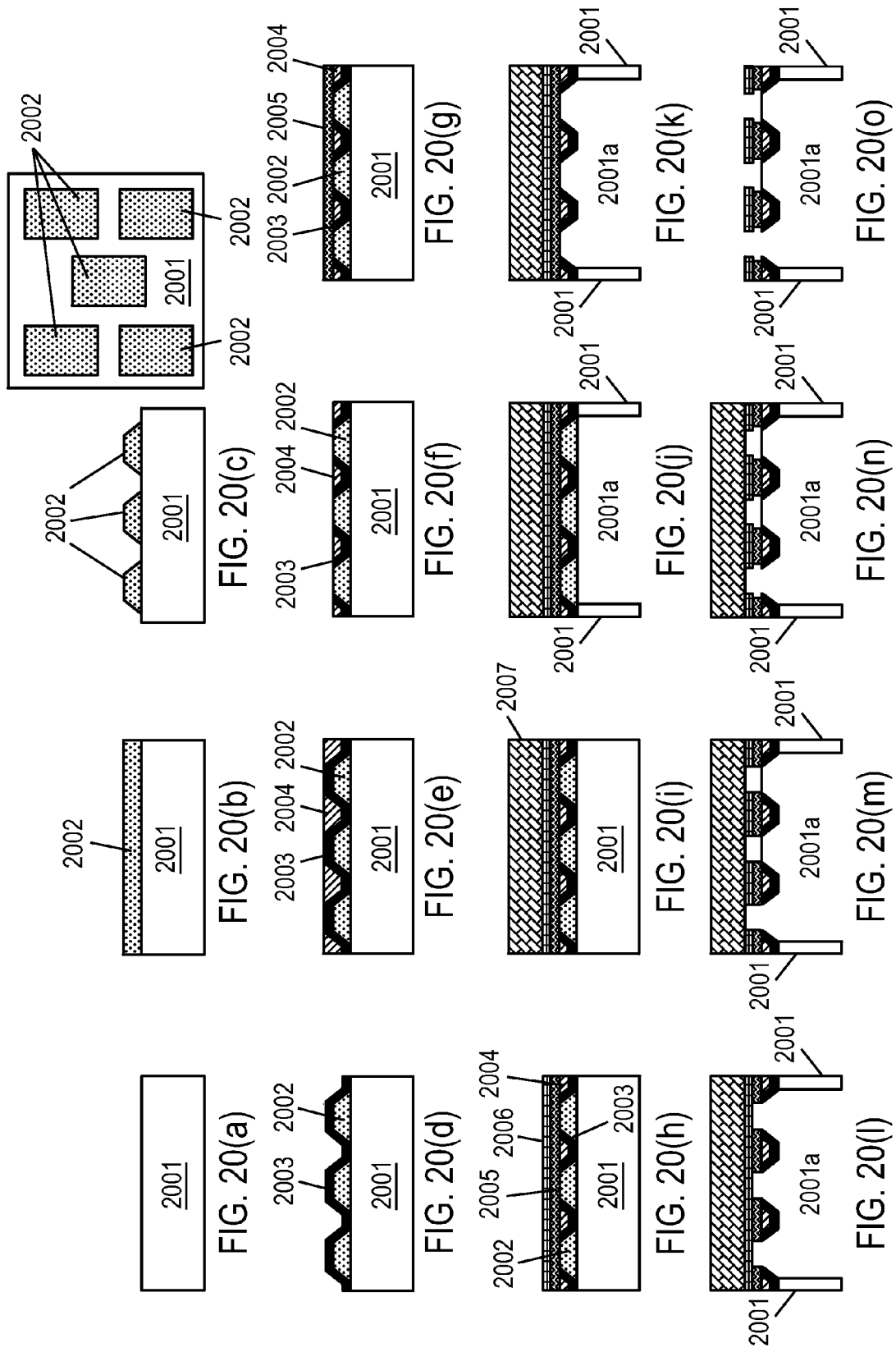

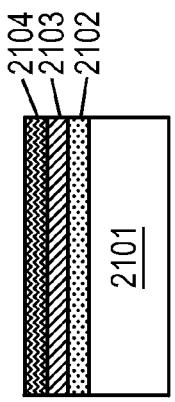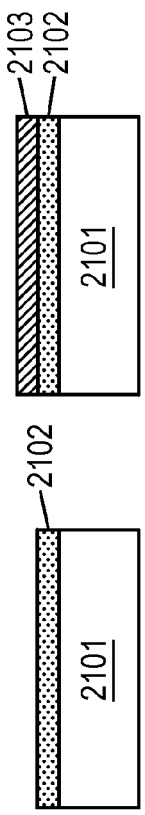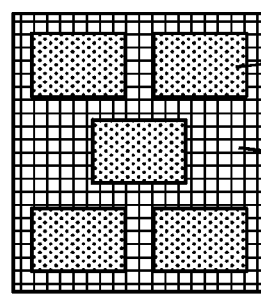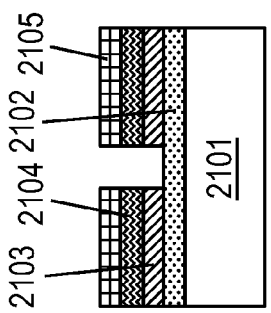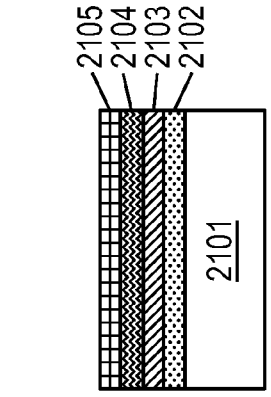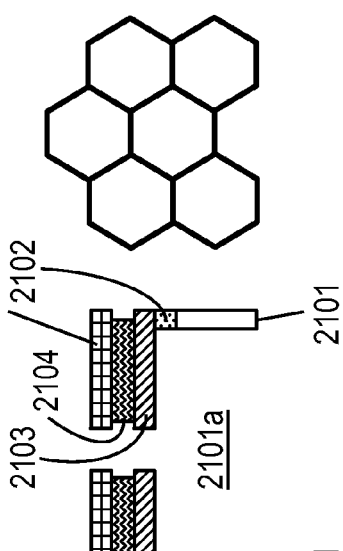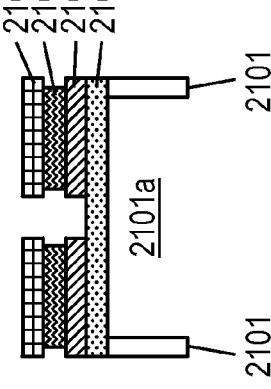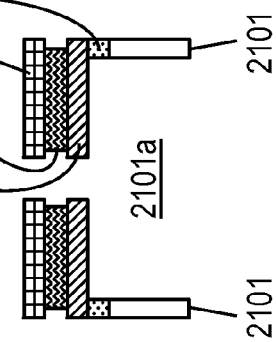

THERMAL TRANSPIRATION DEVICE AND METHOD OF MAKING SAME

CROSS REFERENCE

This application contains references to U.S. Provisional Application Nos. 61/239,446, filed Sep. 3, 2009, 61/264,778, filed Nov. 27, 2009, 61/296,198, filed Jan. 19, 2010, and 61/448,615, filed Mar. 2, 2011, and PCT International Application No. US2010/002428, filed Sep. 3, 2010, the entire contents of which are hereby incorporated by reference herein. Priority is claimed to U.S. Provisional Application No. 61/448,615, filed Mar. 2, 2011.

TECHNICAL FIELD

The present disclosure relates to methods and apparatus for causing the movement of fluids, for example gases, which may be applied to propulsion systems, vacuum generation, gas compression, and other uses.

The present disclosure is further generally related to the field of thermal transpiration devices and, more particularly, is directed toward a method of making such a device.

BACKGROUND

Devices for the movement of gases are widely utilized. The very first aircraft engines were piston driven propellers. They worked by coupling a piston engine to a propeller. Their simplicity lead to widespread adoption until jet engines were invented. Turbojet engines work by the principle of coupling a turbine to a fuel combination system. Spinning of the turbine compresses a fuel-air mixture which, when burned, provides thrust and torque to rotate the turbine. The first turbojet engines derived their thrust from exhaust leaving the engines. Modern variants of the turbojet engines include turbo prop and turbofan engines, which use torque generated by the exhaust to drive a propeller or fan in addition to compressing the fuel-air mixture. Rocket engines are possibly one of the oldest mechanical propulsion systems, and have not changed much since their inception. A rocket comprises a tube or cone in which sits (or into which is fed) a fuel oxidizer mixture. Expanding gas from combustion of this mixture creates thrust. Rockets, while offering the highest fuel-thrust ratio of any existing propulsion systems, cannot easily vary the amount of thrust they generate. Even adding an ability to turn a rocket on or off significantly complicates its design.

Adhesion between two materials may be characterized into five types: mechanical, chemical, dispersive, electrostatic, and diffusive. Out of these five types, so far, only electrostatic and certain types of mechanical adhesion are easily reversible processes. Vacuum may be used to adhere surfaces and lift materials. However, such devices generally require separate mechanisms for generating a reduced pressure and applying the vacuum to a surface.

Generally, the conventional propulsion systems mentioned above can also be used to compress gas. It is also possible to compress gas via the ideal gas law, such as in piston or diaphragm pumps. Current devices generally require pumping apparatuses separate from a pressurized vessel.

The ability of temperature differential to drive gas flow at a surface has long been known. In 1873, Sir William Crookes developed a radiometer for measuring radiant energy of heat and light. Today, Crookes's radiometer is often sold as a novelty in museum stores. It consists of four vanes, each of which is blackened on one side and light on the other. These are attached to a rotor that can turn with very little friction. The mechanism is encased inside a clear glass bulb with most, but not all, of the air removed. When light falls on the vanes, the vanes turn with the black surfaces apparently being pushed by the light.

Crookes initially explained that light radiation caused a pressure on the black sides to turn the vanes. His paper was referred to by James Clerk Maxwell, who accepted the explanation as it seemed to agree with his theories of electromagnetism. However, light falling on the black side of the vanes is absorbed, while light falling on the silver side is reflected. This would put twice as much radiation pressure on the light side as on the black, meaning that the mill is turning the wrong way for Crooke's initial explanation to be correct. Other incorrect explanations were subsequently proposed, some of which persist today. One suggestion was that the gas in the bulb would be heated more by radiation absorbed on the black side than the light side. The pressure of the warmer gas was proposed to push the dark side of the vanes. However, after a more thorough analysis Maxwell showed that there could be no net force from this effect, just a steady flow of heat across the vanes. Another incorrect explanation that is widely put forward even today is that the faster motion of hot molecules on the black side of the vane provide the push.

The correct explanation for the action of Crookes radiometer derives from work that Osborne Reynolds submitted to the Royal Society in early 1879. He described the flow of gas through porous plates caused by a temperature difference on opposing sides of the plates which he called "thermal transpiration." Gas at uniform pressure flows through a porous plate from cold to hot. If the plates cannot move, equilibrium is reached when the ratio of pressures on either side is the square root of the ratio of absolute temperatures. Reynolds' paper also discussed Crookes radiometer. Consider the edges of the radiometer vanes. The edge of the warmer side imparts a higher force to obliquely striking gas molecules than the cold edge. This effect causes gas to move across the temperature gradient at the edge surface. The vane moves away from the heated gas and towards the cooler gas, with the gas passing around the edge of the vanes in the opposite direction. Maxwell also referred to Reynolds' paper, which prompted him to write his own paper, "On stresses in rarefied gases arising from inequalities of temperature." Maxwell's paper, which both credited and criticized Reynolds, was published in the Philosophical Transactions of the Royal Society in late 1879, appearing prior to the publication of Reynolds' paper. See, Philip Gibbs in "The Physics and Relativity FAQ," 2006, at math.ucr.edu/home/baez/physics/General/LightMill/light-mill.html.

Despite the descriptions by Reynolds and Maxwell of thermally driven gas flow on a surface dating from the late 19th century, the potential for movement of gases by interaction with hot and cold surfaces has not been fully realized. Operation of a Crookes radiometer requires rarefied gas (i.e., a gas whose pressure is much less than atmospheric pressure), and the flow of gas through porous plates does not yield usable thrust, partially due to the thickness and due to the random arrangement of pores in the porous plates.

Thermal transpiration refers generally to the forces on a plate or other substrate during the formation of a pressure gradient in gas between the two surfaces of the plate. The pressure gradient is formed when there is a temperature gradient between the two surfaces, and when the mean free path of the molecules in the gas is a significant fraction of the distance between the two surfaces.

Construction of a thermal transpiration device to operate at 101 KPa (standard atmosphere pressure) is difficult as, optimally, the hot and cold sides must be within 100 nm or less of each other. Furthermore, a thermal transpiration device operating at a lower pressure, e.g., 30 KPa (standard cruising altitude ~30,000 ft above sea level), has not been previously built. Nor has one been built at 70,000 ft (4.5 KPa). A 100 nm thick film exposed to an unfiltered, uncontrolled environment tends to be too fragile to withstand typical environmental stresses, such as, for example, impact from debris and/or handle the sheer forces produced by changes in air current.

Furthermore, the only insulation that is generally efficient at that scale is a vacuum. This means that that if the Bernoulli effect is used to draw a vacuum between the two membranes, at least one of the membranes used to form the thermal transpiration device must be thinner than 50 nm. Such a thin membrane would not last long due to the typical environmental stresses placed on the device when in use.

The present invention increases the durability of a thermal transpiration membrane operating, for example, in the stratosphere and/or in the troposphere. It does so by increasing the thickness of the membrane without increasing the distance between the hot and cold sides outside of operating parameters.

The present invention is directed at overcoming one or more of the above-mentioned problems.

SUMMARY

An apparatus operable to propel a gas is described. In some embodiments, the apparatus comprises a plurality of layers arranged in a stack and a means of heating and/or cooling adjacent layers to form alternating hot and cold layers, and at least one through hole in the stack. In some embodiments, each hot layer is hotter than the immediately adjacent cold layers and each cold layer is colder than the immediately adjacent hot layers. A surface of each hot layer is exposed in an interior of the through hole, and a surface of each cold layer is exposed in the interior of the through hole.

In other embodiments, the apparatus comprises at least a first and second layer and a means of heating and/or cooling adjacent layers to form alternating hot and cold layers, and at least one hole through the hot and cold layers. Preferably, each hot layer has a chamfer facing inward and in a first direction. An angle between the chamfer of each hot layer and a center axis of the through hole is designated $\theta_2$. Also preferably, each cold layer has a chamfer facing inward and in a second direction opposed to the first direction. An angle between the chamfer of each cold layer and the center axis of the through hole is designated $\theta_1$. In some embodiments, the sum of $\theta_1$ and $\theta_2$ falls in the range from about 85° to 95°.

In one embodiment, a thermal transpiration device is provided in accordance with the present invention, the thermal transpiration device including a first membrane having a first thickness, a second membrane having a second thickness, and a thermal insulator provided between the first and second membranes, the thermal insulator having a third thickness. A total thickness of the thermal transpiration device is defined by the first, second and third thicknesses. The first membrane, second membrane and thermal insulator include apertures formed therein. At least one of the first and second membranes include angled walls forming the apertures, such that an active region where thermal transpiration occurs is defined at junction of the first membrane, second membrane and thermal insulator, wherein the active region has a thickness less than the total thickness.

A method of manufacturing the inventive thermal transpiration device is also disclosed. The method generally including the steps of providing a substrate, depositing a first metal layer on the substrate, depositing a dielectric layer on the first metal layer, etching holes in the dielectric layer until portions of the first metal layer are exposed, removing the exposed portions of the first metal layer, etching into the substrate to form undercut areas below the first metal layer, depositing a silicon dioxide layer over the remaining layers, depositing a second metal layer on the silicon dioxide layer, and removing the substrate.

BRIEF DESCRIPTION OF THE DRAWINGS

The present methods, devices and systems will now be described by way of exemplary embodiments to which the invention defined by the claims appended hereto are not limited. The details of one or more embodiments of the disclosure are set forth in the accompanying drawings and the description below. Other features, objects, and advantages will be apparent from the description and the drawings, and from the claims.

FIG. 20 shows an exemplary method of manufacturing NMSET.

FIG. 21 shows another exemplary method of manufacturing NMSET.

FIG. 42b a top view of a middle insulating layer placed on top of FIG. 42a.

DETAILED DESCRIPTION

Overview

Figure 1:
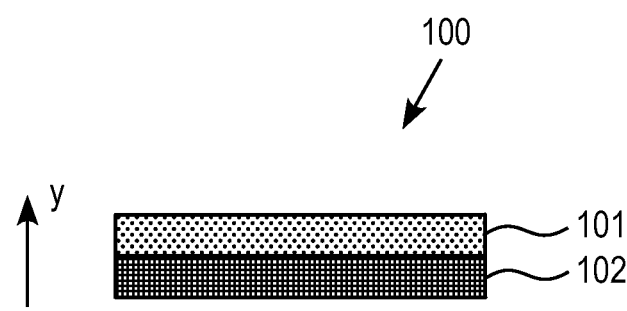
FIG. 1 shows a heat pump. This can be a Peltier slab, a slab driven by thermionic emission, or any other suitable means.

In preferred embodiments, one example of distributed thrusters, is an apparatus described herein that may be referred to as a Nano Molecular Solid-state Electrodynamic Thruster ("NMSET"). The basis of operation of NMSET makes it possible to apply NMSET in the fields of, for example, propulsion, adhesion, compression and refrigeration, depending on the manner in which an NMSET is employed. In preferred embodiments, NMSET and related distributed thrusters devices provide lightweight, compact, energy-efficient creation of a gas pressure differential with adjustable flow velocity.

Propulsion

In some embodiments, distributed thrusters such as NMSET can offer one or more of the following improvements in the field of gas propulsion:

1. Improved Resiliency: Damage to any area in a conventional gas propulsion system would probably lead to system-wide failure. Distributed thrusters provide enhanced redundancy and robustness.

2. Lightweight: Electrically driven distributed thrusters, may make use of photovoltaic thin films, in which case fuel load vanishes. Furthermore since each thruster in a distributed thrusters system creates a local gas pressure difference, this local effect may require fewer and or lighter apparatuses to maintain the structural integrity of such gas propulsion system, than what would be normally required in a non-distributed gas propulsion system that generates the same gas flow volume.

3. Scalability: Conventional gas propulsion systems cannot be easily scaled: optimal turbojets for small aircrafts are not scale reductions of optimal turbojets for large aircrafts. Distributed thrusters are easier to scale as scaling primarily changes the quantity of thrusters while leaving the individual thruster dimensions mostly intact.

4. Response Time: Less massive thrust producing devices spool up and down faster; as such, thrust from a distributed thruster gas propulsion system can be more easily adjusted in response to changes of need.

5. Power Independence: Most conventional propulsion systems require a specific type or class of fuels in order to operate, whereas some embodiments of distributed thrusters, such as, for example, NMSET, only requires a source of temperature differential, which can generated by electricity.

6. Green Propulsion: Some embodiments of distributed thrusters, such as several embodiments of NMSET, expect an electrical input and as such, do not require fossil fuels to operate; therefore they do not produce polluting exhaust (e.g. carbon monoxide, nitrogen oxide) during ordinary operation when they use a non-polluting method of generating the required electrical currents.

Adhesion

In some embodiments, distributed thrusters, such as, for example, NMSET, may be used as a lightweight mechanical adhesive that adheres to a surface through suction. The process can be reversible, as the only step required to reverse the adhesion is to cut power to the system in some embodiments. Using such a system can provide further benefit over electrostatic adhesion in that such a system does not require a material to be adhered to be flat or conductive, and does not leave behind residue. Compared to other mechanical adhesion processes, using such a system may not require a surface being adhered to be pretreated.

Gas Compression

Because distributed thrusters, such as, for example, NMSET, can be arranged to drive gas flow through a surface, all or part of a pressurized vessel may function to provide gas compression. Thus, in some arrangements, separated pumping and pressurized containment may not be required. Moreover, because, the action of such a system generally occurs over a short distance, it is possible, in some embodiments, to use such a system as a highly compact compressor by stacking multiple stages of distributed thrusters. Conventional gas propulsion systems generally operate over length scales of centimeters and sometimes meters. Thus, stacking conventional propulsion systems tends to be a complex and expensive proposition. By contrast, distributed thrusters can be packaged to operate over smaller scales, down to, for example, micrometers. Furthermore, the versatility of such systems means that such a system can be readily adapted to function as a high-pressure pump, a standard atmospheric pump, or with a sufficient number of stages, as a high vacuum pump.

NMSET Design

In one aspect and embodiment, NMSET and some related devices described here may be thought of as functioning by reducing entropy in gas in contact with the system. Optionally, such device may add energy, in addition to the energy lost through inefficiencies in the system, e.g. thermal energy, to the gas. In another aspect and embodiment, the geometry of NMSET and some related devices can affect gas flow direction and convenience of use. Several embodiments of NMSET and some related devices may be further distinguished from previous thermal transpiration devices and the like by the combined application of scale parameters, materials having advantageous molecular reflection properties, geometries, design, construction and arrangement of elements that provide significant increase in efficiency, and or capabilities to operate at higher ambient pressures and/or produce higher flow rates. Described herein are various exemplary embodiments of NMSET with discussion of these and other parameters that, in preferred embodiments, can create a strong gas flow in a particular direction with minimal thermodynamic loss, and or operate at higher ambient pressures and or produce higher flow rates.

Reduction of entropy in a gas by NMSET may be represented by a transformation A in the momentum space k of the gas. A can be expressed in a matrix once a set of suitable bases is chosen for the momentum space k. If the expectation value of the transformed momentum space Ak is nonzero, the NMSET receives a net momentum in the opposite direction of the expectation value due to the conservation of momentum.

The geometry of NMSET may be optimized for more efficient functioning. The geometry of NMSET affects the transformation matrix A. A geometry that produces a matrix A essentially equal to an identity matrix I does not create a net momentum bias (i.e. will not make the transformed momentum space Ak have a nonzero expectation value). Rather, gas vortexes may be generated. Geometries that result in larger eigenvalues of A tend to imply a more efficient function, e.g., that more momentum is carried by gas particles moving in a particular direction.

As an example, consider a heat pump 100 immersed in a gas, shown in FIG. 1. The heat pump 100 comprises an upper layer 101 and a lower layer 102. For simplicity, a Cartesian coordinate system can be referenced with a y-axis pointing from the lower layer 102 to the upper layer 101. A temperature differential can be established by a Peltier device (not shown) between the layers or any suitable means such that the upper layer 101 is colder than the gas and the lower layer 102 is hotter than the gas. For sake of simplicity, one may assume that the heat pump 100 has 100% Carnot cycle efficiency. However, other efficiencies are contemplated. In this case, the heat pump 100 will not transfer net heat into the gas. Transformation caused by the heat pump 100 to the momentum space k of the gas can be expressed by a Hermetian matrix A. When a gas particle (molecule or atom) collides with the lower layer 102, assuming the collision is diabatic, the gas particle rebounds off at a higher velocity than before the collision. When a gas particle collides with the upper layer 101, assuming the collision is diabatic, the gas particle rebounds off the upper layer 101 at a reduced velocity than before the collision. The heat pump 100 feels a net force in the y direction. In other words, the lower layer 102 heats and thus increases pressure of the gas below the lower layer 102, while the upper layer 101 cools and thus decreases the pressure of the gas above the upper layer 101. The pressure difference exerts a force on the heat pump 100 in the y direction. In terms of transformation of the momentum space k of the gas, as gas particles rebounding from the upper layer 101 leave with less momentum than gas particles rebounding from the lower layer 102, the transformed momentum space Ak becomes skewed preferentially in the −y direction, i.e., the expectation value p of the transformed momentum space Ak is nonzero and points to the −y direction. Assuming the gas and the heat pump 100 compose a closed system (i.e., no interaction with other objects), the heat pump 100 gains a momentum −p to conserve the total momentum of the closed system.

While the geometry of the heat pump 100 in FIG. 1 does generate a direction force, in certain circumstances it may not be practical for the following reasons:

1. If the heat pump 100 is large, translational motion of the heat pump 100 along the y direction forces the gas to flow all the way around edges of the heat pump.

2. The vast majority of the heat is transferred from surfaces of the heat pump 100 via gas convection.

Figure 2:
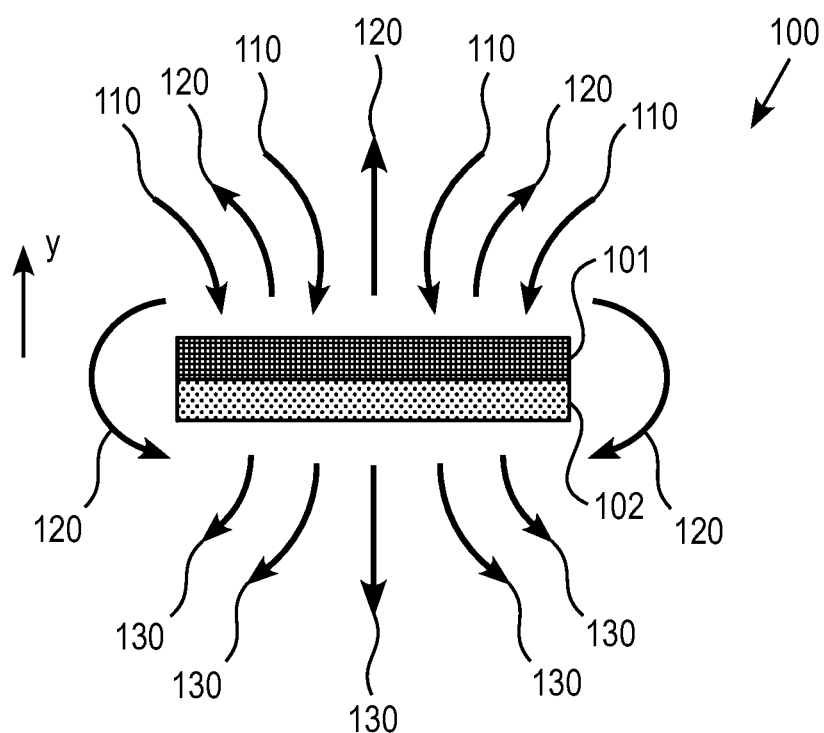
FIG. 2 shows gas flow patterns around the heat pump of FIG. 1.

3. Gas near the surfaces has an insulating effect. Momentum transfer between the heat pump 100 and the gas is not efficient except in proximity of the edges of the slab, as shown in FIG. 2.

4. Surface area of the heat pump 100 is surface area of its convex hull.

These problems all relate to a single core issue, very little of the gas has any direct surface contact. Thus, a more complex geometry can be advantageous. Exemplary embodiments with three different geometries are described herein.

Principles of Operation

Although many different geometries of NMSET or related devices are possible, the principle of operation of NMSET remains the same. While not wanting to be limited to any particular theory, operation uses energy to reduce entropy on some device surfaces and transfer reduced entropy to a gas in contact with the surface. The device can optionally donate energy to the gas by raising the gas temperature. The function of NMSET may be therefore divided into three areas: the means by which entropy on surfaces of the device is reduced, the means by which the reduced entropy is transferred to the gas, and the optional means other than the inefficiency of the Carnot cycle of the heat pump by which the gas temperature is increased.

Temperature Differential

A temperature differential between layers of material or more precisely, between two opposing surfaces is generally required for NMSET or related device to operate. In preferred embodiments described herein, a temperature differential can be established in a solid-state electrodynamic mechanism, i.e., the "SE" of NMSET. However, the devices and methods described here are not limited to electronic or purely solid state devices. For example, a temperature differential may be established by conduction of heat from combustion using a fluid coolant, exothermic chemical reaction, or other chemical source. A temperature differential may be established by simple resistive heating, by the Peltier effect, by thermionic emission, by the thermo-tunneling enhanced Peltier effect, or by any other suitable means, such as explained below. A means by which the temperature differential is established between two objects can be phenomenologically described by two characteristics: entropy-reduction (heat transfer between the two objects), and diabaticity (total heat transfer between environment and the two objects).

In one embodiment, the Peltier effect can be used to establish a temperature differential. The Peltier effect occurs when an electric current is applied through a loop composed of two materials with different Peltier coefficients joined at two junctions. Depending on the direction of the electric current, heat flows from one junction to the other, causing a temperature differential to be established between the junctions. The Peltier effect can be understood as follows: Heat capacity of charge carriers in a material is characterized by the Peltier coefficient $\Pi$, which is the amount of heat carried per unit charge carriers in the material. When an electric current/flows through a junction of material A with Peltier coefficients $\Pi_A$ and material B with Peltier coefficient $\Pi_B$, the amount heat carried by charge carriers to the junction in a unit time is $I \times (\Pi_A - \Pi_B)$.

An ideal Peltier effect reduces entropy locally and is adiabatic. Assuming Joule heating and or Carnot cycle inefficiencies can be ignored, in the Peltier effect, heat is transferred from one junction to another, but no heat is added into the loop of the two materials. This entropy reduction can provide for advantages in the stackability of NMSET and related devices. Consequently, the Peltier effect lends itself particularly well to some embodiments.

In this embodiment, a power source drives an electric current between two surfaces. Charge carriers such as electrons and/or holes carry heat as they flow in the electric current, and thus create a temperature differential between the two surfaces. Entropy is reduced as the temperature differential is established.

Phonon flow reduces the temperature differential established by the Peltier effect. If phonons are permitted to flow freely (i.e., infinite thermal conductivity or zero heat capacity), their flow will cancel the temperature differential established by the Peltier effect. Efficiency of the Peltier effect can be increased by reducing electrical resistance and thermal conductance.

Figure 6:
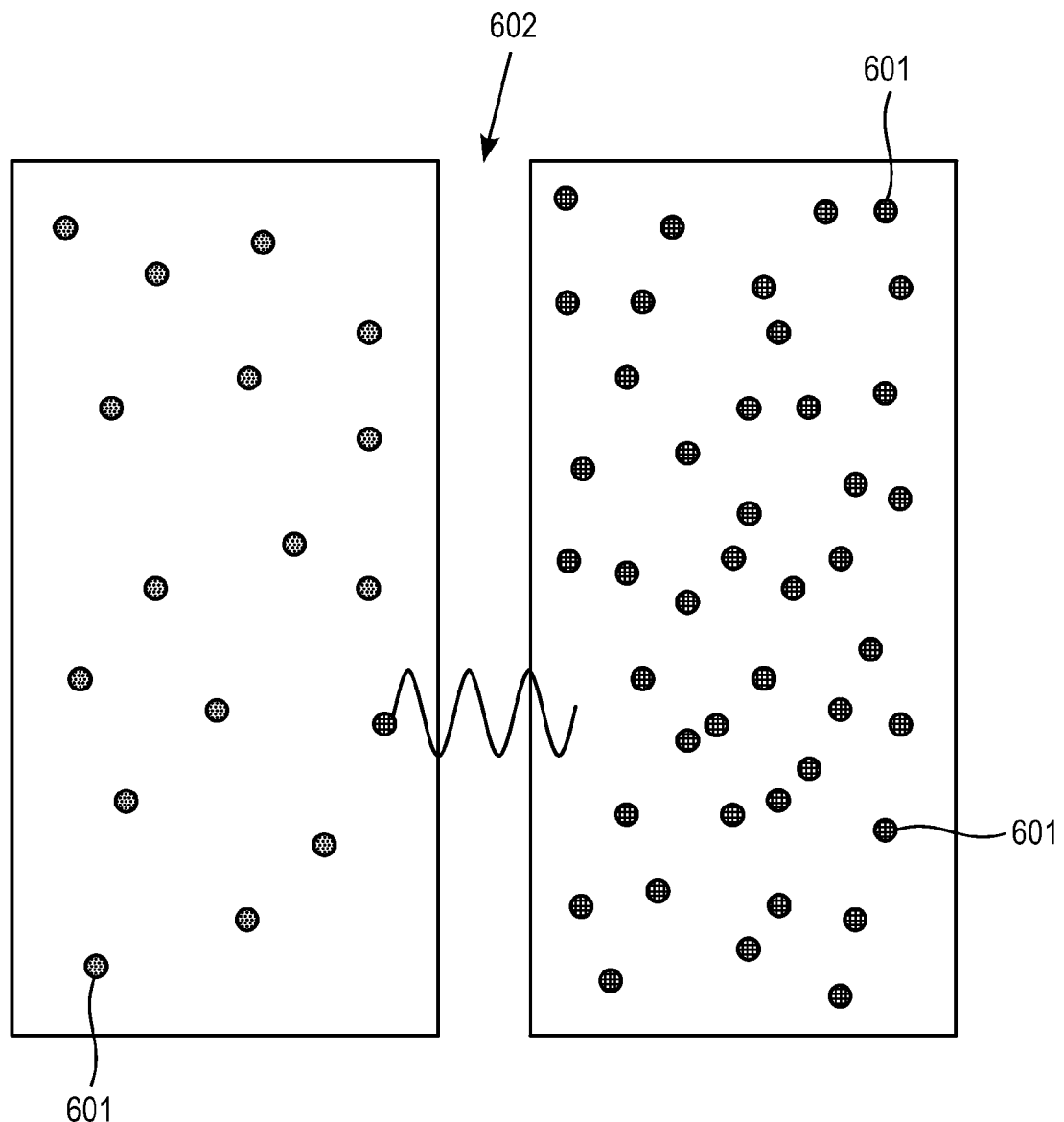
FIG. 6 shows the thermo-tunneling enhanced Peltier effect.

One way to reduce thermal conductance is to place a narrow vacuum gap in the path of the electric current. Phonons cannot easily pass the vacuum gap but charge carriers can do so under a voltage across the vacuum gap. This is called thermo-tunneling enhanced Peltier effect (or thermotunnel cooling). FIG. 6 shows a diagram of the thermo-tunneling enhanced Peltier effect. Charge carriers 601 can tunnel through a vacuum gap 602.

The thermo-tunneling enhanced Peltier effect is generally only significant at high temperatures or voltages, unless enhanced by choice of surface geometry and materials that can restrict behavior of charge carriers near the vacuum gap and increase tunneling probability. For example, suitable surface coatings and structures can function as a filter that do not allow low energy states of charge carriers but only high energy states of charge carriers near the vacuum gap.

In another embodiment, a temperature differential can be created and maintained by field-enhanced thermionic emission. Thermionic emission is a heat-induced flow of charge carriers over a potential-energy barrier. The charge carriers can be electrons or ions (i.e., thermions). In a simple approximation, the potential-energy barrier acts like a dam, in that it withholds carriers with thermal energy less than its height and allows carriers with thermal energy greater than its height to flow over. When the overflowing carriers pass the potential-energy barrier, heat is carried away with them. The carriers left behind the potential-energy barrier rethermalize (redistribute in energy) to a lower temperature. Thermionic emission typically requires an operating temperature of several hundred degrees Celsius so that a non-negligible fraction of the carriers has thermal energies great enough to overcome the potential-energy barrier. An electrical field can assist thermionic emission by reducing the height of the potential-energy barrier and reducing the required operating temperature.

A temperature differential in NMSET or related device can also be established by using resistive heating (explained below) and/or by suitable chemical processes. In order to maintain the temperature differential without raising the overall temperature of the device, some cooling means can also be provided, such as a heat sink exposed to atmosphere. No matter what cooling means is used, the temperature differential is more pronounced if warmer surfaces of the device are not cooled as efficiently as cooler surfaces, which can be achieved, for example, by thermal insulation.

Force Generation

In one aspect, the production of net thrust may be thought of as the transfer of the reduced entropy from an established temperature differential to a gas. Without wishing to be bound by theory, consider a single device operating in a gas, as an adiabatic process. In this example, a temperature differential between a hot and a cold layer can be established by a suitable means such as the Peltier effect. For simplicity, assume no net heat transfer between the gas and the device. Particles of the gas will impact the hot and cold layers with equal probabilities, and their interaction with these layers will have consequences on local momentum space of the gas near surfaces of the hot and cold layers. The local momentum space of the gas very close to a surface of the hot and cold layers has nonzero expectation value when the gas and the surface have different temperatures. Assuming also that no gas particles penetrate the surface, the gas particles rebound from the surface with momenta different from their incident momenta, which skews the momentum space along the surface normal, and the magnitude of the skew is directly related to the temperature difference between the surface and the gas.

In an arrangement with random geometry (i.e. surface normals at different surface locations point to random directions), the weighted sum of expectation values of local momentum spaces of the gas is nearly zero, which results in almost no net thrust. In NMSET with an optimized geometry, however, the weighted sum of expectation values of local momentum spaces of the gas can be non-zero, which leads to a net thrust.

A trivial example of an arrangement that has non-zero net thrust is shown in FIG. 1, as described above. This geometry is not very efficient because macroscopic convective gas flows and vortex formation increase the entropy and limit the amount of useful work. Exemplary convective gas flows 120, 130 are shown in FIG. 2. Gas at ambient temperature 110 flows towards the cold layer 101 and gets cooled. Cooled gas flows 120 away from the cold layer 101 and around the edge of the heat pump 100 towards the hot layer 102. Heated gas flows 130 away from the hot layer 102.

To simplify the description, it may be helpful to think about the system in terms of Newton's second law and the kinetic theory of gases. Around the heat pump 100 in FIGS. 1 and 2, assuming that temperature of the gas is bracketed by the temperatures of the layers 101 and 102, gas particles that collide with the layer 102 leave the layer 102 with greater momentum than before the collision. Similarly, gas particles that collide with the layer 101 leave the layer 101 with lesser momentum than before the collision. Since gas pressure is directly related to momenta of gas particles, gas near the layer 102 has higher pressure than gas near the layer 101. This pressure bias pushes the entire heat pump 100 in the y direction.

In another embodiment, the heat pump 100 can have at least one through hole between the layer 101 and 102. Gas spontaneously flows from the layer 101 to the layer 102 through the hole which enables higher heating rate of the gas. Such preferential flow of gas is referred to as thermal transpiration. Assuming gas near the layer 101 has temperature of $T_c$ and pressure of $P_c$, and gas near the layer 102 has temperature of $T_h$ and pressure of $P_h$, thermal transpiration causes the gas to flow from the layer 101 to the layer 102 through the hole, if the following equation is satisfied:

$$\sqrt{\frac{T_h}{T_c}} \geq \frac{P_h}{P_c} \qquad [1]$$

In order to improve efficiency, it is helpful to understand where the classical limit exists within gas flows. Convective descriptions of gas flow break down at around length scales where the Knudsen number appears. As a result, in some aspects, the mean free path of a gas becomes a useful parameter in determining advantageous geometries of NMSET.

Figure 3:
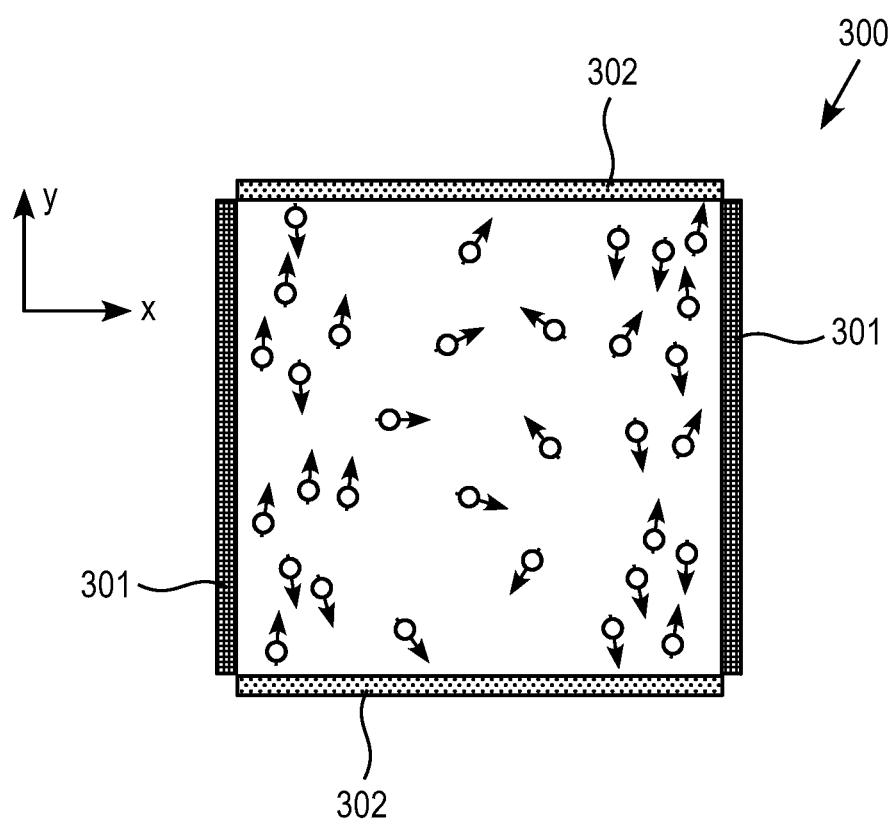
FIG. 3 shows a gas confined in a square box with parallel hot walls and parallel cold walls.

For instance, consider a gas at a particular pressure having a mean free path of 10 nm. If a cloud of such gas is trapped in a two dimensional square 20 nm by 20 nm box as shown in FIG. 3, a gas particle, within 10 nm of travel, will be approximately as likely to have struck another gas particle as it is to have struck the walls of the box. If the walls of the box are heated, then smaller boxes will reach thermodynamic equilibrium with gas therein faster than larger boxes, because gas particles in smaller boxes have more chances to collide with and exchange heat with the walls. Generally, when most of collisions in a gas are between gas particles and a surface, then thermodynamic equilibrium can be achieved approximately in the mean free time (the time it takes a gas particle to travel the mean free path).

Figure 15:
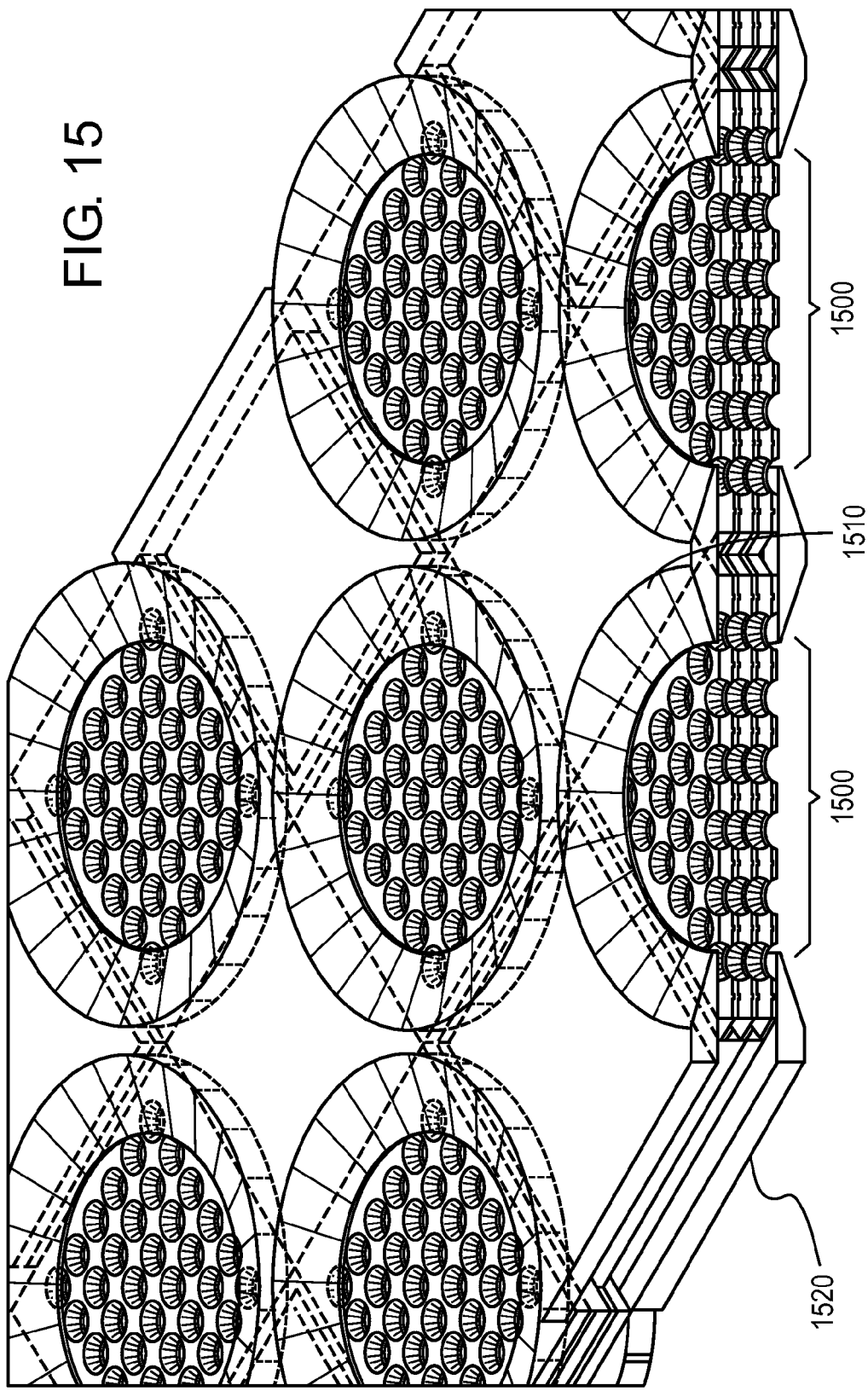
FIG. 15 shows a perspective view of an NMSET with an external solid state heat pump arrangement.
Figure 16:
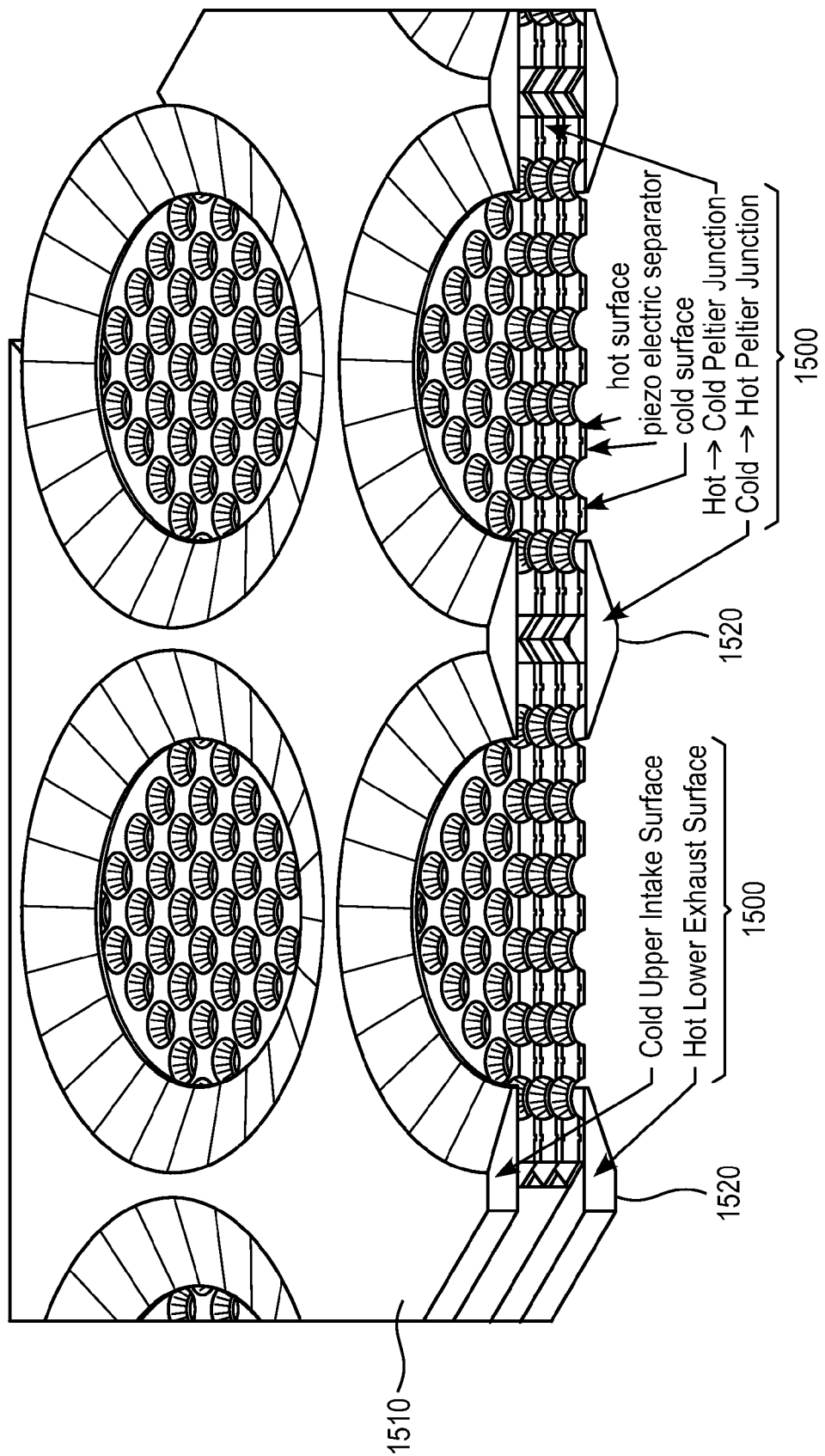
FIG. 16 shows a cross sectional view of NMSET with an external solid state heat pump arrangement of FIG. 15.
Figure 17:
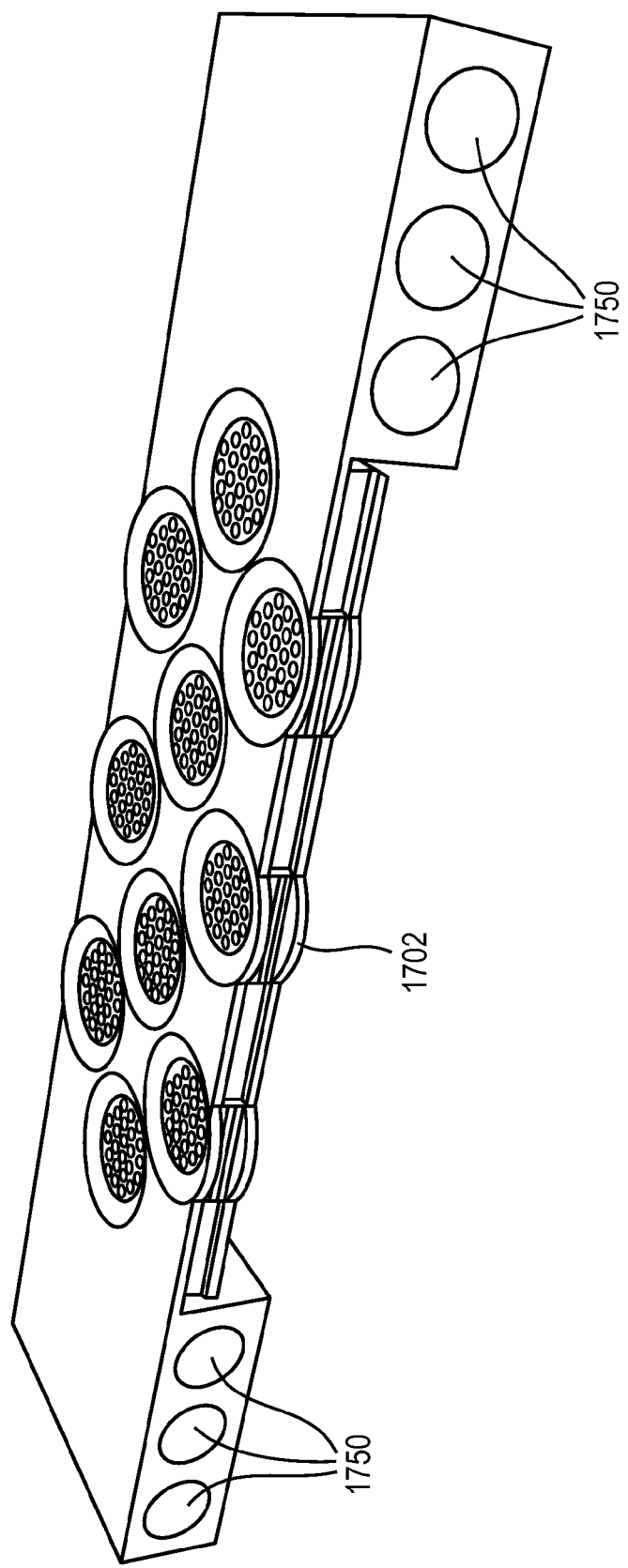
FIG. 17 shows a perspective view of NMSET with an external non-solid state heat pump arrangement.
Figure 18:
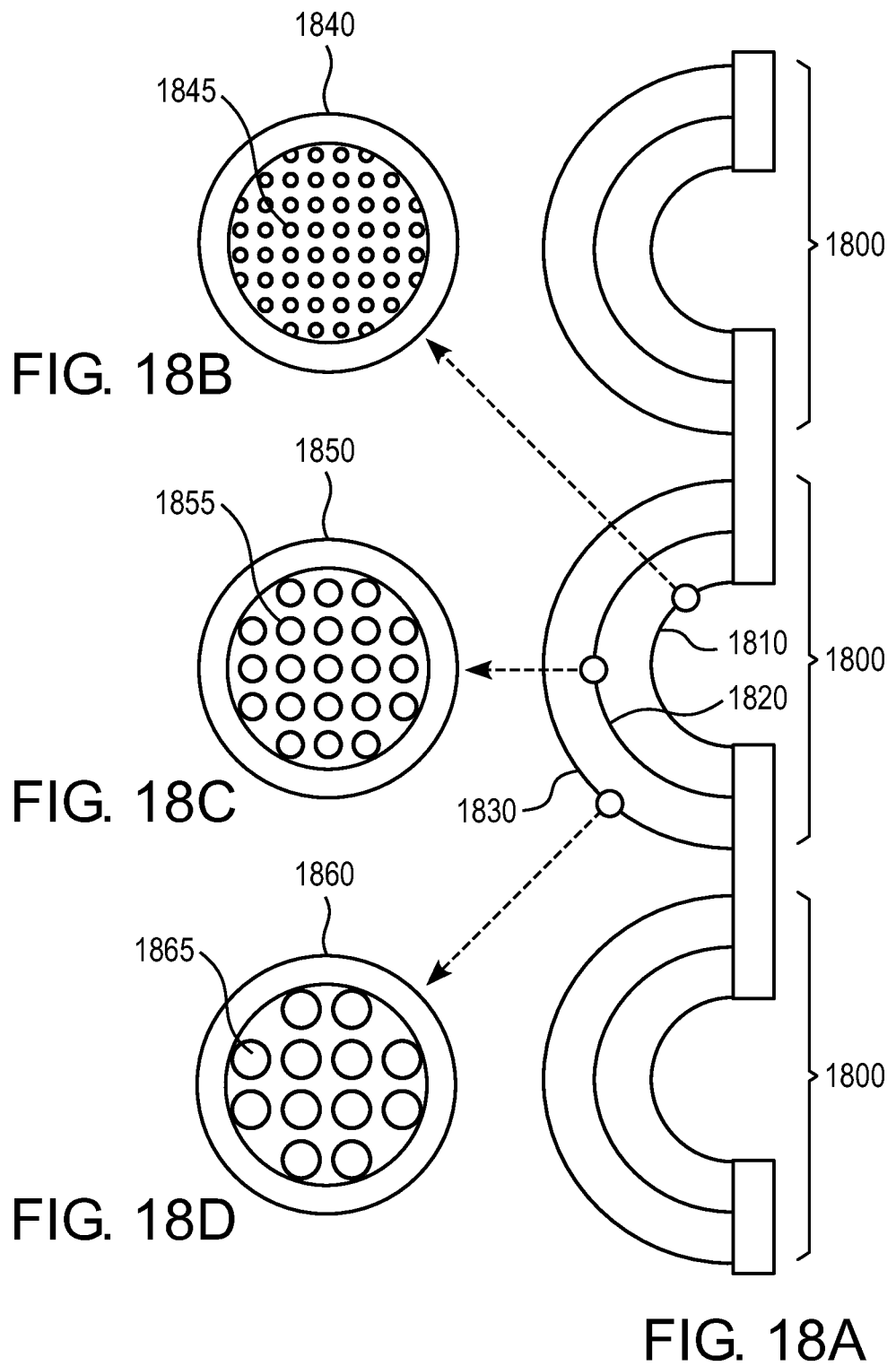
FIG. 18 shows a cross sectional view of a staged NMSET arrangement.

For this reason, in some embodiments, the characteristic scale of individual features of NMSET and related devices may be nanoscale, i.e., the "NM" of NMSET. However, it must be understood that the methods and devices described here are not limited to nanoscale embodiments. The mean free path parameter is dependent on gas density so that in some embodiments and uses, larger scale features may be employed. Furthermore, as described herein, pluralities of NMSET and related device elements can be combined to provide action over a large surface. For example, distributed thrusters such as NMSET may advantageously be arranged in arrays and or arrays of arrays to provide directed movement of gas over across large surfaces, for example, as illustrated in FIGS. 15, 16 and 17. Distributed thrusters such as NMSET can also be arranged in one or more stages to achieve a greater pressure differential, for example as illustrated in FIGS. 18A-18D. FIG. 18A illustrates a cross sectional view of an array of staged distributed thrusters such as NMSET arrangements 1800. Each staged arrangement 1800 is composed of stages 1810, 1820, 1830 of in the form of concentric half-spheres containing arrays of distributed thrusters such as NMSET 1840, 1850, 1860 illustrated in blow-up in FIGS. 18B-18D. Individual distributed thruster apertures 1845, 1855, 1865 in each stage increase in optimal size and thickness in accordance with the decreasing ambient pressure that would be experienced at each previous stage in operation.

Surface Interaction

Interaction between surfaces can affect the momentum space transformation matrix A. If nearby surfaces can easily exchange phonons via gas particles, then the entropy at these surfaces will locally increase at a higher rate than surfaces which cannot easily exchange phonons via development of vortexes. This will generally reduce the efficiency of a system.

One method by which phonon exchange may be reduced is to limit or eliminate any shared bases between surfaces. For instance, consider gas particles in the box 300 in FIG. 3. Box 300 comprises two planar hot walls 302 parallel to each other, and two planar cold walls 301 parallel to each other and perpendicular to the hot walls 302. If the box 300 is comparable in size to the mean free path of the gas particles therein and the walls 301 and 302 are perfectly specular, the gas particles can reach thermal equilibrium with the cold walls 301 and the hot walls 302 independently. This is because surface normals of the walls are only shared between the two cold walls 301 or between the two hot walls 302, but not between a cold wall 301 and a hot wall 302. Consequently, little to no momentum can be exchanged between the hot walls 302 and the cold walls 301 by the gas particles. This is because interaction between the gas particles and the cold walls 301 only affect momenta in the x direction but not momenta in the y direction; and interaction between the gas particles and the hot walls 302 only affect momenta in the y direction but not momenta in the x direction and the fact that momenta in the x direction are orthogonal with momenta in the y direction, assuming no collisions between gas particles. After thermal equilibrium is reached between the gas particles and the walls, the gas particles move faster in the y direction than in the x direction.

As a practical matter, surfaces are usually not perfectly specular. However, specular surface properties exist very strongly in some materials so that there are angles for which convective flows in corners may be reduced. This effect is generally observed when the Knudsen numbers are large, which is a preferred condition for NMSET and related devices, particularly in nanoscale embodiments. The Knudsen number (Kn), named after Danish physicist Martin Knudsen (1871-1949), is a dimensionless number defined as the ratio of the molecular mean free path to a representative physical length scale. In NMSET or the related devices discussed here, the representative physical length scale is taken to be the order of magnitude of the aperture diameter of the device, i.e., the representative physical scale length is, for example, a nanometer if the aperture is measured in nanometers, and a micrometer if the aperture is measured in micrometers. In preferred methods of using the devices disclosed herein the Knudsen number is preferably greater than 0.1, or greater than 1, or greater than 10.

Methods of Optimizing NMSET and Related Devices

Modeling

Performance of NMSET with a specific geometry can be simulated by a Monte-Carlo method for optimization. Specifically, a simulation for NMSET or related device with any given geometry starts with a group of gas particles with random initial positions and momenta around the device. Positions and momenta of these particles after a small time interval are calculated from the initial positions and momenta, using known physical laws, parameters such as temperature, pressure, chemical identity, geometry of the device, interaction between surfaces of the device and the gas particles. The simulation is run through a chosen number of iterations and simulation results are analyzed. The geometry of the device can be optimized using simulation results. In preferred embodiments, a device is constructed using the results of the simulation analysis.

In a preferred embodiment, a simulation can be represented in the following table:

---
Algorithm 1 EVOLVE MODEL(M, P, k)
---
M←0
P←a set of search parameters
k←number of iterations
for i = 1 to k do
   V←An instance of P
   V←V perturbed by M
   E←MONTE CARLO(V)
   Update M using E
end for
---

A perturbation model M is evolved through a number (k) of iterations. First, M is initialized to an empty set, indicating no solution knowledge. Then, a loop is started in which the search parameters generate an arbitrary element from the definite search space P and the prior learned knowledge M is used to perturb P. The specific algorithm used to perturb as an implementation detail.

If run in a grid computing environment, M should ideally be identical among all nodes, but this is not necessary due to the inherently stochastic nature of the process. The step of EVOLVE_MODEL which actually runs the Monte-Carlo simulation is the most computationally expensive of all by far and offers a lot of time to synchronize M.

Specific parameters depend on the environment. The parameters that the user can specify include the following:
1. Molecular diagrams, in some embodiments containing up to three atoms, such as $CO_2$ or $H_2O$.
2. Partial concentrations for constituent molecules.
3. Initial temperature and pressure of the entire gas.

In a stationary simulation, the Monte-Carlo simulation can be run with periodic bounds in all axes. In the y axis, however, particles encountering the periodic bound are stochastically thermostatted according to temperature and pressure settings in order to simulate ambient conditions. In the x axis, particle velocities are unmodified in order to simulate a periodic ensemble of identical device assemblies along that direction. The simulation may be run in two dimensions to reduce the computational complexity of the simulation. A three dimensional simulation should give similar results where the modeled device has cylindrical symmetry. Note that in general, a simulator does not have to use the periodicity as indicated here and may not specify any boundaries at all; they are only defined as a computational convenience.

In preferred embodiments, potential device geometries can be evaluated in consideration of the conditions under which a device will be used and known surface reflection properties of the material from which it will be constructed. Geometrical parameters can be optimized by analyzing results from simulation before the geometry is actually used in manufacture of NMSET and related devices.

Example Geometries

Four embodiments with different geometries are particularly discussed below. These four geometries will be referred to as Straight, Parabolic, Triangular, and Sawtooth. It must be noted that the geometries of the NMSET and related devices described here can vary considerably and these examples should be taken only as illustrations for the purpose of discussing the effects of certain design choices on system efficiencies.

Straight

Figure 19:
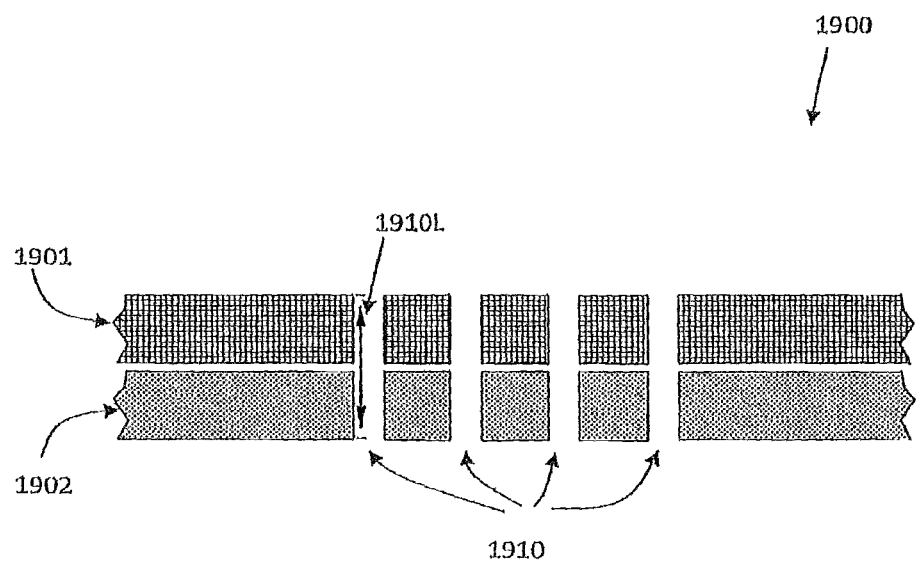
FIG. 19 shows NMSET with a straight geometry.

FIG. 19 shows an embodiment of NMSET or related device 1900 with a straight geometry. In this embodiment, the device 1900 comprises a hot layer 1902 and a cold layer 1901. The terms "hot layer" and "cold layer" mean that these layers have a temperature difference therebetween, not that the "hot layer" is necessarily hotter or the "cold layer" is necessarily colder, than a gas that NMSET or related device is immersed in. At least one straight through hole 1910 extends through all layers of the device 1900 and preferably has a similar cross-sectional shape and size for each set of layers. The straight through hole 1910 can have any cross-sectional shape such as circular, slit, and comb.

Preferably, a total length 1910L (i.e. a distance from one entrance to the other entrance) of the straight through hole 1910 is up to 10 times, up to 5 times or up to 2 times of the mean free path of a gas in which the device 1900 is immersed. The mean free path of air at the standard atmosphere pressure is about 55 nm. At higher altitude, the mean free path of air increases. For atmospheric applications, the total length 1910L is preferably not greater than 1500 nm, and depending on application more preferably not greater than 550 nm, not greater than 275 nm or not greater than 110 nm. A temperature differential between the hot layer 1902 and the cold layer 1901 is preferably at least 0.5° C., more preferably at least 30° C., more preferably at least 50° C., and most preferably at least 100° C.

The hot layer 1902 and the cold layer 1901 may be separated by a gap therebetween for thermal isolation. The gap preferably is a vacuum gap and/or contains a thermal insulator. In one example, the gap contains a plurality of thin pillars made of a good thermal insulator such as silicon dioxide.

The device 1900 has preferably at least 10 straight through holes per square centimeter. A total perimeter length of all the straight through holes of the device 1900 per square centimeter is preferably at least two centimeters.

Parabolic

Figure 7:
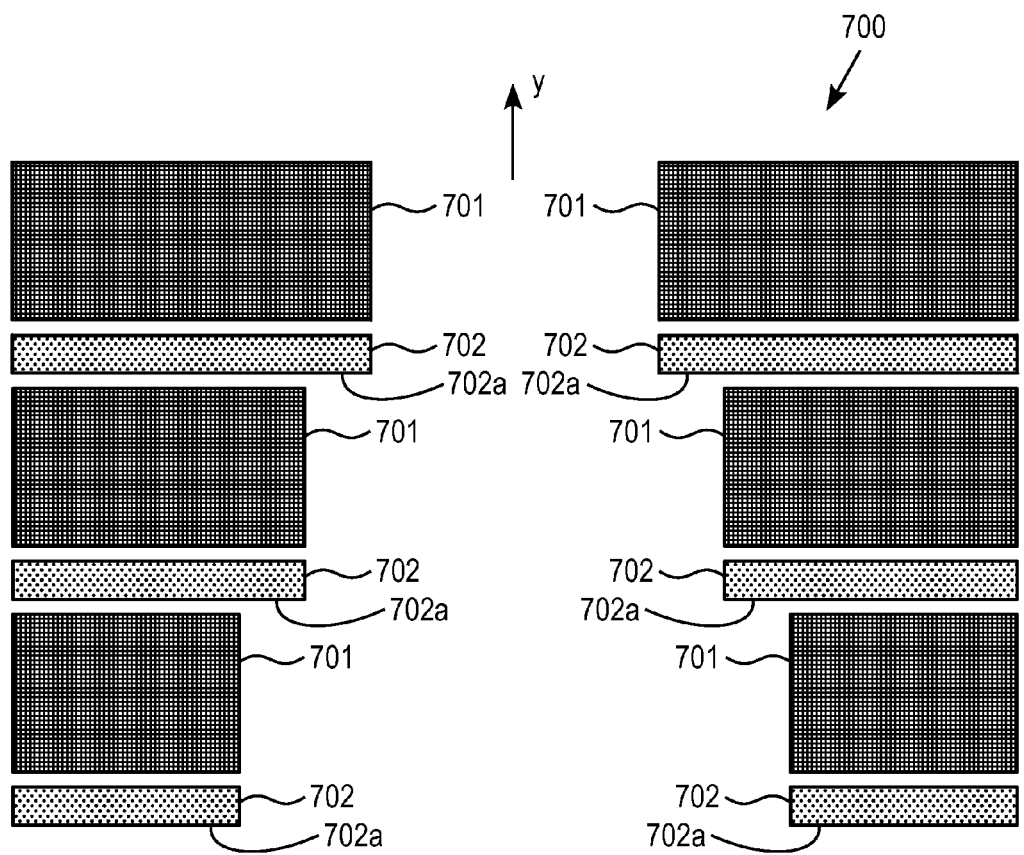
FIG. 7 shows a stack of NMSET with a parabolic geometry.
Figure 8:
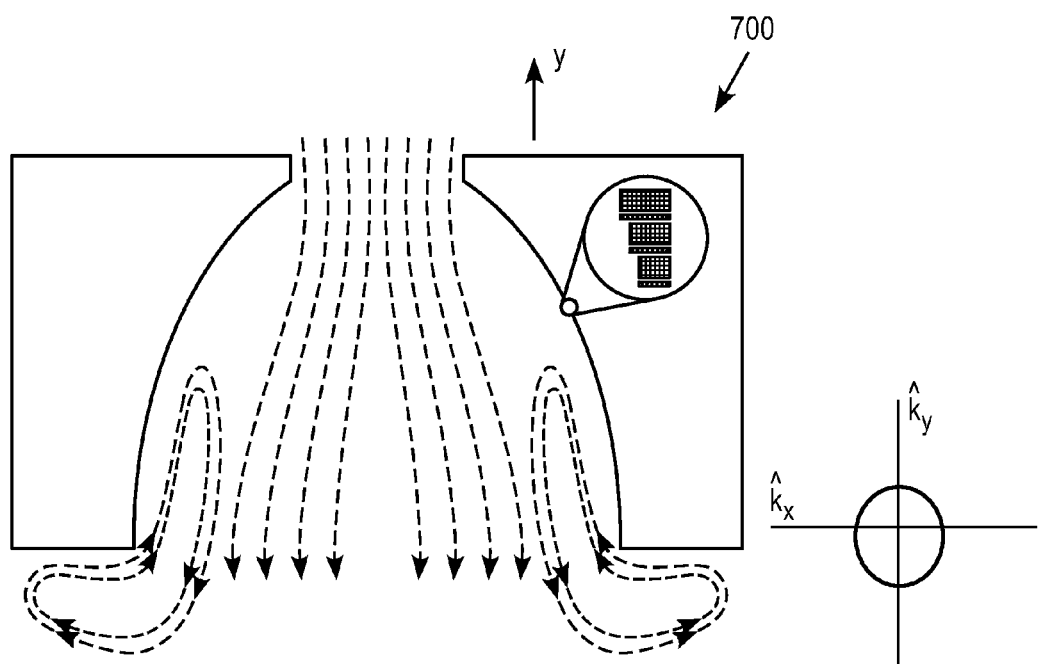
FIG. 8 shows gas flow patterns around the stack of NMSET of FIG. 7 and the momentum space of the gas.

FIG. 7 shows an embodiment of an NMSET or related device 700 with a parabolic geometry. In this embodiment, alternating hot layers 702 and cold layers 701 are stacked. In the illustration, each hot layer 702 and cold layer 701 has a straight through hole. All the holes are aligned. The hole in each hot layer 702 has the similar size as the hole in the cold layer 701 immediately above, and is smaller than the hole in the cold layer 701 immediately below. Each cold layer 701 is colder than its immediate adjacent hot layers 702 and each hot layer 702 is hotter than its immediate adjacent cold layers 701. A surface 702a of each hot layer 702, which has a surface normal in the −y direction, is exposed. All the holes collectively form a nozzle with a contour of a parabolic surface. This geometry minimizes shared bases between the hot and cold layers. However, because NMSET or related device may not substantially increase the energy of the gas, the increasing hole diameter may result in a drop in gas pressure at the edges. This can create strong vortexes near the lower aperture, which reduce total efficiency. NMSET with the parabolic geometry can be adiabatic or isobaric, but not both. An approximation of gas flow in NMSET or related device with the parabolic geometry is shown in FIG. 8. The momentum space of the gas is skewed such that the expectation value of the momentum points to the −y direction.

Although the parabolic geometry is effective in NMSET or related device, a drop in gas pressure puts an upper bound on the size of the lower aperture. In general, any adiabatic device in which the gas being moved undergoes a change in volume will suffer in its efficiency.

If the temperature differential in a device with the parabolic geometry is established by a diabatic means (i.e. the device raises the overall temperature of the gas), then the NMSET with the parabolic geometry may not suffer in its efficiency from the gas undergoing a change in volume, as long as the amount of heat added to the gas is sufficient to prevent the formation of vortexes. However, such a device suffers in its efficiency from higher total entropy, i.e., the eigenvectors of the momentum space of the gas are not as far apart if the gas has to expand, but supplying heat at small scales is typically easier than carrying it away.

Triangular

Figure 9:
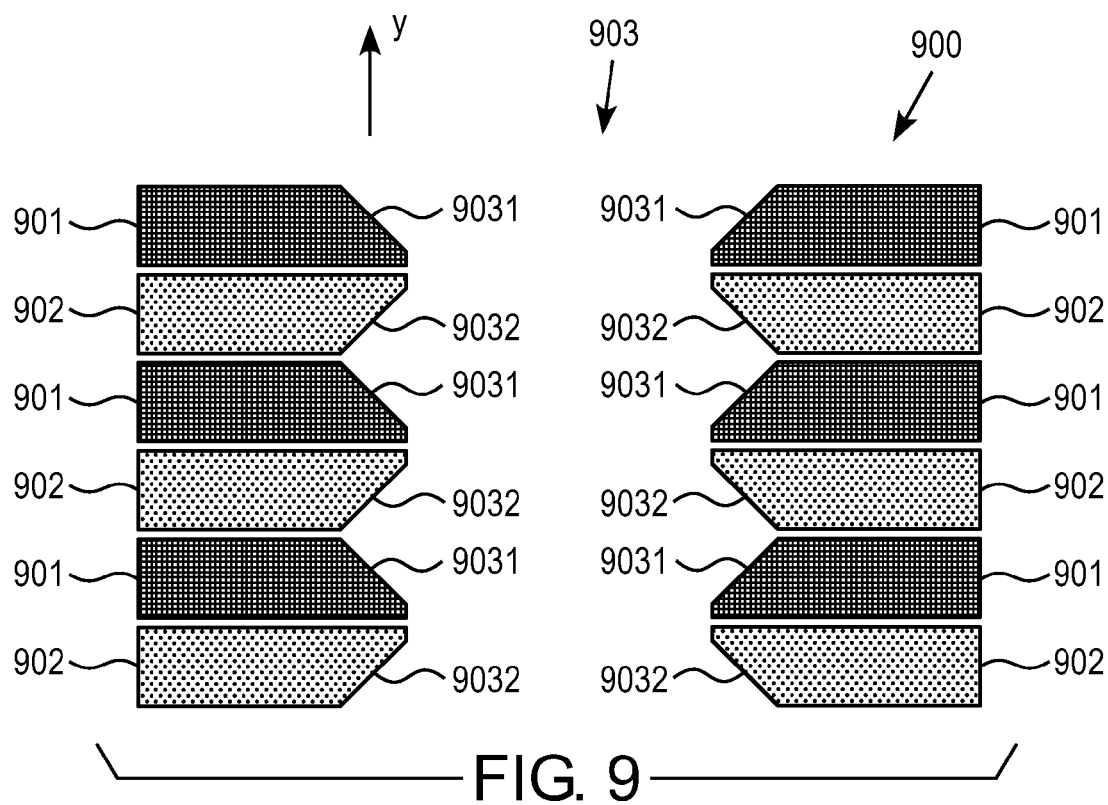
FIG. 9 shows a stack of NMSET with a triangular geometry.

The triangular geometry detailed in FIG. 9 is a partial optimization of the parabolic geometry for adiabatic flows. In this case, the gas is not permitted to experience a sufficient expansion to trigger large-scale vortex generation. Furthermore, because the apertures do not change size, a triangular arrangement such as this one may be easily stacked.

Figure 10:
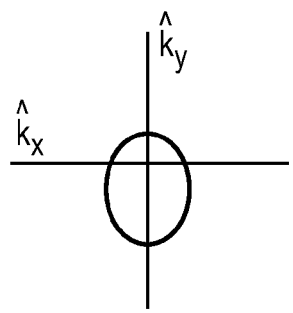
FIG. 10 shows the momentum space of the gas around the stack of NMSET with a triangular geometry.

The momentum space of this triangular geometry is more efficiently biased, as is illustrated in FIG. 10. As in the parabolic arrangement, the exposed hot and cold surfaces meet at preferably a 90-degree angle; however, a source of inefficiency arises when particles carry heat back and forth between surfaces across the center gap.

FIG. 9 shows a stack 900 of NMSET or related device with the triangular geometry. Each device in the stack 900 comprises a hot layer 902 and a cold layer 901 of equal thickness. The temperature differential between the cold and hot layers 901 and 902 can be established by any suitable means such as the Peltier effect or any other heat pump. Each device has a through hole 903. Each though hole 903 has approximately a 45° chamfer (9031 and 9032) on each entrance. The surface of the chamfers 9031 and 9032 is, for example, from 1.40 to 1.42 times of the thickness of the cold and hot layers 901 and 902, not including modifications to the acute angles for structural considerations. The through holes 903 in all layers in the stack 900 are aligned. In general, the temperatures of the hot layers 902 in a device in the stack 900 do not increase monotonically from one side of the stack to the other side. In general, the temperatures of the cold layers 901 in a device in the stack 900 do not decrease monotonically from one side of the stack to the other side. Preferably, each cold layer 901 is colder than its immediate adjacent hot layers 902 and each hot layer 902 is hotter than its immediate adjacent cold layers 901. For engineering reasons, the hot and cold surfaces of the triangular arrangement may not come to a fine point.

Sawtooth

Figure 11:
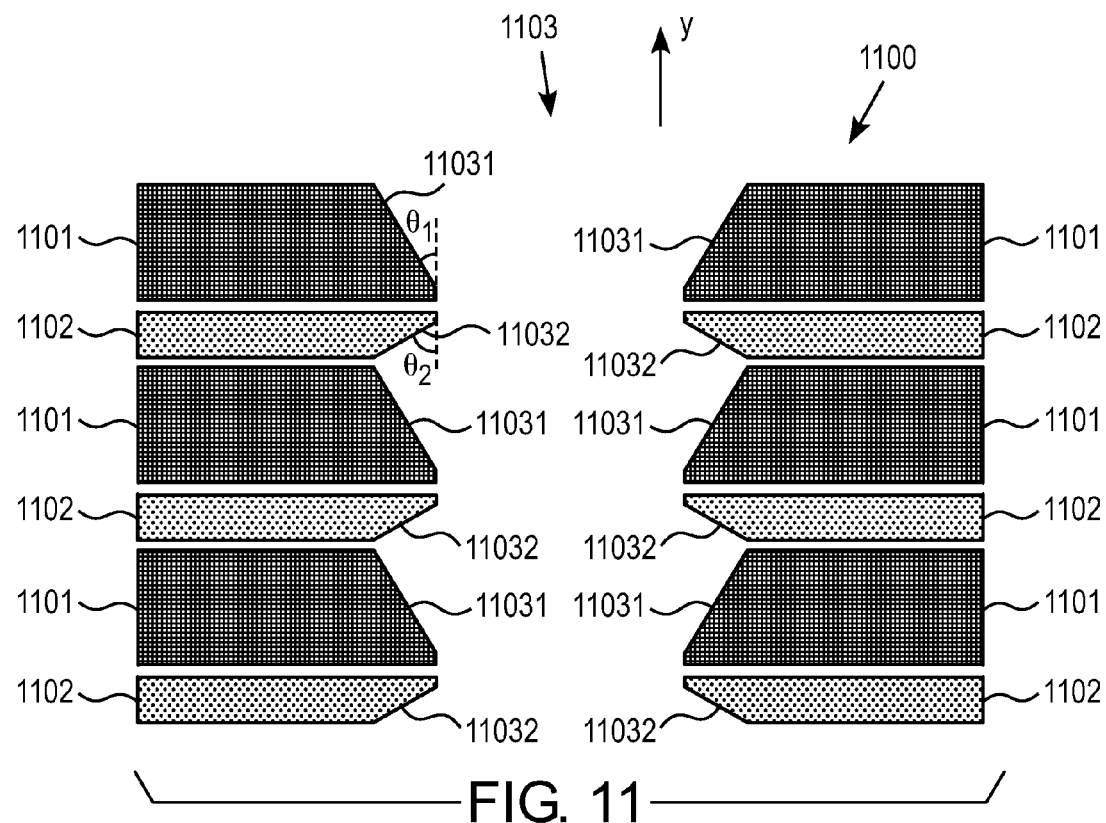
FIG. 11 shows a stack of NMSET with a sawtooth geometry.

FIG. 11 shows a stack 1100 of NMSET or related device with a sawtooth geometry. Each device in the stack 1100 comprises a hot layer 1102 with a thickness of $t_h$ and a cold layer 1101 with a thickness $t_c$. The temperature differential between the cold and hot layers 1101 and 1102 can be established by any suitable means such as the Peltier effect or any other heat pump. Each device has a through hole 1103. In the illustrated device, each through hole 1103 has a chamfer 11031 at the entrance on the side of the cold layer 1101, and a chamfer 11032 at the entrance on the side of the hot layer 1102. An angle between the chamfer 11031 and a center axis of the through hole 1103 is $\theta_1$; an angle between the chamfer 11032 and a center axis of the through hole 1103 is $\theta_2$. The sum of $\theta_1$ and $\theta_2$ is preferably from 75° to 105°, more preferably from 85° to 95, and more preferably from 88° to 92°. The ratio of $t_c$ to $t_h$ is substantially equal to the ratio of cotangent of $\theta_1$ to cotangent of $\theta_2$. $\theta_2$ is preferably from 70° to 85°.

The relationships of the chamfer angles described here are preferred limitations, not hard boundaries. In general for materials exhibit perfectly specular molecular reflection properties, the relationships of the chamfer angles can be slightly relaxed. For materials exhibit less than perfectly specular molecular reflection properties, the relationships shall be stringent. The chamfer geometries are preferably arranged so as to minimize shared bases. The surface normals of the specularly reflecting chamfer surfaces can thus preferably be orthogonal. Deviations from orthogonality can incur a penalty in efficiency as a cosine function. For engineering reasons, the hot and cold surfaces of the sawtooth arrangement may not come to a fine point.

In the illustrated device, the through holes 1103 in all layers in the stack 1100 are aligned. Temperatures of the hot layers 1102 in each device in the stack 1100 do not increase monotonically from one side of the stack to the other side. Temperatures of the cold layers 1101 in each device in the stack 1100 do not decrease monotonically from one side of the stack 1100 to the other side. Each cold layer 1101 is colder than its immediate adjacent hot layers 1102 and each hot layer 1102 is hotter than its immediate adjacent cold layers 1101.

The sawtooth geometry shown in FIG. 11 offers an improvement over the triangular geometry in that all hot layers 1102 are preferably oriented in nearly the same direction (i.e., $\theta_2$ is preferably nearly 90°). This reduces direct interaction between hot and cold layers 1102 and 1101 across the through hole 1103, and improves overall efficiency.

Figure 12:
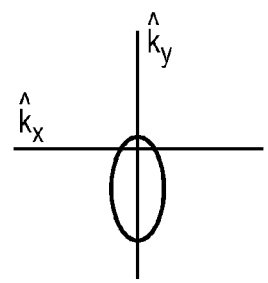
FIG. 12 shows the momentum space of the gas around the stack of NMSET with a sawtooth geometry.

Furthermore, because the hot layers 1102 have a lower exposed surface area than the cold layers 1101, and because the cold layers 1101 are preferably oriented at a shallower angle relative to the center axis of the through hole 1103 than in the triangular geometry, the sawtooth geometry is capable of reducing the entropy in the gas (and thereby causing it to do more work) more efficiently than the triangular geometry. The momentum space of this sawtooth geometry is more efficiently biased than the momentum space of the triangular geometry, as is illustrated in FIG. 12.

In the triangular configuration, device slices on opposite sides of a cross section have a magnitude of $1/\sqrt{2}$ in the y axis because their separation angle 90 degrees. This limits the efficiency of entropy reduction, as some of the entropy is going to be neutralized in direct inter-surface interaction.

In the sawtooth configuration, however, the hot layers 1102 not only share no basis with the adjacent cold layers 1101, but also share very little basis with hot and cold layers across the through hole 1103. This combined property makes the sawtooth geometry more efficient than the triangular geometry.

Figure 4:
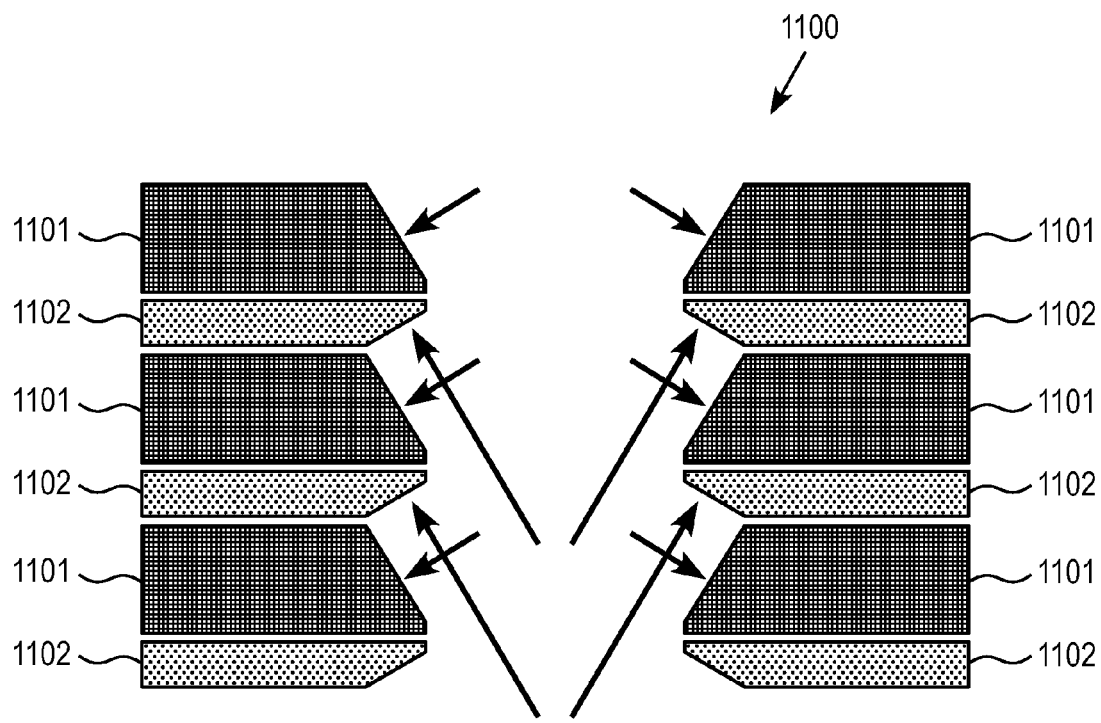
FIG. 4 shows net forces on a stack of Nano Molecular Solid-state Electrodynamic Thrusters ("NMSET") with sawtooth geometry.
Figure 5:
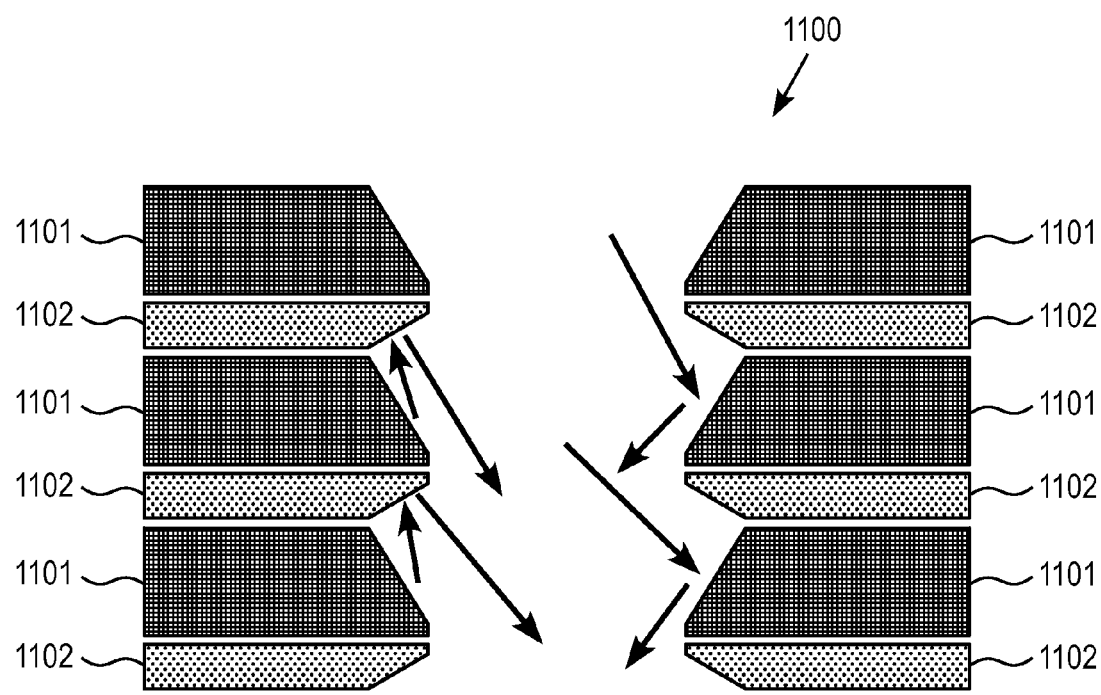
FIG. 5 shows gas particle velocities around a stack of NMSET with sawtooth geometry.

After NMSET or related device is powered (i.e. temperature differential is established), gas particles rebounding from cold layers have a reduced net velocity, while gas particles rebounding from hot layers have higher net velocity. FIG. 4 shows net forces the layers of the stack 1100 (sawtooth geometry) experience. In a stable state, low pressure is generated at the entrance aperture (upper aperture in FIG. 4) which in turn generates a corresponding low-pressure region above the stack 1100, and a high-pressure region below the stack 1100. Gas particle velocities of the stack 1100 resulting from the gas particle collisions are shown in FIG. 5.

Means for Establishing Temperature Differential

Internal Peltier

According to one embodiment, each element in the device geometry acts both as a particle director and as the entropy reducer. In a Peltier device, the hot and cold plates are made of materials with different Peltier coefficients. Electrical current is made to flow between the cold and hot plates. This flow of current carries with it Peltier heat, establishing the temperature differential necessary to operate the device. In some embodiments, piezoelectric spacers can be disposed between device elements to maintain the separation gaps therebetween.

Figure 13:
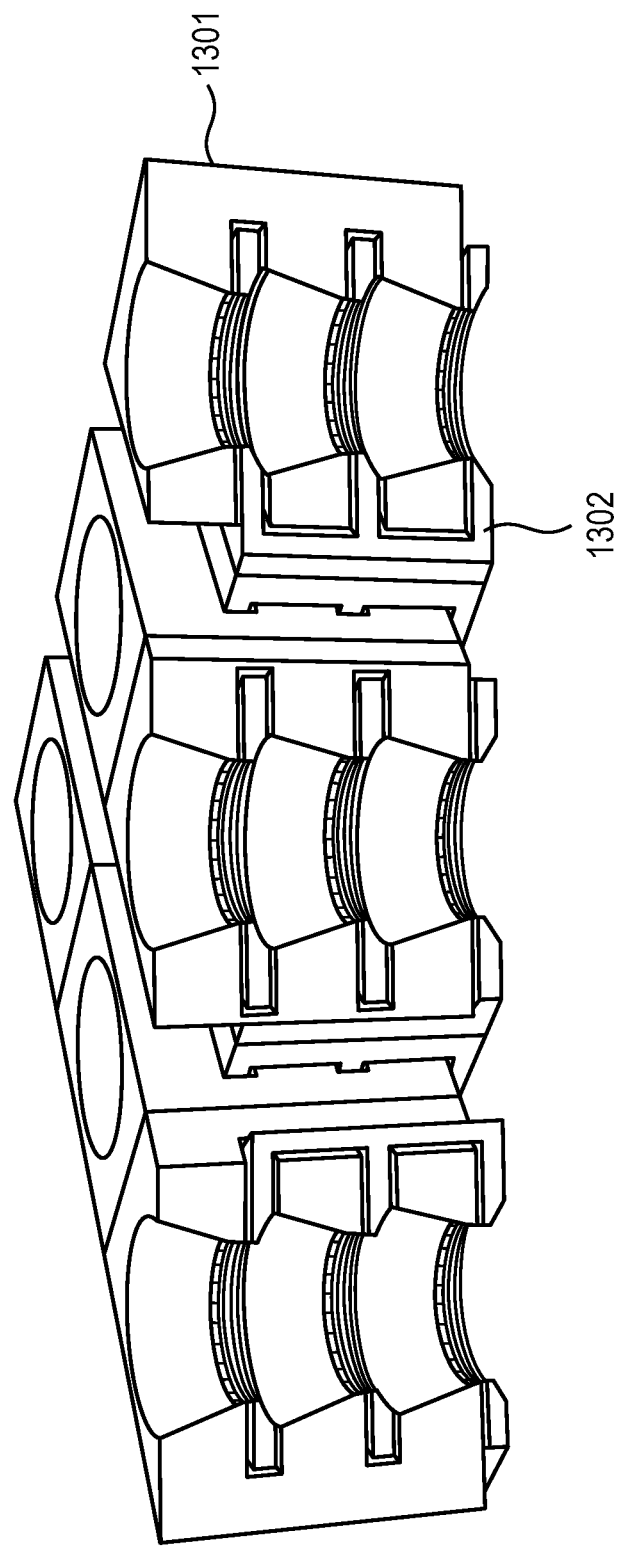
FIG. 13 shows a cross sectional view of an NMSET with an internal arrangement of solid state heat pumps. These heat pumps can be driven by Peltier effect, thermionic emission, or any other suitable means.
Figure 14:
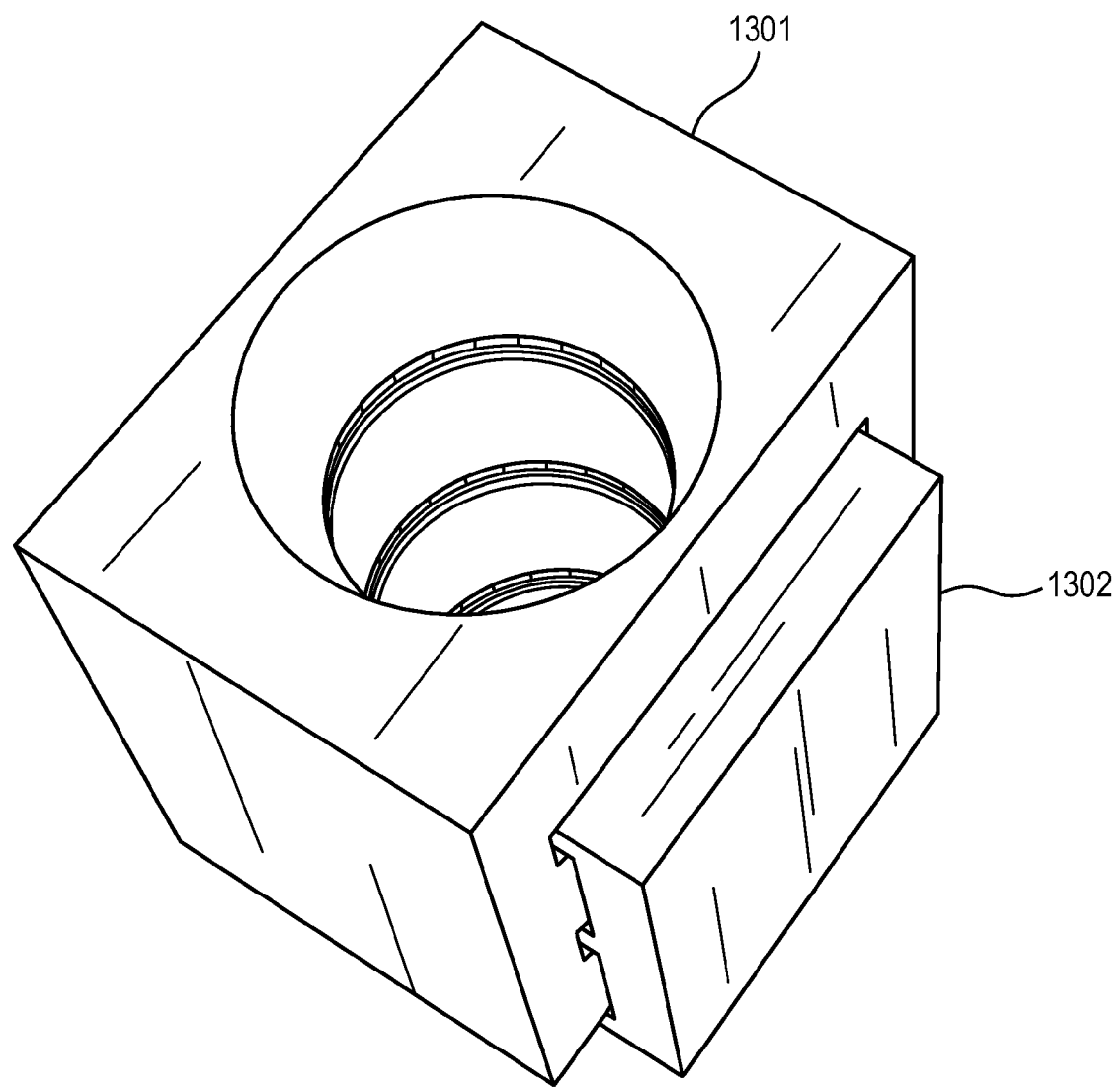
FIG. 14 shows a perspective view of NMSET with an internal solid state heat pump arrangement on FIG. 13.

A cross section of NMSET or related device according to an embodiment with an internal Peltier arrangement is detailed in FIGS. 13 and 14. All hot layers 1302 are connected. All cold layers 1301 are connected. Electric current flows through a Peltier device interposed between the cold and hot layers to establish a temperature differential. The thinner the layers are, the higher the electric current is necessary.

NMSET or related device with the internal Peltier arrangement can make it easier to reduce the size of the device. A single stack such as the one shown in FIG. 14 can be fully functional to generate thrust. NMSET or related device with the internal heat pump are further suitable for use in microelectromechanical systems (MEMs) that emphasize the highest degree of granularity.

Field-Enhanced Thermionic Emission

In another embodiment, the temperature differential can be generated by field-enhanced thermionic emission. As shown in FIG. 19, an electrical field can be established between the layers 1901 and 1902 such that charge carriers thermally emitted from the cold layer 1901 carry heat from the cold layer 1901 to the hot layer 1902.

External Peltier

In another embodiment, the temperature differential can be generated by a heat pump, such as a Peltier device external to NMSET or related device. This Peltier device arranged in a checker board fashion is thermally coupled to NMSET or related device stack 1500 via interface layers 1510 and 1520 as detailed in FIGS. 15 and 16.

A device with an external Peltier device has the benefit of separating the materials used to generate gas flow from the materials used to generate the temperature differential. From an engineering standpoint this may be desirable, as the materials suitable for a heat pump may not be suitable for microstructures, or vice versa. In addition, an external heat pump can be made larger and more efficient, and may require less current to establish a sufficient temperature differential.

Piezoelectric spacers can be used between layers. Materials suitable for use in NMSET preferably are strong enough to mechanically withstand thermal expansion and contraction, and/or preferably have very small expansion coefficients. Otherwise, holes in the layers could become misaligned, which could reduce efficiency.

External Non-Peltier

According to yet another embodiment, a temperature differential is established by any suitable heat source and/or heat sinks. For example, the heat sources might be field-enhanced thermionic emission, resistive heaters, chemical reaction, combustion, and/or direct illumination of bright light or other forms of radiation. An illustration of such an embodiment is shown in FIG. 17. In the example shown, a heating surface 1702 can be resistive heating material, or a material that can efficiently receive radiative heating. The external non-Peltier heat pump is convenient because it does not require a built in heat pump such as a Peltier device. For some applications, it may be convenient to direct the heating surface towards a source of radiation, such as the sun, rather than first converting radiation into electricity and drive a heat pump. Alternatively, a source of radiation may be directed toward a heat absorbing surface in thermal communication with the hot layer of NMSET or related device. In an external non-Peltier heat pump, however, more care is preferably taken to ensure that the NMSET or related device does not overheat.

The capillaries 1750 illustrated in FIG. 17 provide an exemplary mechanism by which a heat sink could be provided; however, it is also possible for the heat sink to simply be a series of vanes, or any other suitable heat sinks. Alternatively, the external non-Peltier heat pump in FIG. 17 could be configured to provide a heat source through the capillaries 1750. The heat source can be an exothermic chemical reaction, preferably one that does not generate too much pressure.

Materials

NMSET and related devices may be constructed of a wide range of materials. In various aspects, properties of materials may be exploited in combination with desirable geometries.

Specular reflection of gas molecules is a preferred property of the materials which form the gas-exposed surfaces of NMSET or related device, e.g. the heated and cooled surfaces which are in contact with flowing gas. Specular reflection is the mirror-like reflection of light, or in this case gas particles, from a surface. On a specular surface, incoming gas particles at a single incident angle are reflected from the surface into a single outgoing angle. If the incoming gas particles and the surface have the same temperature, the incident angle and the outgoing angle with respect to the surface normal are the same. That is, the angle of incidence equals the angle of reflection. A second defining characteristic of specular reflection is that incident, normal, and reflected directions are coplanar. If the incoming gas particles and the surface are not at the same temperature and the reflection is diabatic (i.e. with heat exchange between the gas particles and the surface), the angle of reflection is a function of heat transferred between the surface and the gas particles.

The degree of specularity of a material may be represented by a reflection kernel (such as the Cercignani-Lampis kernel) which is defined as the probability density function of reflected state of the gas particles per unit volume of the phase space. Details of the reflection kernel are disclosed in "Numerical Analysis of Gas-Surface Scattering Effect on Thermal Transpiration in the Free Molecular Regime", Vacuum, Vol. 82, Page 20-29, 2009, and references cited therein, all of which are hereby incorporated by reference.

Individual hot and cold layers may also be constructed of one or more structural elements which can comprise structural materials, e.g. a means for conferring rigidity, thermal conductive material, e.g. a means for heat transfer to and from a temperature differential generating means, and atomic reflection material, e.g. means for providing a desirable reflection kernel properties. In some embodiment, individual hot and cold layers may be constructed of layered composites of such materials.

Thus, the choice of materials is and composition is widely variable. In some embodiments, materials suitable for construction of NMSET or related device can include titanium, silicon, steel, and/or iron. Titanium is light weight and possesses a hexagonal crystalline structure. Interfaces of titanium may be created at orthogonal angles without crystalline warping and therefore no stress limit. Material costs of titanium are high. Silicon is inexpensive and has well understood properties and processes for machining. The crystalline structure of silicon is diamond cubic. Steel is cheaper than titanium, possesses a cubic crystalline structure, and is highly resistant to gaseous intrusion. Iron is cheaper than steel and has a crystalline form which makes it suitable for application in NMSET and related devices.

Exemplary Methods of Manufacturing NMSET or Related Device

According to one embodiment as shown in FIG. 20, a method of manufacturing an NMSET or related device comprises: (a) providing a suitable substrate 2001 such as, for example, amorphous silicon, crystalline silicon, ceramic, etc., the substrate preferably having a thickness of 500 to 1500 microns; however thinner and thicker substrates are possible; (b) depositing a first layer 2002, a mostly sacrificial layer, preferably an electrical insulator, such as, for example, silicon dioxide, the first layer 2002 preferably having a thickness of 200 nm to 50 microns, however thinner and thicker layers are possible. Furthermore, depending on the area of the substrate window 2001a, it is advantageous for this layer to have a tunable stress level. For example, for a 1 cm² substrate window 2001a, successful results have been achieved with $SiO_xN_y$ at 60 MPa tensile strength; (c) forming a pattern of discrete islands in any suitable shape such as, for example, strip, square, circle from the first layer 2002 by photolithography and etching the first layer 2002; (d) depositing a second layer 2003 over the discrete islands, the second layer 2003 being an electrical conductor such as, for example, Al, Nb or Zn, preferably having a thickness of 5 to 200 nm, however, other thicknesses are contemplated; (e) depositing a third layer 2004 over the second layer 2003, the third layer 2004 being an electrical insulator such as, for example, silicon dioxide or the same material used in layer 2002, preferably having the same thickness as the first layer 2002, however, other thicknesses are contemplated; (f) partially removing the third layer 2004 and the second layer 2003 until the first layer 2002 is exposed; (g) depositing a fourth layer 2005, the fourth layer 2005 being an electrical insulator such as, for example, silicon dioxide preferably of the same material as 2003, the fourth layer 2005 preferably having a thickness of 3 to 15 nm, thinner is better as long as there are few or no gaps in coverage; (h) depositing a fifth layer 2006, the fifth layer being an electrical conductor such as, for example, Pt, Ni or Cu, and preferably having a thickness of 5 to 200 nm, however, other thicknesses are contemplated; (i) depositing a sixth layer 2007, such layer being formed to protect the front side of the substrate while the backside is being worked on. Such layer can be made of, for example, wax, photoresist, or silicon dioxide substrate attached to the fifth layer 2006 via thermal release tape, the sixth layer 2007 preferably having a thickness of 500 to 1500 microns, however, other thicknesses are contemplated; (j) forming through holes 2001a in the substrate 2001 by photolithography and etching the substrate 2001, such that at least one discrete island of the first layer 2002 is exposed therein, the through holes 2001a having any suitable shape such as, for example, hexagons, squares and circles, the through holes 2001 being arranged in any suitable pattern such as, for example, a hexagonal grid, square grid and a polar grid; (k) removing exposed discrete islands by etching until portions of the fourth layer 2005 there above are exposed; (l) removing exposed portions of the fourth layer 2005 by etching until portions of the fifth layer 2006 there above are exposed; (m) removing exposed portions of the fifth layer 2006 by etching; (n) partially removing the fourth layer 2005 by etching laterally such that the second layer 2003 and the fifth layer 2006 overhang the fourth layer 2005 by 2-10 nm; (o) completely removing the sixth layer 2007 by thermal release, dissolving or etching. The second layer 2003 and the fifth layer 2006 preferably have a difference of at least 0.1 eV, at least 1 eV, at least 2 eV or at least 3 eV in their work-functions.

According to another embodiment as shown in FIG. 21, a method of manufacturing an NMSET or related device comprises: (a) providing a suitable substrate 2101 such as, for example, amorphous silicon, crystalline silicon, ceramic, etc., the substrate preferably having a thickness of 500 to 1500 microns; however thinner and thicker substrates are possible; (b) depositing a first layer 2102, a mostly sacrificial layer, preferably an electrical insulator such as, for example, silicon dioxide, the first layer 2102 preferably having a thickness of 50 nm to 1000 nm; however thinner and thicker layers are possible. Furthermore, depending on the area of the substrate window 2101a, it is advantageous for this layer to have a tunable stress level. For example, for a 1 cm² substrate window 2101a, successful results have been achieved with $SiO_xN_y$ at 60 MPa tensile strength; (c) depositing a second layer 2103 over the first layer 2102, the second layer 2103 being an electrical conductor such as, for example, Al, Nb or Zn and preferably having a thickness of 5 to 150 nm, however, other thicknesses are contemplated; (d) depositing a third layer 2104 over the second layer 2103, the third layer 2104 being an electrical insulator such as, for example, silicon dioxide and preferably having a thickness of 5 to 100 nm, however, other thicknesses are contemplated, and preferably the same material as 2102; (e) depositing a fourth layer 2105 over the third layer 2104, the fourth layer 2105 being an electrical conductor such as, for example, Pt, Ni or Cu and preferably having a thickness of 5-150 nm, however, other thicknesses are contemplated; (f) forming holes through the second layer 2103, the third layer 2104 and the fourth layer 2105 by photolithography and etching, the holes having any suitable shape such as, for example, strips, squares, circles; (g) partially removing the third layer 2104 by etching laterally such that the second layer 2103 and the fourth layer 2105 overhang the third layer 2104; (h) forming through holes 2101*a* in the substrate 2101 by photolithography and etching the substrate 2101, such that at least one hole through the second layer 2103, the third layer 2104 and the fourth layer 2105 overlaps with one through hole 2101*a*, the through holes 2101*a* having any suitable shape such as, for example, hexagons, squares and circles, the through holes 2101 being arranged in any suitable pattern such as, for example, a hexagonal grid, square grid and a polar grid; (i) removing portions of the first layer 2102 exposed in the through holes 2101*a*. The second layer 2103 and the fourth layer 2105 preferably have a difference of at least 0.1 eV, at least 1 eV, at least 2 eV or at least 3 eV in their work-functions.

Exemplary Thermal Transpiration Devices with Vacuum Layer

Figure 22:
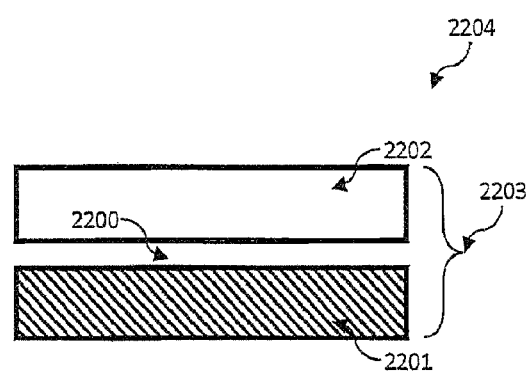
FIG. 22 is a side cross-sectional view illustrating a thermal transpiration device.

Though somewhat redundant, FIG. 22 is a side cross-sectional view illustrating a thermal transpiration device, such as NMSET or related device, shown generally at 2204. The thermal transpiration device includes a cold side membrane 2202 and a hot side membrane 2201, with a thermal insulator 2200 provided in between. The thermal insulator 2200 may be formed of a vacuum, which can be achieved, for example, via the Venturi effect. The thermal transpiration device 2204 includes a thickness 2203 defined by the cold side membrane 2202, the thermal insulator 2200 and the hot side membrane 2201.

Figure 23:
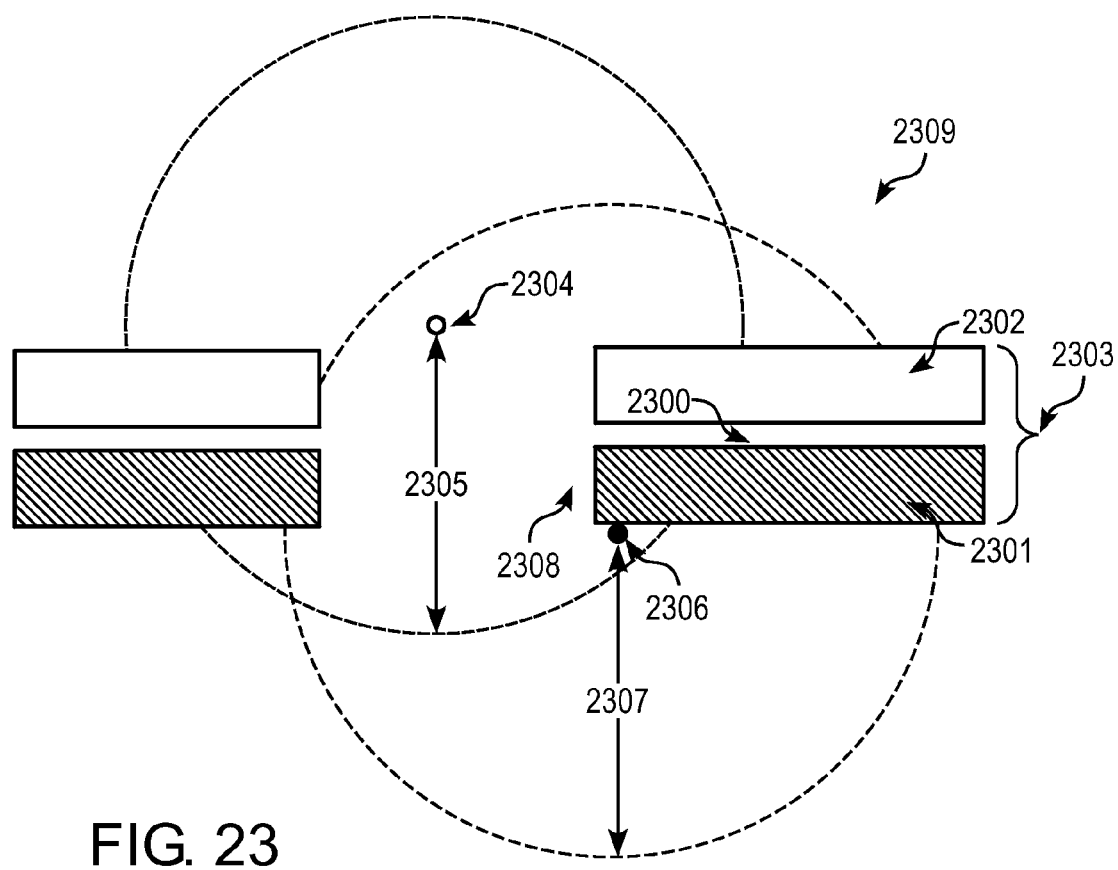
FIG. 23 is a side cross-sectional view illustrating the operation of a thermal transpiration device.

FIG. 23 is a side cross-sectional view illustrating the operation of a thermal transpiration device, shown generally at 2309. The device 2309 includes a hotter layer 2301, a colder layer 2302, with a thermal insulator 2300 provided there between. Apertures 2308 are formed in the device 2309 in a manner as previously described. The thermal transpiration device 2309 includes a thickness 2303 defined by the colder layer 2302, the thermal insulator 2300 and the hotter layer 2301. The thermal insulator 2300 can be formed of a vacuum, which can be achieved, for example, via the Venturi effect.

Colder gas particles 2304, which have a mean free path (average distance traveled before hitting another particle) shown by radius 2305, enter the aperture 2308, or the edge thereof, and collide with other particles, thus exchanging energy. Hotter gas particles 2306, which have a mean free path shown by radius 2307, collide into the hotter layer 2301, thus gaining energy in the process and imparting a positive momentum force. The colder gas particles 2304 reduce the temperature of the hotter gas particles 2306, which collide back into the hotter layer 2301, thus gaining energy and imparting a positive momentum force and increased pressure on the hot layer 2301.

Figure 24:
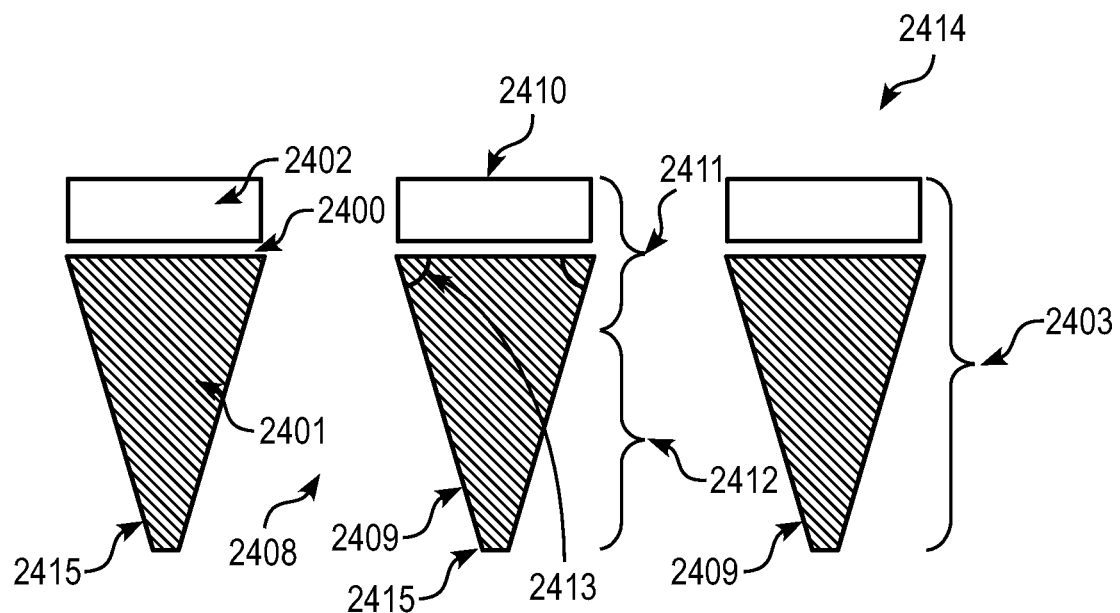
FIG. 24 is a side cross-sectional view of a thermal transpiration device with one extended layer and angled walls.
Figure 25:
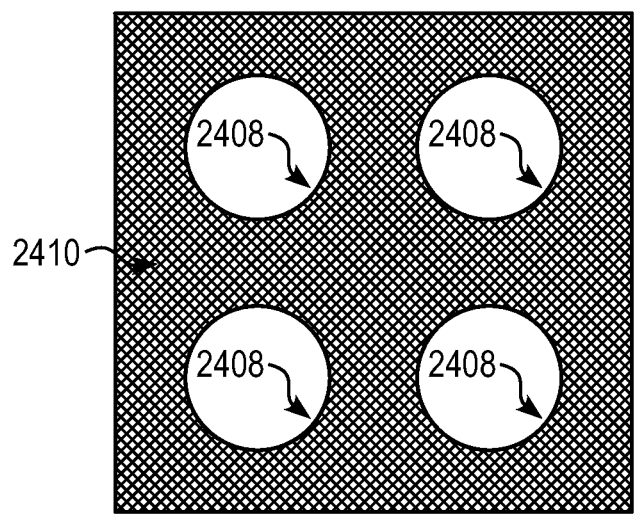
FIG. 25 is a top cross-sectional view of the thermal transpiration device illustrated in FIG. 24.

FIGS. 24 and 25 are respective side and top cross-sectional views of a thermal transpiration device, shown generally at 2414, with one extended layer having angled walls. The device 2414 includes a hotter layer 2401 and a colder layer 2402, with a thermal insulator 2400 provided there between. The thermal insulator 2400 can be formed as a vacuum, which can be achieved, for example, via the Venturi effect. The total thickness of the device 2414 is indicated by reference number 2403, and is defined by the colder layer 2402, the thermal insulator 2400 and the hotter layer 2401.

Apertures 2408 are provided in the device 2414, forming angled walls 2415 in the hotter layer 2401, in a manner as previously described. The apertures 2408, and/or edges thereof, aid in defining a hotter surface 2409, a colder surface 2410, an active area 2411 generally where thermal transpiration occurs, and a support area 2412. As shown in FIG. 24, the angle 2413 of the hotter surface 2409 is less than 90-degrees in order to form the angled walls 2415.

While FIGS. 24 and 25 illustrate the extended layer having angled walls as being the hotter layer 2401, one skilled in the art will appreciate that the colder layer 2402 could be implemented as the extended layer having angled walls as an acceptable alternative.

Figure 26:
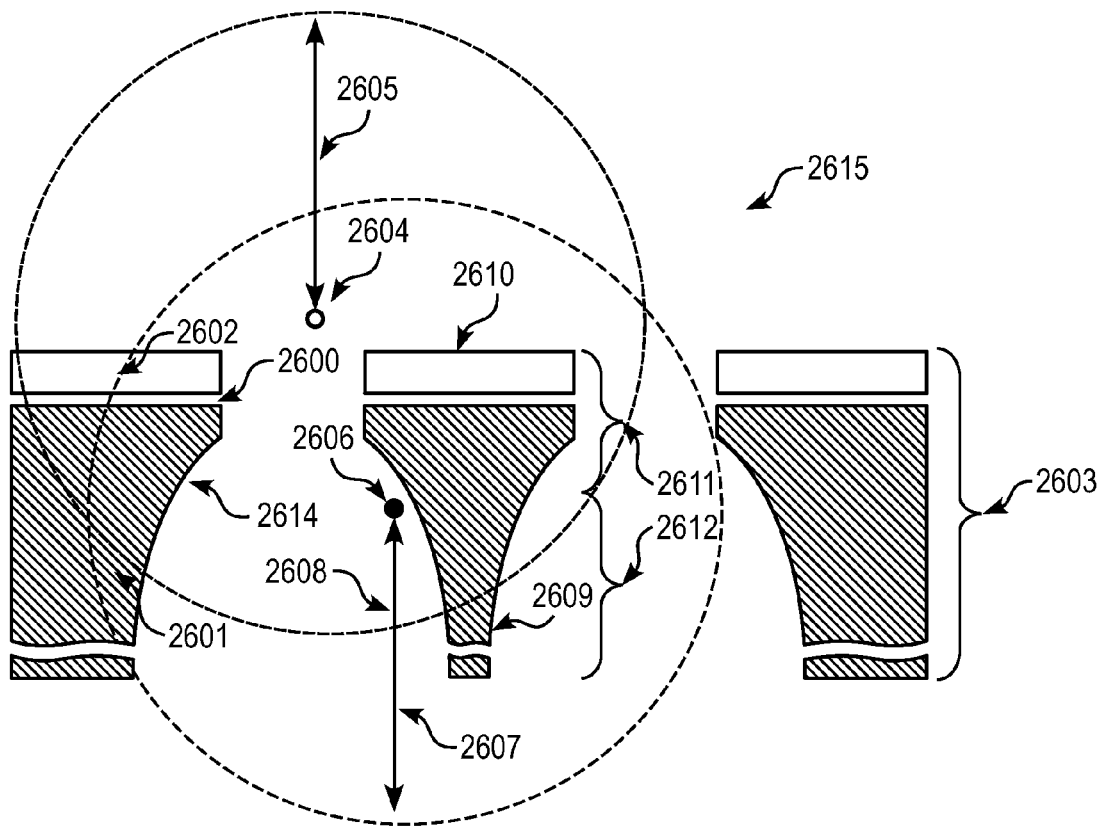
FIG. 26 is a side cross-sectional view of a thermal transpiration device with one extended layer and wet or dry etched walls.
Figure 27:
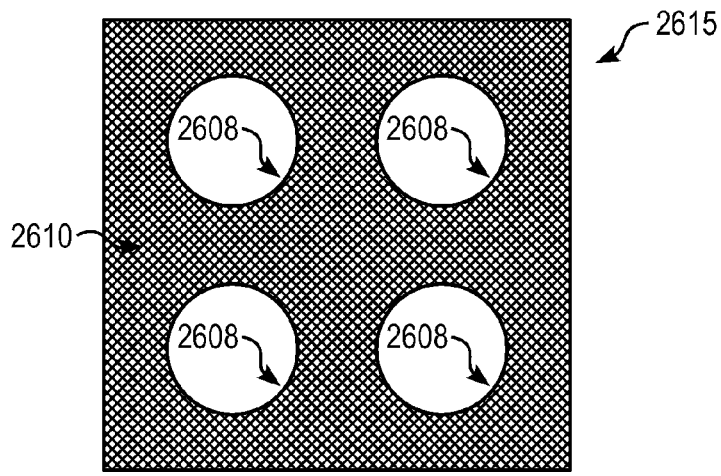
FIG. 27 is a top cross-sectional view of the thermal transpiration device illustrated in FIG. 26.

FIGS. 26 and 27 are respective side and top cross-sectional views of a thermal transpiration device, shown generally at 2615, with one extended layer having wet or dry etched walls. The device 2615 includes a hotter layer 2601, a colder layer 2602, with a thermal insulator 2600 provided there between. The thermal insulator 2600 can be formed as a vacuum, which can be achieved, for example, via the Venturi effect. The total thickness of the device 2615 is indicated by reference number 2603, and is defined by the colder layer 2602, the thermal insulator 2600 and the hotter layer 2601.

Apertures 2608 are provided in the device 2615, and forming wet or dry etched walls 2614 in the hotter layer 2601 having a generally parabolic shape, in a manner as previously described. The apertures 2608, and/or edges thereof, aid in defining a hotter surface 2609, a colder surface 2610, an active area 2611 generally where thermal transpiration occurs, a support area 2612 and wet or dry etched surfaces 2614.

Reference number 2605 indicates the mean free path radius of colder gas particles 2604. Reference number 2607 indicates the mean free path radius (the average distance traveled before hitting other particles) of hotter gas particles 2606. The colder gas particles 2604, enter the aperture 2608, or the edge thereof, and collide with other particles, thus exchanging energy. The hotter gas particles 2606 collide into the hotter layer 2601 at the outer edge thereof or at the wet-etched surface 2614, thus gaining energy in the process and imparting a positive momentum force. The colder gas particles 2604 reduce the temperature of the hotter gas particles 2606, which collide back into the hotter layer 2601 thus gaining energy and imparting a positive momentum force and increased pressure on the hot layer 2601.

While FIGS. 26 and 27 illustrate the extended layer having wet-etched walls as being the hotter layer 2601; one skilled in the art will appreciate that the colder layer 2602 could be implemented as the extended layer having angled walls as an acceptable alternative.

Figure 28:
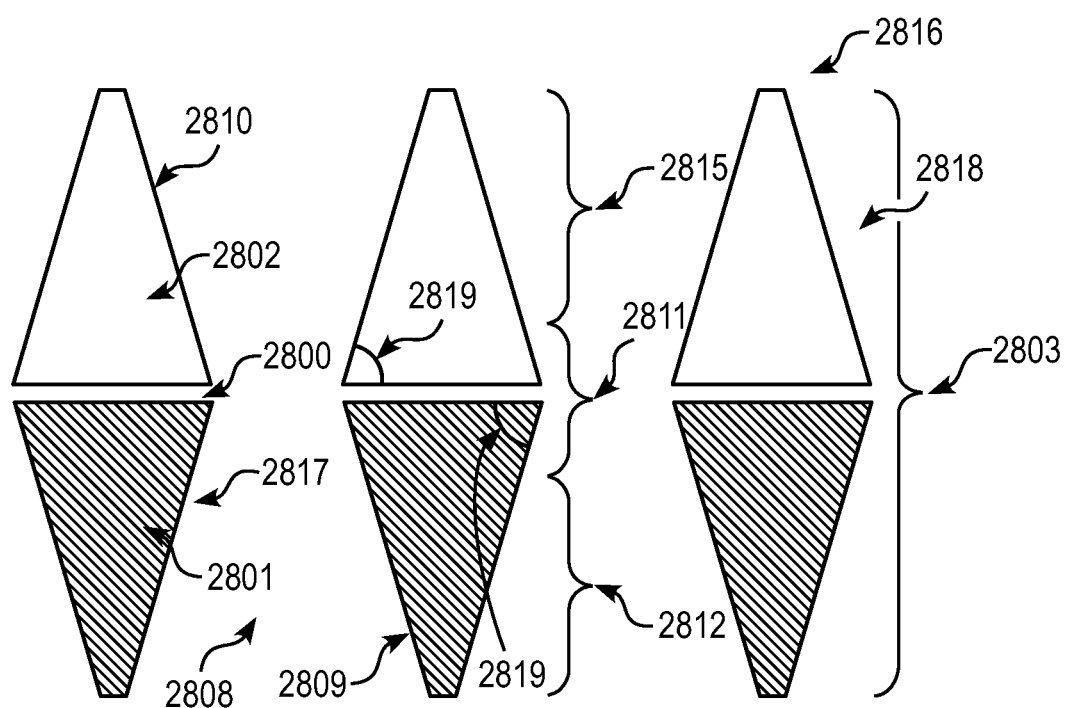
FIG. 28 is a side cross-sectional view of a thermal transpiration device with two extended layers and angled walls.

FIG. 28 is a side cross-sectional view of a thermal transpiration device, shown generally at 2816, with two extended layers having angled walls. The device 2816 includes a hotter layer 2801 and a colder layer 2802, with a thermal insulator 2800 provided there between. The thermal insulator 2800 can be formed as a vacuum, which can be achieved, for example, via the Venturi effect. The device 2816 has a total thickness 2803, defined by the colder layer 2802, the thermal insulator 2800 and the hotter layer 2801.

Apertures 2808 are provided in the device 2816, forming angled walls 2817 and 2818 in the hotter 2801 and colder 2802 layers, respectively, in a manner as previously described. The apertures 2808, and/or edges thereof, aid in defining a hotter surface 2809, a colder surface 2810, an active area 2811 generally where thermal transpiration occurs, a support area 2812 for the hotter layer 2801, and a support area 2815 for the colder layer 2802. As shown in FIG. 28, the angle 2819 of both the hotter 2809 and colder 2810 surfaces are less than 90-degrees in order to form the angled walls 2818 and 2817, respectively. While the angles 2819 of the hotter 2809 and colder 2810 are shown in FIG. 28 as being approximately the same angle, the hotter 2809 and colder 2810 surfaces may be angled at different angles as an acceptable alternative depending on the embodiment.

In an ideal thermal transpiration device, the total thickness of the active area of the device designed to operate in atmosphere should be less than 500 nm. For optimization purposes, the thickness between the hot and cold surfaces should be no greater than 100 nm. Such small thicknesses make the device extremely fragile and difficult to work with. If, for example, the device layers, or membranes, are made thicker in order to provide the required thickness for the stability and strength of the device, its overall thickness would increase to a point that it exceeds the ideal thickness, as discussed above.

Figure 29:
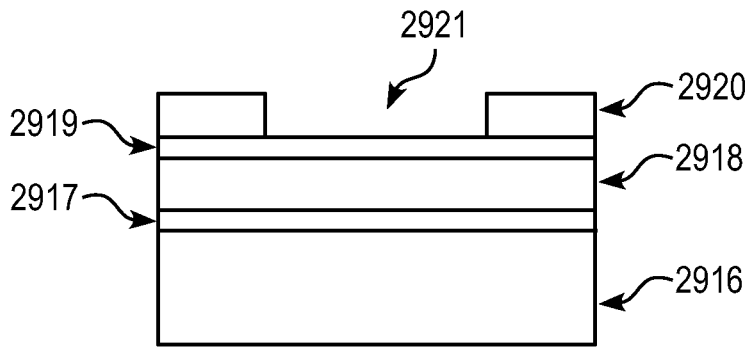
FIG. 29 is a cross-sectional view of a beginning construction of one embodiment of a thermal transpiration device.

FIG. 29 is a cross-sectional view of the beginning construction of one embodiment of a thermal transpiration device, shown generally at in accordance with the present disclosure, which allows the thickness of a thermal transpiration device to be made thicker to enhance it durability and strength, while at the same time maintaining the thickness of the device in its critical area to within an ideal thickness range.

As shown in FIG. 29, the construction of the device is as follows. First, a silicon substrate layer 2916 is provided. A first metal layer 2917 of, for example, approximately 40 nm of aluminum, is deposited on the substrate 2916. The deposition process may be evaporation, but other deposition methods may be used, such as, for example, sputtering, metal organic vapor deposition, etc. Hence, the first metal layer 2917 may be 40 nm of evaporated aluminum.

A dielectric layer 2918 is deposited on top of the first metal layer 2917. The dielectric layer 2918 must be low stress and may be formed of a plastic or inorganic non-electrically conducting film material. The film (i.e., dielectric layer 2918) may be, in particular, low-stress (e.g., 60 MPa) plasma enhanced chemical vapor deposition oxynitride that is 2 microns thick. Other thicknesses are also contemplated.

An adhesion promoter layer 2919 may be deposited on dielectric layer 2918 to promote adhesion to the dielectric and or to act as an enhanced masking layer. Such material may be a chemical monolayer, such as HMDS, a thin film of organic resist, or a metal, in particular, 6 nm of chromium. The adhesion promoter layer 2919 may not be necessary on certain combinations of thin films and etching methods or etching chemicals.

The device is then etched, as is conventionally known, using a mask 2920 of approximately 1.3 microns SPR-3012, for example, with an unmasked area 2921. Etching may be achieved by depositing the photoresist layer, or mask, 2920 over the adhesion promoter layer 2919, as is known to do by one of ordinary skill in the art. Such a photoresist is preferably Shipley SPR-3012; however, other photoresists may be utilized. The photoresist layer 2920 may then be exposed through a conventional mask to develop unmasked areas 2921. Exposure can be made, for example, using an appropriate wavelength of light. Contact lithography may also be used as would be understood by one of ordinary skill in the art. Once exposed, the photoresist layer 2920 may be developed in a solution appropriate for that purpose to form the unmasked areas 2921. Such a solution may be, for example, 0.26M tetramethylamonium hydroxide for SPR-3012 for approximately 60 seconds.

Figure 30:
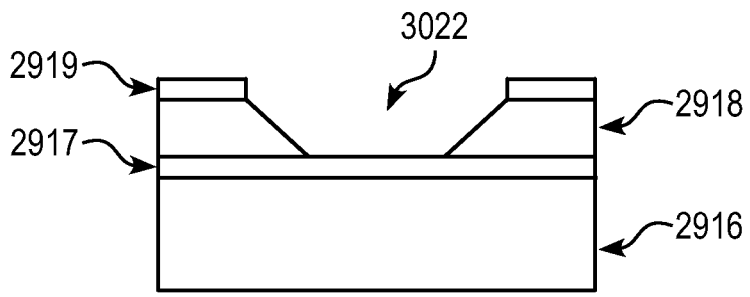
FIG. 30 is a cross-sectional view of the continued construction of the thermal transpiration device shown in FIG. 29.

As shown in FIG. 30, the device is etched at the unmasked areas 2921 (See FIG. 29) to form etched areas 3022. The etched areas 3022 are formed by etching into the adhesion promoter layer 2919 and the dielectric layer 2918 until portions of the first metal layer 2917 are exposed. The photoresist layer 2920 (see FIG. 29) is then removed. The adhesion promoter layer 2919 may be etched using a wet etch, such as, for example, a chromium etch 1020 from Transene, until the silicon substrate 2916 is exposed. The dielectric layer 2918 may be etched, for example, with a chemical that will not etch the first metal layer 2917. In the case of oxynitride on aluminum, the aqueous acid solution Silox Vapox II from Transene can be used. Other wet chemistries may also be used, or a dry plasma etch.

Figure 31:
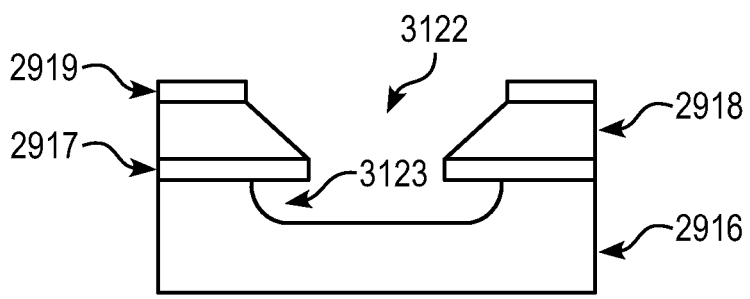
FIG. 31 is a side cross-sectional view of the continued construction of the thermal transpiration device shown in FIG. 30.

FIG. 31 is a side cross-sectional view showing further etching of the thermal transpiration device shown in FIGS. 29-30. Reference number 2916 is the silicon substrate, reference number 2917 is the first metal layer, reference number 2918 is the dielectric layer, and reference number 2919 is the adhesive promoter layer. In FIG. 31, the device, namely, the etched area 3022 (see FIG. 30), has been further etched to provide an etched area 3122 and under cut area 3123. To form the etched area 3122, the first metal later 2917 is etched, and then portions of the substrate 2916 are etched. One method of forming the undercut areas 3123, portions of the substrate 2916 which are underneath the first metal layer 2917 are isotropically etched.

The first metal layer 2917 may be etched with either wet or dry etching. In the case of aluminum, for example, an aluminum etch in a reactive ion etcher with chlorine and argon at low pressure may be used to etch the first metal layer 2917. An example of an etch for 40 nm of aluminum is 50 sccm BCl3, 20 sccm Cl2, 10 mTorr, with 300 W RF power.

A wet or vapor etch can be used to etch the substrate 2916, as long as the chemistry does not etch the first metal layer 2917, the dielectric layer 2918 or the second metal layer 2919. In the case of a silicon substrate with aluminum and oxynitride, the silicon may be etched, for example, with the gas XeF2. The substrate 2916 may also be treated to remove boron. One exemplary method of such a treatment is to use a fluorine based reactive ion plasma under the conditions of 35 sccm $CF_4$, 20 mTorr, and 300 W RF power.

Figure 32:
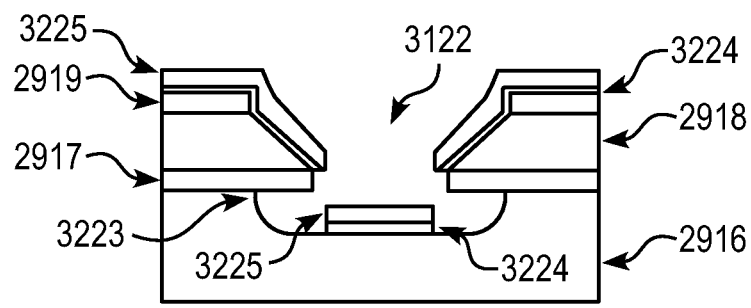
FIG. 32 is a cross-sectional view showing further construction of the thermal transpiration device shown in FIG. 31.

FIG. 32 is a cross-sectional view showing further formation of the thermal transpiration device shown in FIGS. 29-31. A thin layer 3224 of silicon dioxide or another electrical insulator is provided over the device. The silicon dioxide layer 3224 can be, for example, approximately 2-10 nm thick. Thinner is generally better as long as there are few or no gaps in coverage, especially near the first metal layer 2917. The layer 3224 of silicon dioxide is provided to control tunneling thickness. The layer 3224 can be added by evaporation, or other known techniques. For example, other methods, such as sputtering, plasma enhanced chemical vapor deposition, atomic layer deposition, etc., may be used as well, along with other materials. A second metal layer 3225 is provided over the silicon dioxide layer 3224. The second metal layer 3225 may be a layer of metal, such as nickel or copper, and may be approximately 40 nm thick. The second metal layer 3225 may be formed by evaporation, but other methods may be used as well, such as, for example, sputtering or ion assisted deposition.

The substrate 2916 is then mounted to a carrier substrate (not shown) with the thin film stack facing the carrier. The mount material could be, for example, a double-sided tape, such as Revalpha thermal release tape. However, other tapes and materials, such as, for example, wax or photoresist, may be used as well.

Figure 33:
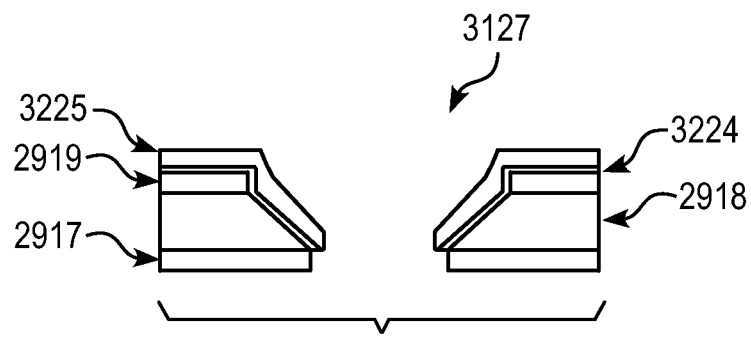
FIG. 33 is a cross-sectional view showing the islands formed in the construction of the thermal transpiration device.

The remaining silicon substrate 2916 is then removed with, for example, an XeF2 vapor etch. The small portions of the silicon dioxide layer 3224 and the second metal layer 3225 formed in the etched portion of the substrate 2916 are removed with the substrate 2916. Wet chemistry may also be used to remove the substrate 2916, as long as it does not etch the first and second metal layers 2917 and 3225. What is left, as shown in FIG. 33, are the islands 3127 formed by the first metal layer 2917, the dielectric layer 2918, the adhesion promoter layer 2919, the thermo tunneling layer 3224, and the second metal layer 3225. The device is then sonicated to remove any Nickel plugs. In the case of Revalpha thermal release tape, for example, the carrier substrate can be placed on a hotplate of sufficient temperature to aid in removing the device.

Fault Tolerant Control System for Distributed Micro-Thrusters

In order to drive an object using distributed thrusters in a particular direction and or at a desired speed, a control system is needed. The control system is used to selectively activate and or adjust power levels to a distributed thruster or plurality of distributed thrusters to provide the desired force in the desired direction.

In accordance with the present control system, a control system for controlling the operation of distributed thrusters may be constructed as a grid of elements (each containing one or more thrusters) fed by at least a redundant two dimensional network of power distribution wiring. The distribution network is constructed as a plurality of loops comprised of horizontal and vertical lines or wires that are coupled to a plurality of horizontal rows and vertical columns of thrusters.

According to one embodiment of the present control system, each row and column loop meet or intersect in at least four locations, but alternating topologies may be designed to balance redundancy, number of loops, and the granularity of addressing. Alternate topologies may have a different number of crossings.

At least one power source may be supplied for each element in the grid or for a plurality of elements. One element may contain a plurality of thrusters. One terminal of the power source is connected to a horizontal line, and the other terminal of the power source is connected to a vertical line. This connection permits an element or group of elements to be addressed by connecting the terminals of a power source to the appropriate row and column.

In accordance with the general operation of the distributed thrusters such as NMSET, an electrical circuit is used to activate distributed thrusters by supplying and or regulating the amount of heat to the distributed thruster. An electrical circuit is formed by a loop comprised of the horizontal and vertical lines. Both ends of a given loop are driven at the same electrical potential. This means that a single cut anywhere in a given loop (as a result, for example, from damage to the array surface) will minimize a cascading loss of functionality. The heating or cooling caused by electrical circuit may be implemented by way of a heat pump, such as one driven by the Peltier effect using a Peltier slab. In this instance, the wiring are on either side of the distributed thrusters, and in a resistance embodiment explained below, they may be only on the hot side. In further embodiments of distributed thrusters, other methods of powering the distributed thrusters can be used.

Figure 34:
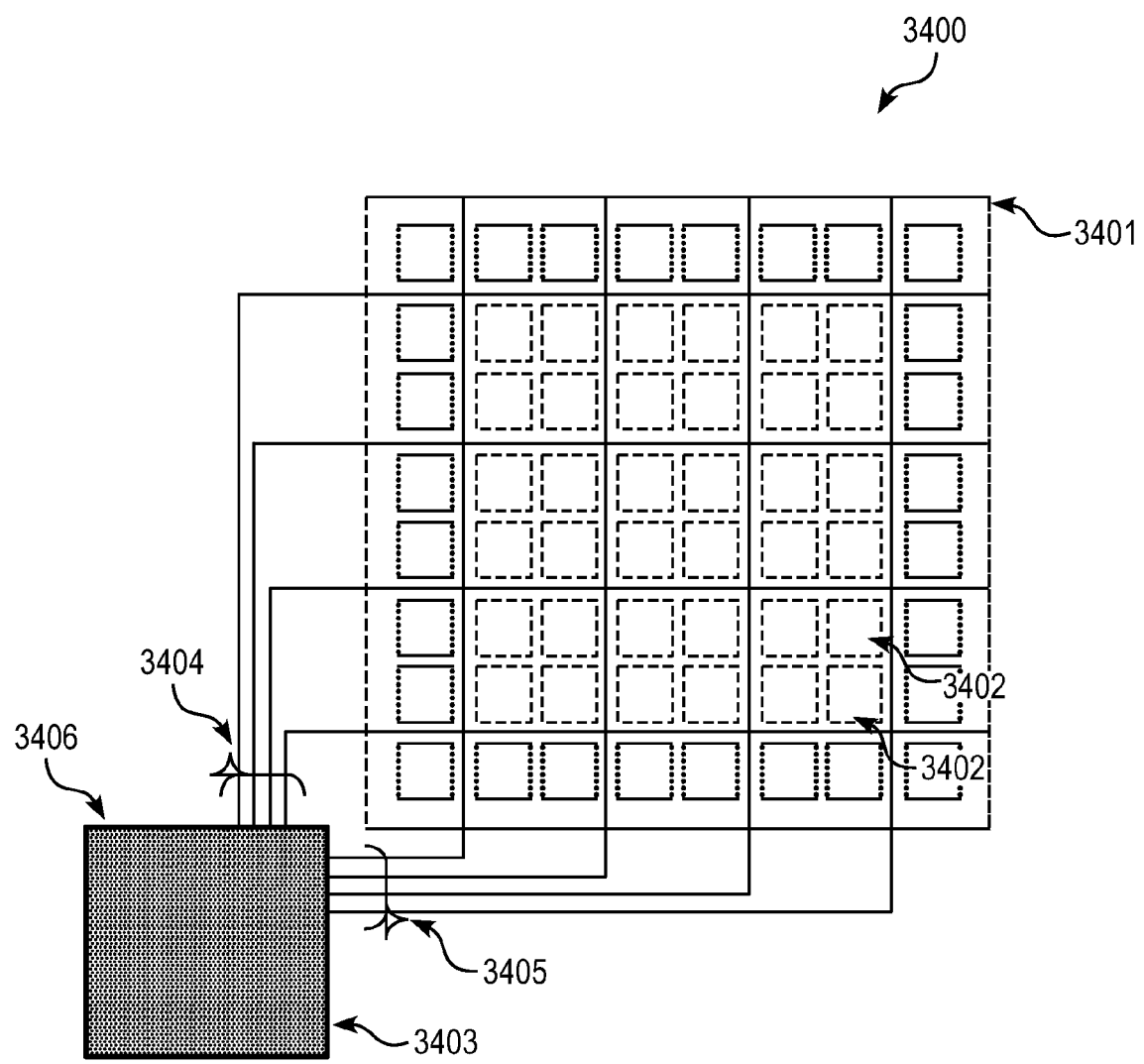
FIG. 34 is a top view of an embodiment of a control system in accordance with the present disclosure.

FIG. 34 is a top view of one embodiment of a control system 3400 for an array 3401 of distributed thrusters 3402 in accordance with the control system. As can be seen in FIG. 34, in the array 3401, a plurality of distributed thrusters 3402 are arranged in a grid-like manner in parallel horizontal rows and parallel vertical columns.

At least one power supply 3406 provides power to selected distributed thrusters 3402 using a first plurality of power lines 3404 and a second plurality of powers lines 3405 which are coupled to the distributed thrusters in each of the horizontal rows and in each of the vertical columns, respectively. When one of the power lines 3404 is selected along with one of the power lines 3405, an electrical circuit is completed and at least one of the distributed thrusters is activated by the methods the distributed thrusters convert energy into thrust. A control unit 3403 controls the activation and or power levels of the selected power lines 3404 and 3405 for the desired thruster or group of thrusters.

As used in the present control system, the power supply 3406 may be a battery and the control unit 3403 may be a central processing unit. Further, thruster 3402 may comprise a plurality of thruster devices.

A NMSET device may comprise an apparatus operable to propel a gas where the apparatus comprises at least a first layer and a second layer arranged in a stack and means for heating and/or cooling the first and second layers to form a hot layer and a cold layer wherein the cold layer has a lower temperature than the hot layer, and at least one through hole in the stack. A surface of each hot layer is exposed in an interior of the through hole, a surface of each cold layer is exposed in the interior of the through hole, and an entire length of the active area of the through hole is up to 10 times of a mean free path of a gas in which the apparatus is immersed and/or is not greater than 1500 nm, as explained above.

In a given NMSET device at least one through hole may have a straight geometry, a sawtooth geometry, a triangular geometry, a parabolic geometry, or any geometry that may be determined to be beneficial for the NMSET device, as explained above.

Figure 35:
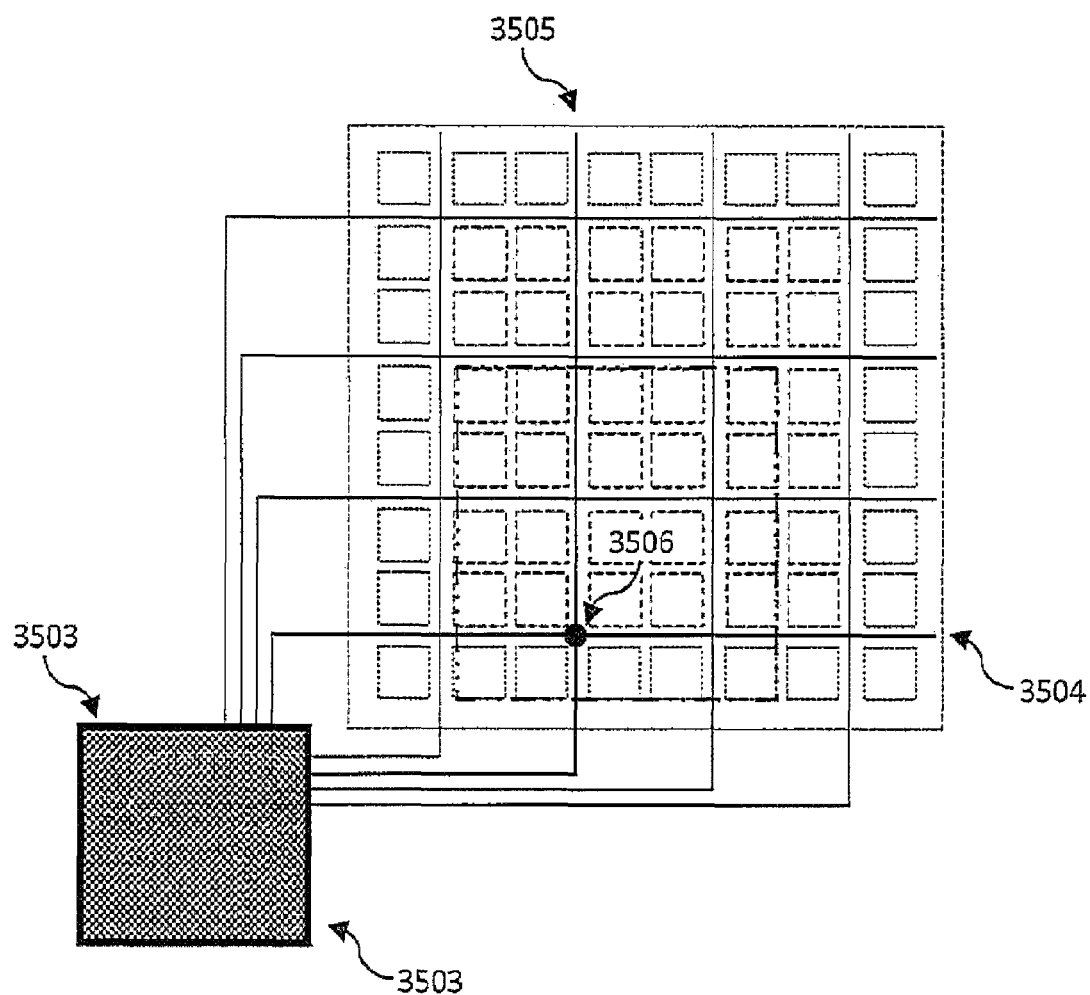
FIG. 35 is a top view of the control system illustrated in FIG. 34 showing the operation of supplying power to a set of connection paths.

FIG. 35 illustrates power lines 3504 and 3505 that meet at area 3506 to activate the distributed thruster's adjacent area 3506. The control unit 3503 activates the distributed thruster's adjacent area 3506 by causing the power supply 3506 to provide electricity to power lines 3504 and 3505.

Figure 36:
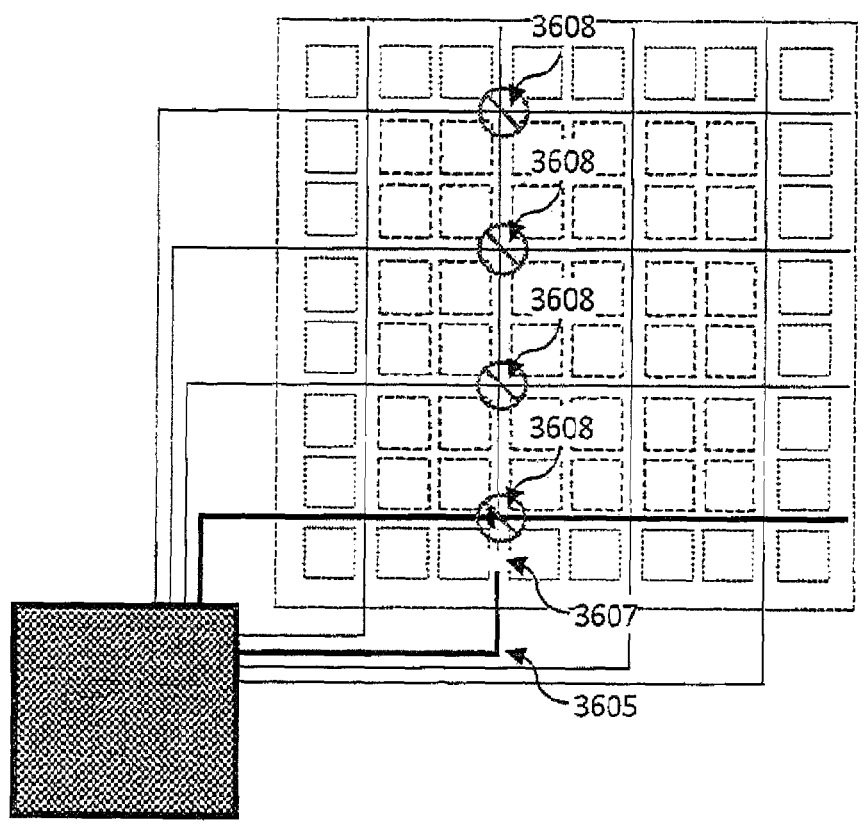
FIG. 36 is a top view of the control system illustrated in FIG. 34 showing the effects of a fault in one of the power lines.

FIG. 36 illustrates a fault condition where there is an open circuit in power line 3605. As shown in FIG. 36, power line 3605 is associated with a vertical column of thrusters that are associated with the area around points 3608. Because there is an open circuit 3607 in power line 3605, the thrusters associated with the area around points 3608 cannot be activated due to this fault condition.

Figure 37:
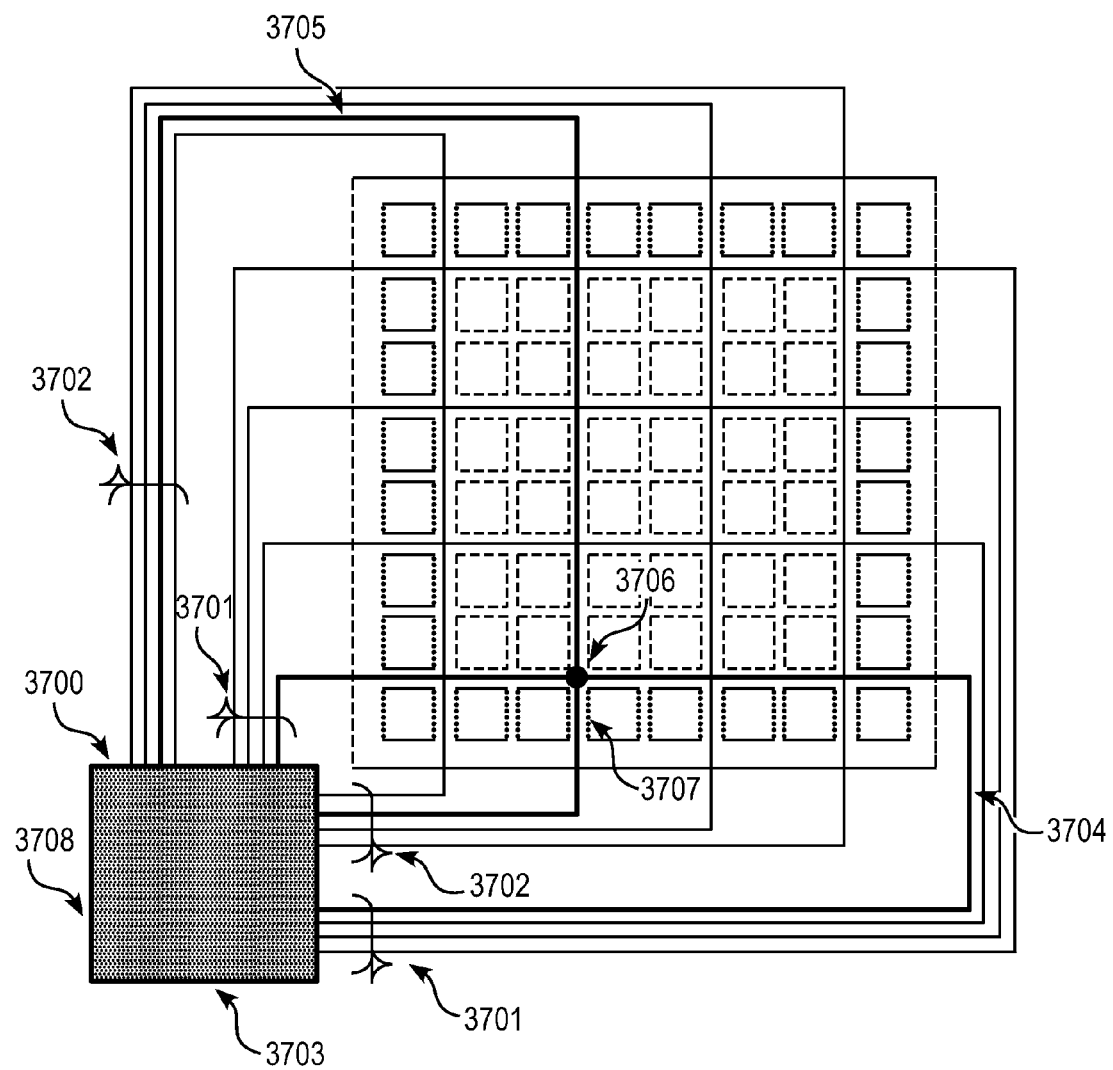
FIG. 37 is a top view of an embodiment of a control system in accordance with the present disclosure that includes fault tolerance features.

In one embodiment of the control system, in order to achieve redundancy and avoid system failure when a fault condition occurs in a power line, redundant path connections are provided as illustrated in FIG. 37. Power lines 3701 are coupled to the horizontal rows of thrusters and that power lines 3702 are coupled to the vertical columns of thrusters. Thus, a redundant path is provided to point 3706 in the event that a fault 3707 occurs in line 3705 as shown in FIG. 37. Redundancy is provided by power lines 3705 and 3704 wherein the control unit 3700 reroutes electricity from the first to the second connection point of power line 3707 or the power line is internally looped to activate the thrusters near point 3706. In another embodiment of the present control system, a fault detection device 3708 is provided to detect a fault condition in any one of the power lines as shown in FIG. 37. The fault detection device 3708 is coupled to the power supply 3703 and control unit 3700 and which controls activation of an appropriate power line to compensate for, reroute, report and or replace the power line in which the fault condition is present.

A capacitor bank voltage sensing technique may be used to detect a fault. By designing the capacitor bank to not discharge completely in a single pulse, and measuring the voltage charge before and after a power pulse has been sent to a thruster element or a group of thruster elements, it is possible to determine the power consumed by the thruster or group of thrusters and compare this to the expected power. If the drop is significantly smaller than expected, this is a sign of an open circuit; a significantly large drop indicates a short.

In-line current sensing may also be used to detect a fault. A shunt resistor may be placed in series with the power distribution lines in order to measure the instantaneous current being drawn by the array. If the current is usually low, some cells may be open. If the current is excessively high, there is a short. The primary disadvantage of this method is that it increases the series resistance between the power supply and the thrusters by a small (but nonzero) amount.

The significant advantage of this method over sensing the capacitor voltage after a pulse is that it is possible to design a system fast enough (most likely at a few MHz level sampling rate) to respond in real time to a short circuit and abort the pulse before enough energy has been released to cause serious damage to adjacent thrusters from arcing, or to the power supply from rapid discharge and consequently overheating. This system may also be applied to a distributed thrusters operated in the continuous-duty mode.

Once a portion of the distributed thrusters has been declared faulty by any of the above methods, or another method as recognized by one of ordinary skill in the art, corrective action must be taken to minimize loss of thrust and or prevent cascading failures.

When performing timing analysis of pulsed distributed thrusters during the design phase, it is prudent to allow more than the minimum required cool-down time between successive pulses to any section of thrusters. If this is done, the overall thrust may be maintained by removing the damaged thrusters or section of thrusters from the firing sequence and operating the remaining undamaged thrusters or sections at a slightly increased duty cycle.

An increase in duty cycle can only compensate for a maximum amount of damage to the system. If this threshold is exceeded, a reduction in available thrust is unavoidable; an array's control system can be designed to compensate for loss of thrust capacity on one side of a craft or other application using the distributed thruster by slightly reducing the thrust on the corresponding opposite panel to maintain a level trim.

Figure 38:
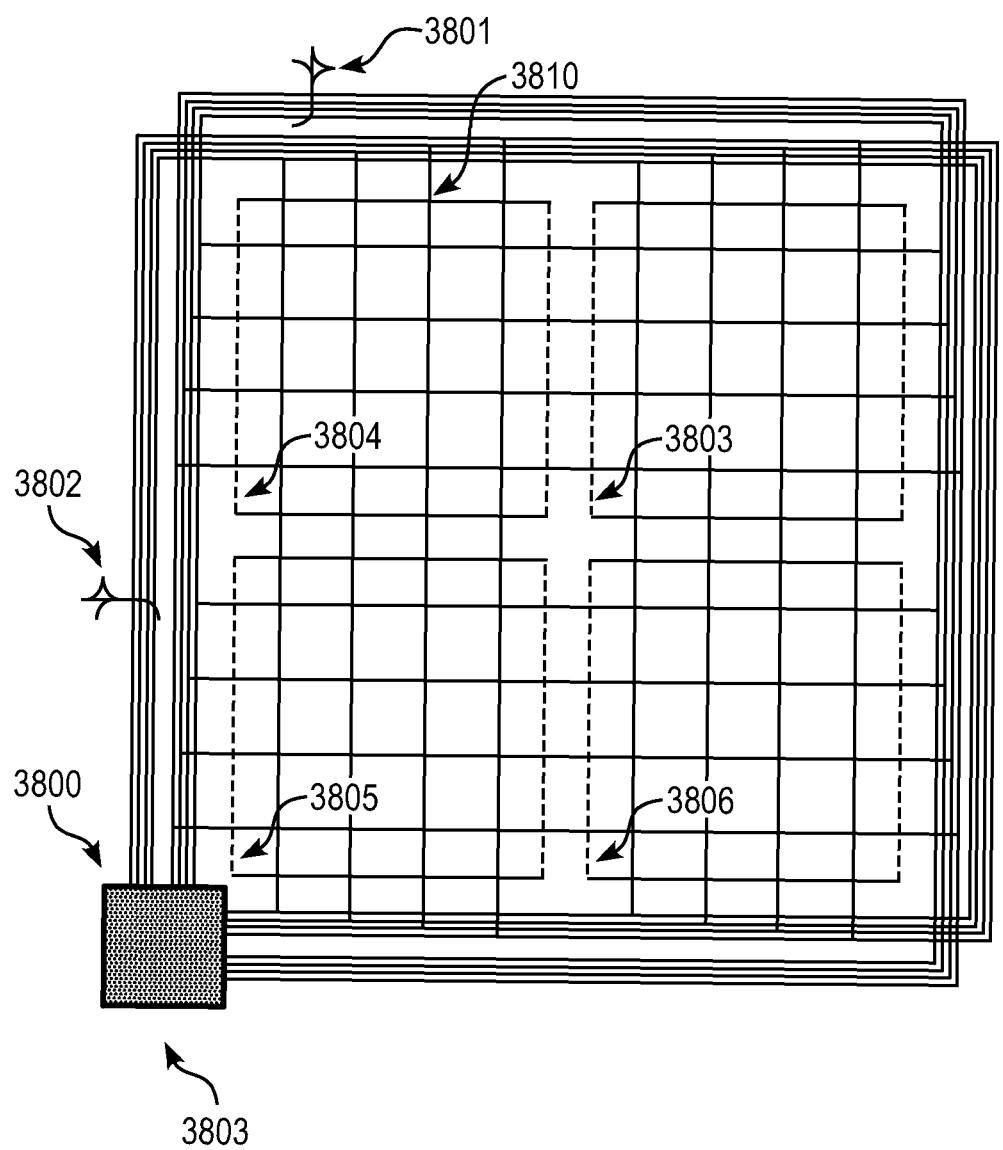
FIG. 38 is a top view of another embodiment of the control system, designed to control larger arrays of distributed thrusters, than the control system in FIG. 34.

FIG. 38 is a top view of another embodiment of an exemplary control system, particularly useful for larger distributed thrusters systems and/or applications that can use a less granular control. This embodiment may be advantageous due to the decrease in the number of power and/or control lines, and/or the decrease in the required computing power, than what would normally be required for more granular control. The exemplary control system is showing an array of power supply lines 3801 and 3802 and sub power line 3810 that are used to activate sections of a group of distributed thrusters 3803, 3804, 3805, and 3806 (shown in dotted line and which may further include a plurality of individual thrusters at the power line intersections). For example, the control unit 3800 may connect the power supply 3803 to an appropriate power line of power supply lines 3801 and an appropriate power line of power supply lines 3802 in order to cause electricity to flow in the corresponding sub power lines 3810 at and around the corresponding thruster or regions of thrusters in 3803, 3804, 3805, 3806. Additionally, the control unit 3800 can be designed to activate thrusters region 3803 and thrusters region 3805 or 3804 or 3806 simultaneously, sequentially, or in a desired pattern or for a desired effect by causing electricity to flow in the appropriate power lines of power supply lines 3801, 3802 and sub power lines 3810 and through the inclusion of an additional microprocessor at the intersections of sub power lines with the power lines, and using a digital signal to communicate with those microprocessors.

Figure 39:
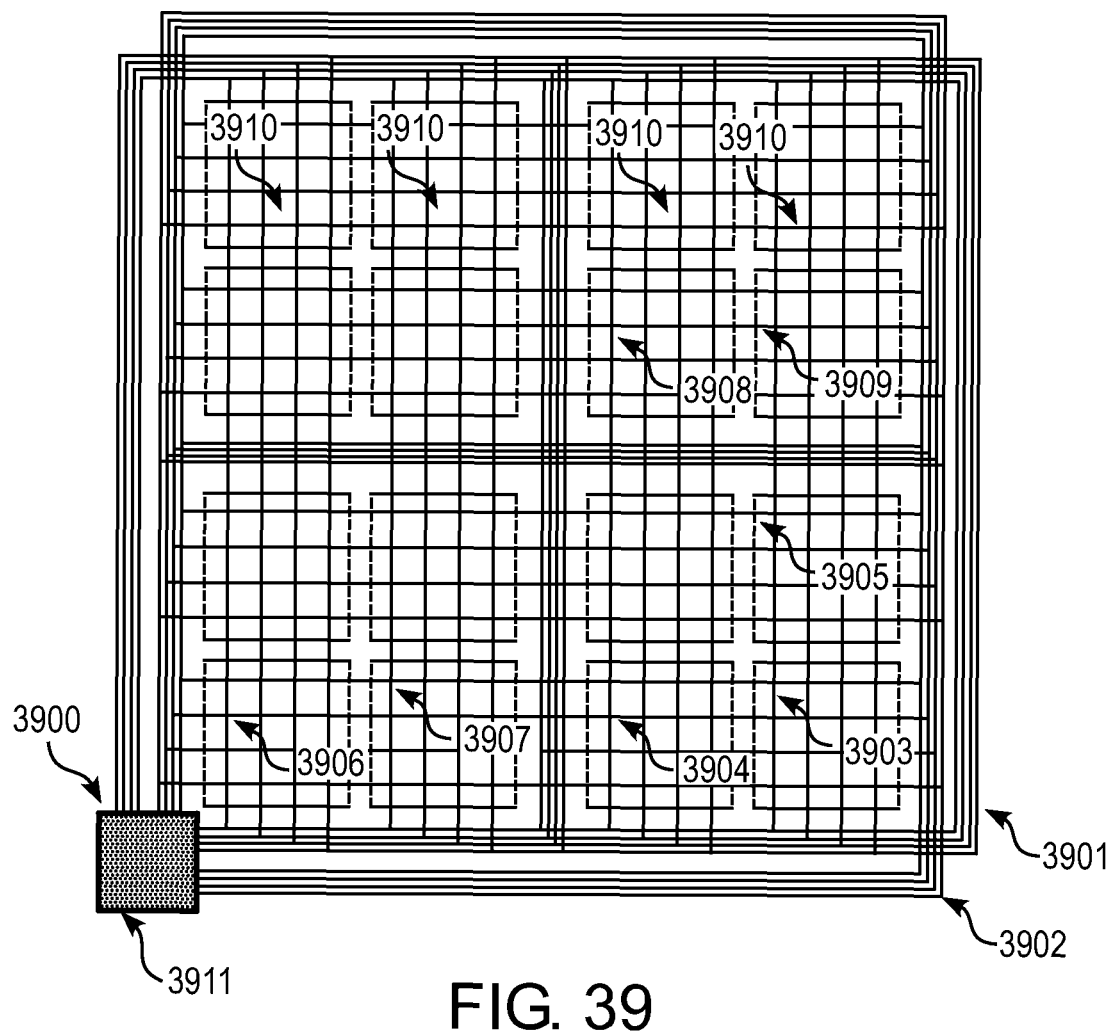
FIG. 39 is top view of another preferred embodiment of the control system, designed to control larger arrays of distributed thrusters than the control system in FIG. 38.

FIG. 39 is a top view of a further embodiment similar to that shown in FIG. 38 of an exemplary control system. FIG. 39 illustrates a plurality of power supply lines 3901 and 3902 and a plurality of sub-power supply lines 3910 that form a grid structure as shown. The control unit 3900 may connect the power supply 3911 to an appropriate power line of power supply lines 3901 and an appropriate power line of power supply lines 3902 in order to cause electricity to flow in the sub-power lines 3910 at and around the corresponding thruster or regions of thrusters 3903. Furthermore, as discussed with FIG. 38, the control unit 3900 may activate any of distributed thrusters 3903, 3904, 3905, 3906, 3907, 3908, and 3909 in a group or individually.

Figure 40A:
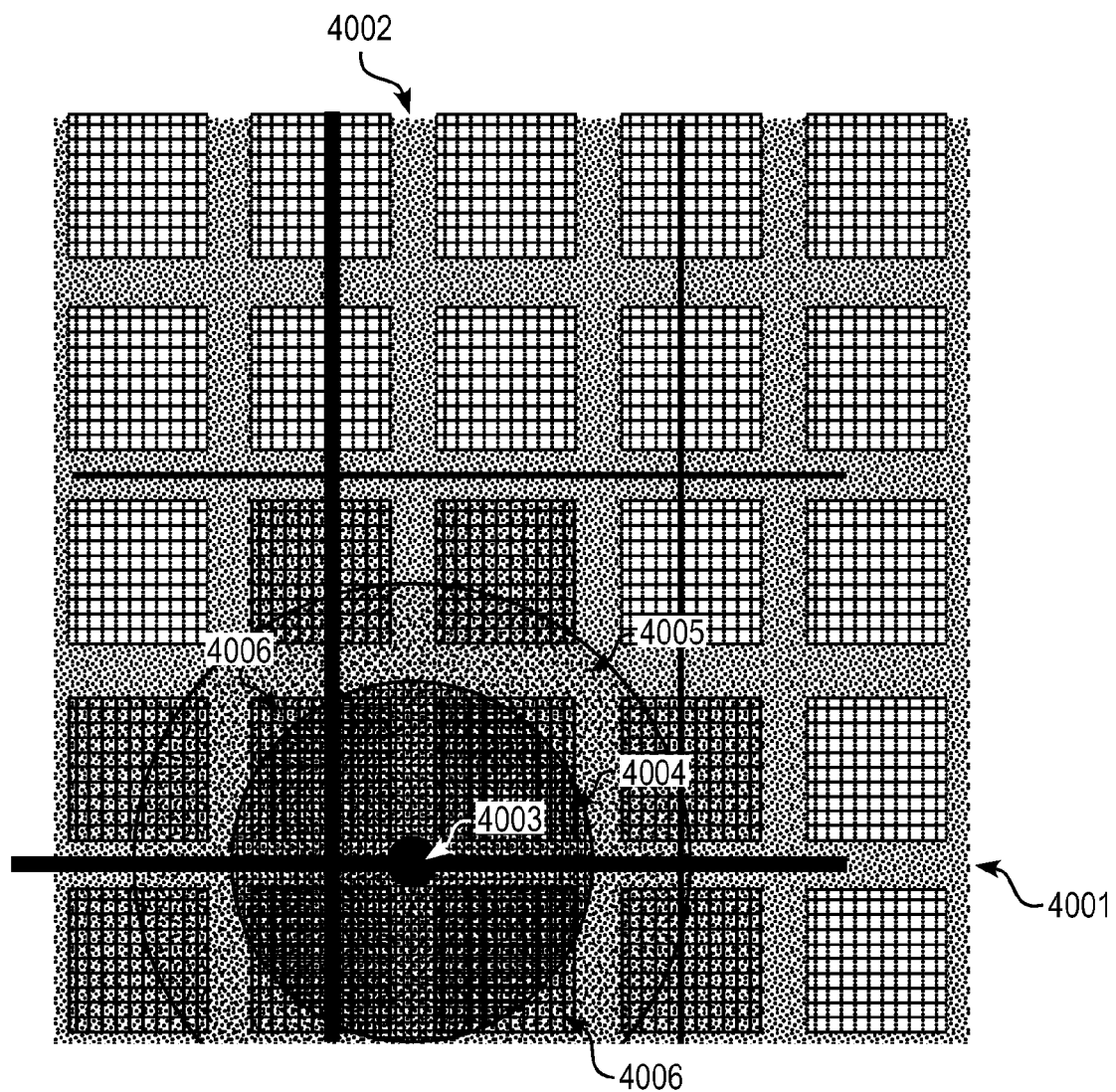
FIG. 40a is a top view of another embodiment of the present disclosure, showing primary and secondary affected areas when the control system activates the target area.
Figure 40B:
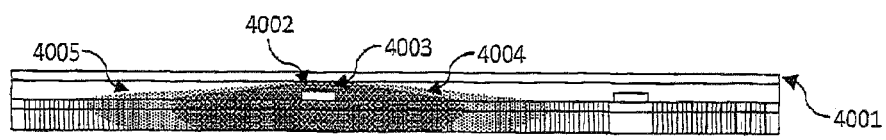
FIG. 40b is a cross sectional view of the embodiment shown in FIG. 40a, with intersecting power lines located on the heated side of the device
Figure 40C:
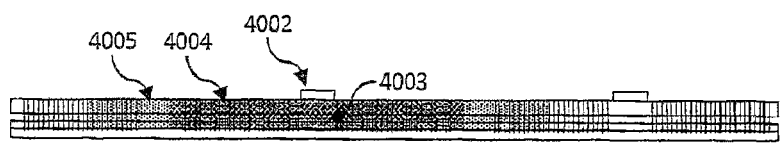
FIG. 40c is another cross sectional view of the embodiment shown in FIG. 40a, with intersecting power lines on each side of the device.

FIGS. 40*a*, 40*b* and 40*c* shows an enlarged illustration of the embodiment of the control system shown in FIG. 34. Power lines 4001 and 4002 are used to address the thruster regions that operate on temperature gradients 4006 around addressed point 4003. When the thrusters around point 4003 are addressed due to the flow of electrical current through power lines 4001 and 4002, point 4003 heats up with area 4004 being the primary area affected and area 4005 being the secondary area affected.

Figure 41A:
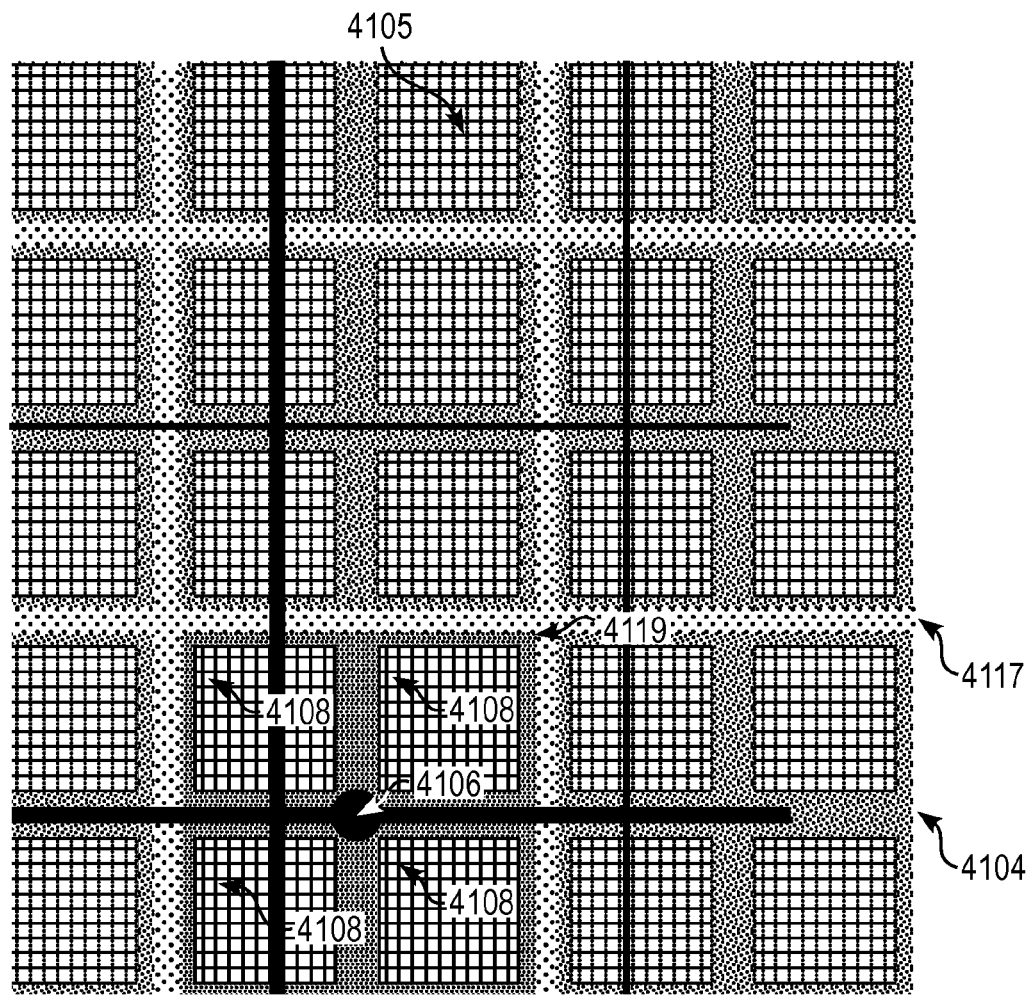
FIG. 41a is a top view of another embodiment of the present disclosure with an electrical and or thermal insulator.
Figure 41B:
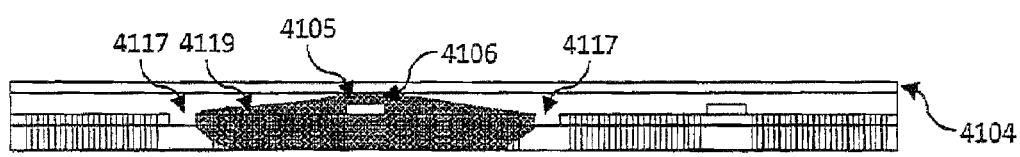
FIG. 41b is a cross sectional view of the embodiment shown in FIG. 41a, with intersecting power lines located on the heated side of the device.

Because it may be undesirable for the heating of one point to cause heating of adjacent points, another exemplary embodiment is illustrated in FIGS. 41*a* and 41*b*, which shows the inclusion of a heat barrier 4117, which may be in the form of a conductive pad, an insulator, a gap, or any other form of heat barrier as recognized by one of ordinary skill in the art. The heat barrier 4117 has the effect of changing the heat conductivity and isolating the conductive areas. The heat barrier 4117 is shown as a perimeter around the thruster regions 4108 that are adjacent a junction 4106 of power lines 4105 and 4104, however the heat barrier 4117 may be configured differently based on a different desired effect. By energizing power lines 4105 and 4104 the thruster regions 4108 adjacent junction 4106 are activated and the heat barrier 4117 prevents other thruster regions outside of the shaded box area shown as 4119 from being inadvertently activated.

Figure 42A:
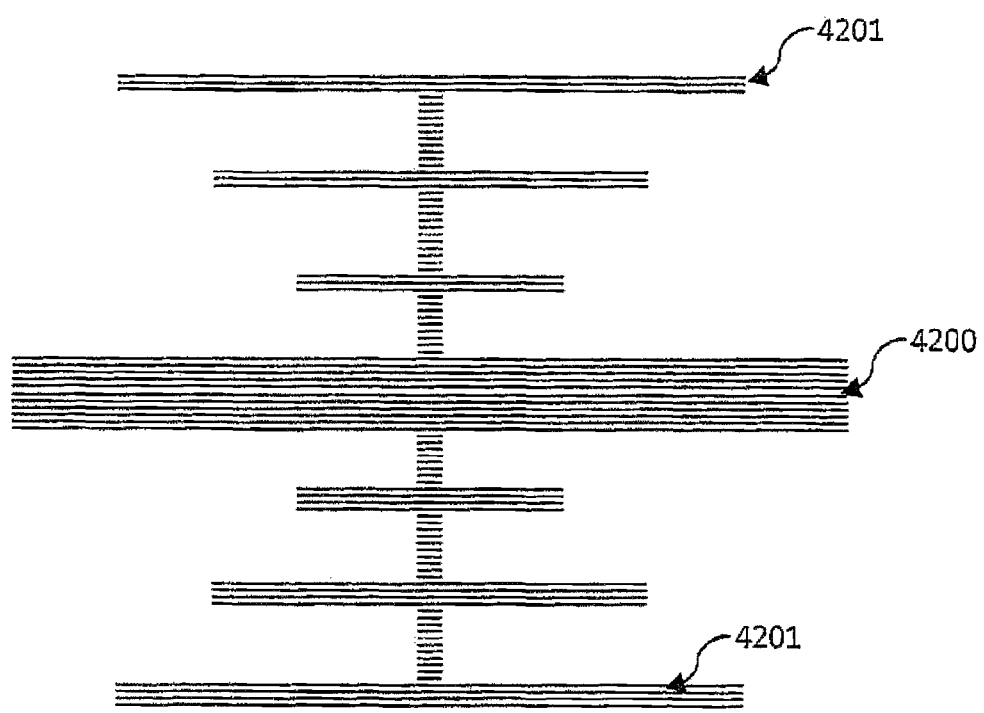
FIG. 42a is a top view of a grid structure for an array of distributed thrusters which includes a power supply line and a plurality of branch lines at the power line intersection point, to be used with the control system.
Figure 42B:
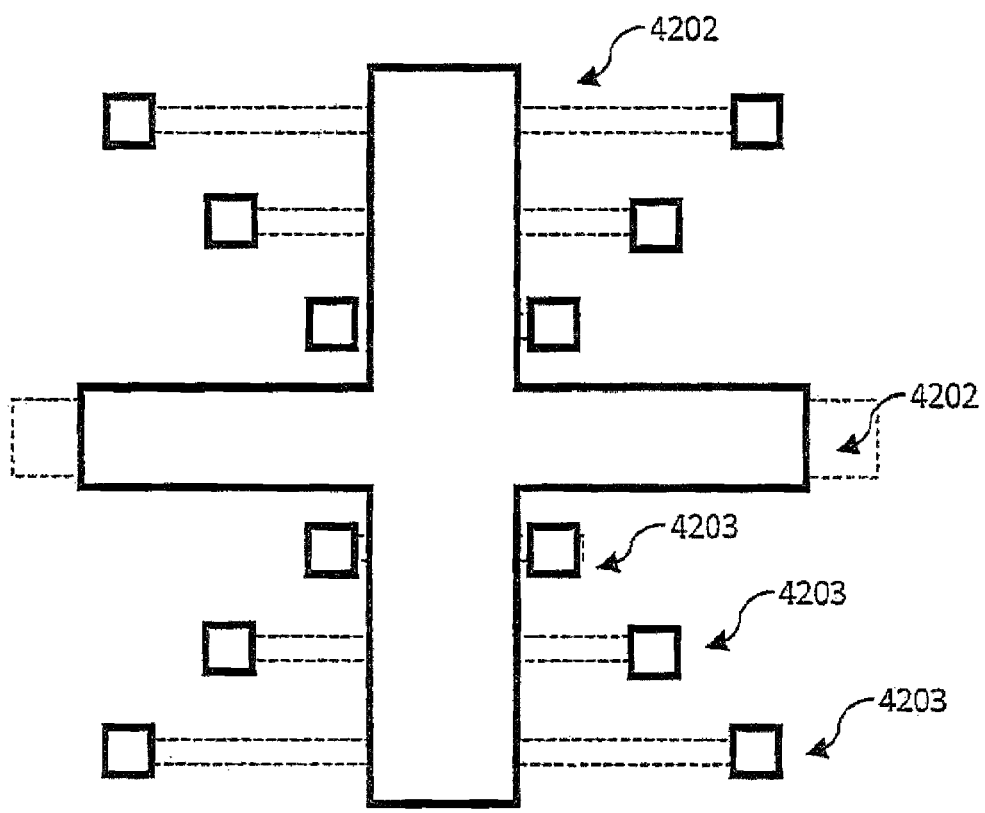
Figure 42C:
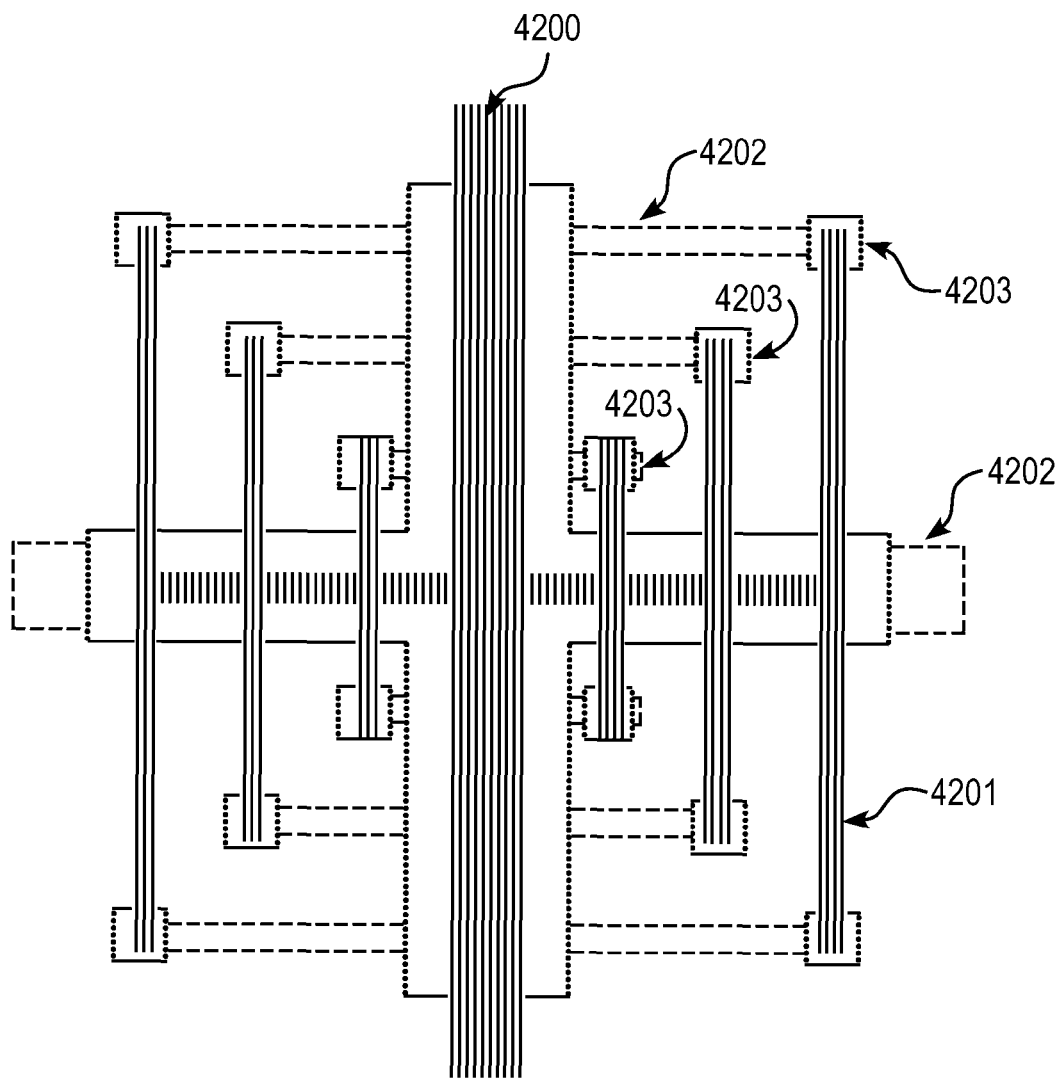
FIG. 42c is a top view a grid structure of a power supply line and a plurality of branch lines that is placed on top of FIG. 42b and creates a plurality of target points from a single power line intersection point to be used with the control system.

FIGS. 42*a*, 42*b* and 42*c* show the power lines or conductive structures of another embodiment of the control system. FIG. 42*a* shows a top layer grid structure 4202 of conductive lines to be used for activating thruster regions, where power supply line 4200 is designed to be connected to a power supply and a plurality of branch lines 4201 are designed to be positioned in proximity to a plurality of thruster regions.

FIG. 42*b* illustrates an optimized middle layer showing insulators 4202 and resistors, temperature gradient generating device or other means of activating thruster regions 4203 to be used in between the grid structure shown in FIG. 42a and further grid structure that will intersect the branch lines 4201 in FIG. 42a at the thruster regions 4203.

FIG. 42c illustrates the combination of FIGS. 42a and 42b, where the top layer of FIG. 42a is placed over the middle layer of FIG. 42b. FIG. 42c shows power supply line 4200 and branch lines 4201 overlaid onto the thermoresistive heating junctions formed by resistors 4203 or temperature gradient generating device or other means of activating thruster regions and insulators 4202 as in an embodiment of the control system, to control a plurality of target points from a single power line intersection point.

Exemplary Resistive Temperature Gradient Formation

Figure 43:
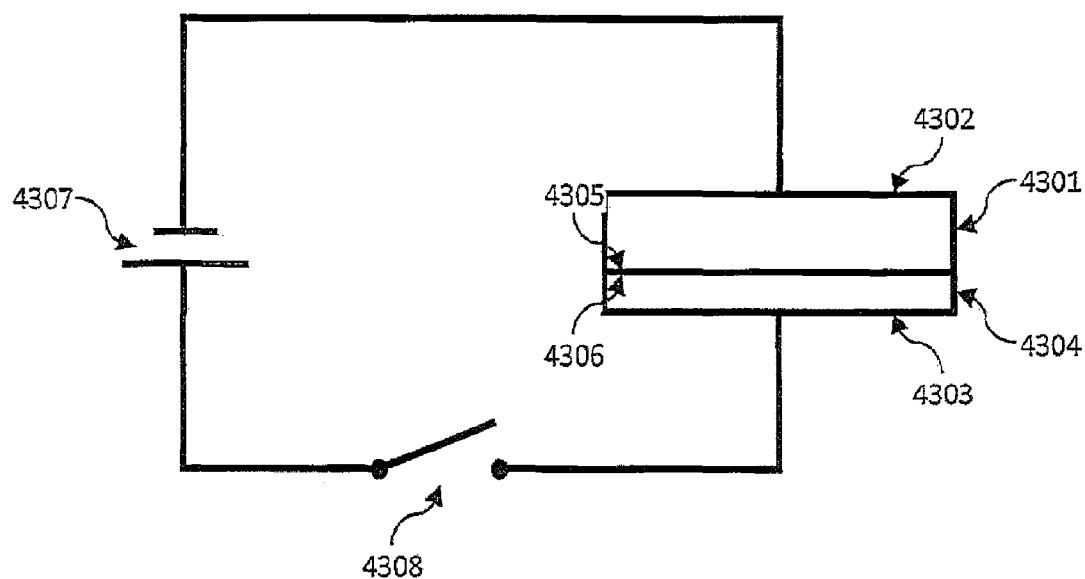
FIGS. 43 and 44 are schematic diagrams for creating a temperature gradient.

Reference is made to the section entitled "Principles of Operation" and subsection "Temperature Differential", above, incorporated here by reference. FIG. 43 is schematic diagram of a device that can be used to create a temperature gradient in accordance with the present disclosure. In this section, the heat pump or thermal gradient device may be, but is not limited to driving a NMSET device. The device includes a colder layer 4301 of an electrically conductive material having a top surface 4302 and a bottom surface 4305. A top surface 4306 of a hotter layer 4304 is closely proximate to and may be attached to bottom surface 4305 of colder layer 4301 directly or through a thermally and/or electrically insulating intermediate material depending on implementation.

One terminal of power supply 4307 is connected to top surface 4302 of the colder layer 4301 and the other terminal of power supply 4307 is connected to one side of switch 4308. The other side of switch 4308 is connected to bottom surface 4303 of the hotter layer 4304. The hotter layer 4304 is made of or is a structure with sub-layers that include a layer of a resistive material that heats up through resistive or Joule heating when electrical current passes through it. In embodiments with sub-layers, one might be an insulating material with reduced thickness near the locations a thermal gradient is to be produced, and a metallization layer that is configured to heat at a greater rate at the thermal gradient locations.

The colder layer 4301 might be of a material less subject to Joule heating in the operative locations. The difference in resistive, Joule heating characteristics can be accomplished through selection of materials, configuration (e.g., the hotter layer being thinner at the sites where heat is to be generated when compared to an opposing location of the colder layer so that the electron density in the hotter layer promotes Joule heating at a greater extent that the colder layer) or other factors that permit one layer to heat up to a greater extent or faster than an adjacent layer, or combinations thereof of these characteristics, depending on a particular embodiment. For instance, the hotter layer can be made up of surface wires that thin or become more narrow or otherwise have smaller in cross-section at sites where heating is desired, e.g., at a NMSET structure or groups of NMSET structures, such that the charge carrier density/resistance is greater at those sites, and Joule heating is more apparent. The colder layer can be a thicker, less resistive material having a broader area (e.g., cover the entire surface of the hotter layer) to reduce carrier density. Whatever the mechanism, the current in one layer promotes Joule heating, and in the other layer does not, at least not to the same extent of Joule heating in the one layer.

Further, the mechanism for passing current from one layer to the other can follow any suitable method or mechanism, such as quantum tunneling, semiconductor conduction were the colder and hotter layers are P-type and N-type semiconductors forming a PN junction, with electrode formed thereon on opposing surfaces, transistors connected to address line, similar to the read/write and address lines of memory devices, that permit an adjacent electrode to heat on one surface, with the switch being much like the structure of an addressable memory site or pixel, but with the memory site or pixel structure being replaced with an electrode that thermally heats, or nearly any other type of structure that will selectively address thermal gradient devices or clusters of such devices.

Alternatively or additionally, the hotter layer can have an input side and an output side in the same layer, wherein current passes through from one side to the other, resistively heating the hotter layer. This embodiment can produce heat at selected sites, and less so elsewhere, when the hotter surface is not entirely covered by an electrically conductive material, but rather has conductive lines, wherein the lines have characteristics that permit heating at selected sites, such as NMSET structures of groupings. That is, the lines can be large enough is cross-section to not heat, but at selected sites have a reduced cross-section to selectively heat upon application of current.

In the embodiment of FIG. 43, electrical current passes from the top layer 4301 to the bottom layer 4304. As shown in FIG. 43, switch 4308 is in an open condition. Thus, no current flows through layers 4301 and 4304. Accordingly, there is no temperature gradient or difference in temperature between surface 4302 and surface 4303.

Figure 44:
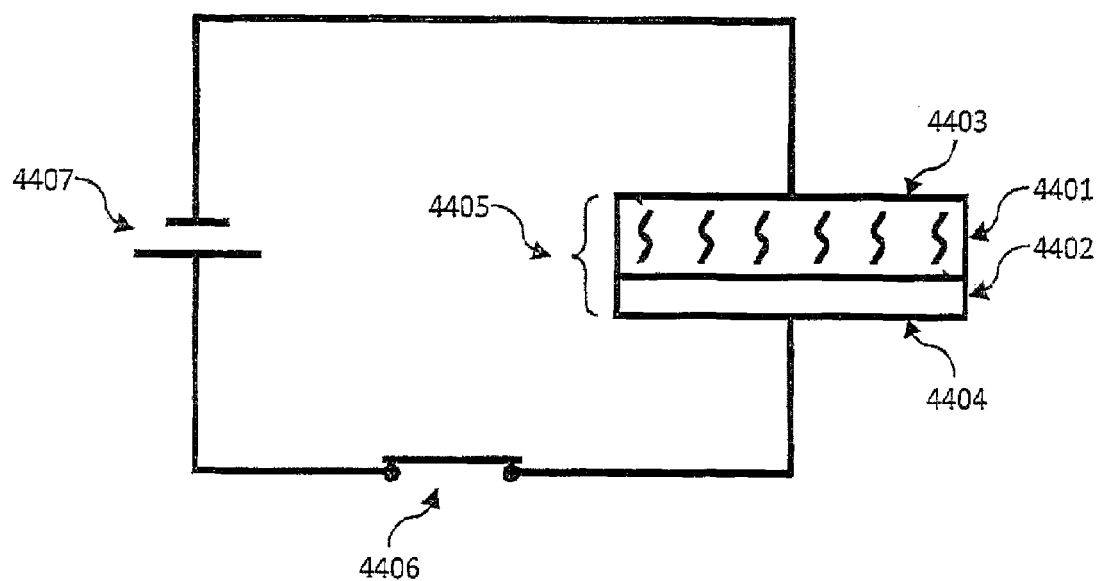

FIG. 44 showing the state where switch 4406 is closed. Thus, current from power supply 4407 flows through layers 4401 and 4402. As result of the current flow, layer 4402 begins to heat because of its resistive characteristics, thus causing layer 4401 to heat as well. The heating of layer 4402 causes a temperature gradient 4405 to be created between top layer 4403 and bottom layer 4404. When switch 4406 is opened, current no longer flows through layers 4401 and 4402. Thus, temperature gradient 4405 begins to diminish eventually to zero difference in temperature between surfaces 4403 and 4404.

Figure 45:
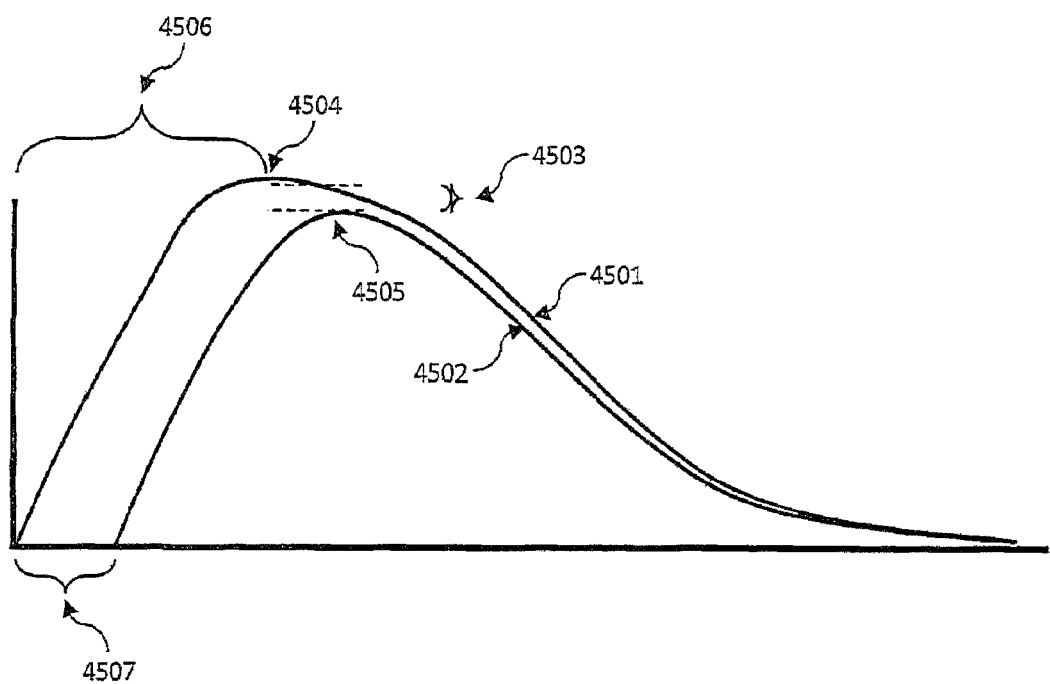
FIG. 45 is a plot showing a useful rise and fall in temperature in a device having a temperature gradient.

FIG. 45 plots of the temperature increase of surface 4404 as current begins to flow when switch 4406 is closed. Temperature is plotted along the y-axis and time is plotted along the x-axis. Note that the temperature of surface 4404 in FIG. 45 rapidly rises as indicated by plot 4501 to an equilibrium temperature 4504. The switch 4406 in FIG. 44 is then opened and current no longer flows, the temperature will begin to drop.

The temperature of surface 4403 when switch 4406 is closed follows a similar but delayed pattern 4507 as the heat from layer 4402 begins to migrate toward surface 4403 through layer 4401 as indicated by plot 4502. The temperature of surface 4403 continues to rise even slightly after the switch 4406 in FIG. 44 has been opened, to its equilibrium temperature 4505. Reference number 4506 in FIG. 45 indicates the length of time that switch 4406 remained closed. If the length of time 4506 the switch 4406 remains closed exceeds the time it takes to reach equilibrium temperature 4504, than the temperature of surface 4403 will continue to rise, until the temperature gradient 4503 vanishes.

Thus, the temperature gradient between temperature 4504 of surface 4404 and the temperature 4505 of surface 4403 at a given time is represented in FIG. 45 as temperature gradient 4503.

As FIG. 45 illustrates, it takes a finite amount of time for the temperatures of surfaces 4403 and 4404 to return to their ambient state after current stops flowing through layers 4301 and 4304. The residual heat can cause problems if adjacent temperature gradient devices are in close proximity.

Figure 46:
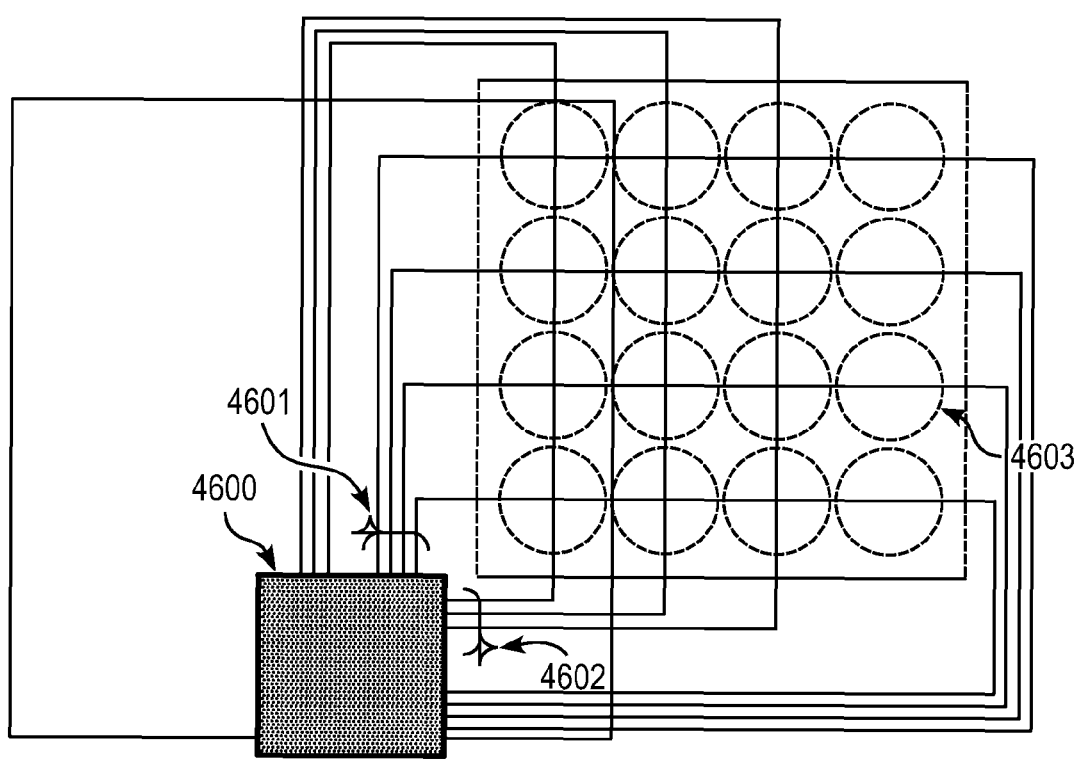
FIG. 46 is a top cross-sectional view of a plurality of thruster regions arranged in horizontal and vertical rows in accordance with the present disclosure.
Figure 47:
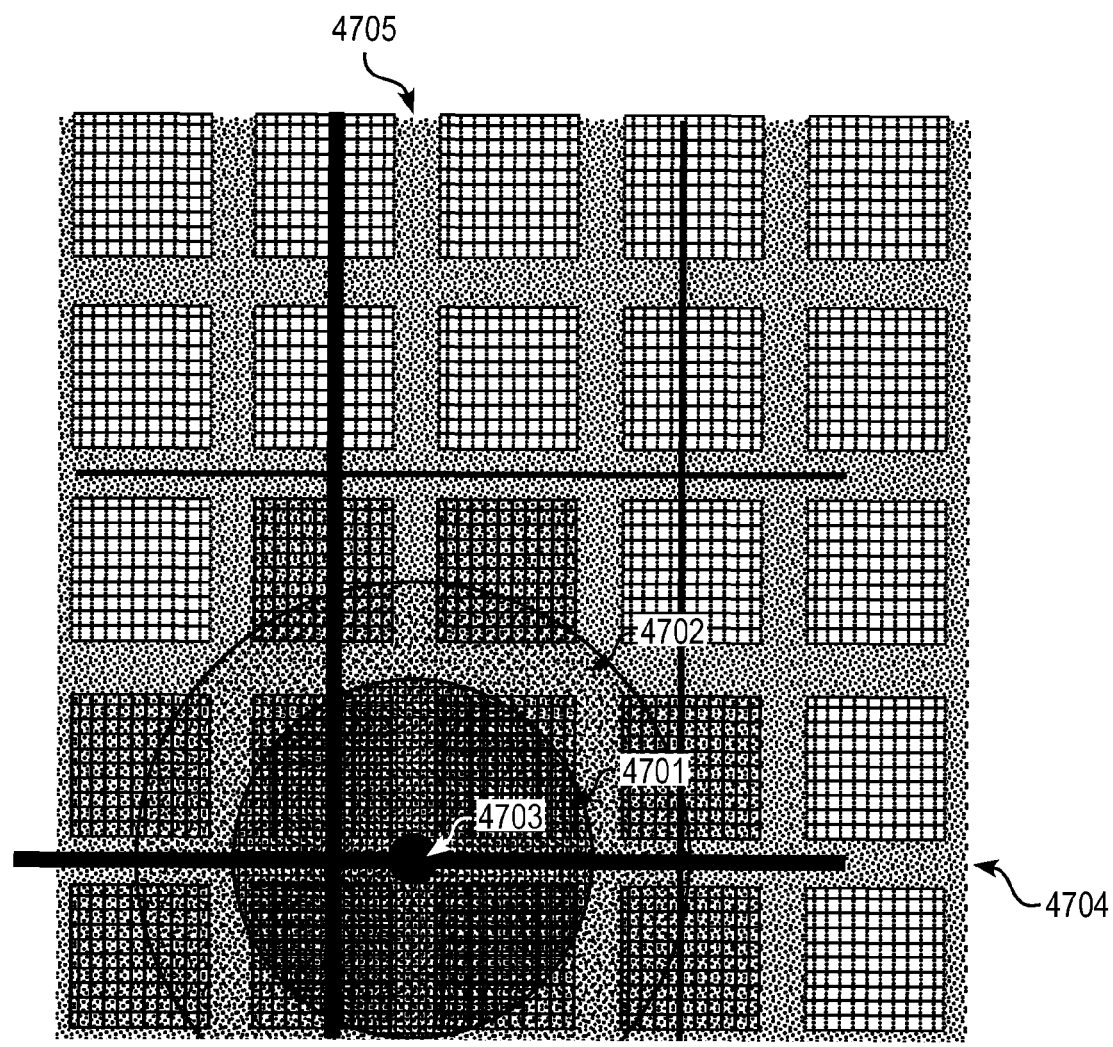
FIG. 47 is a top cross-sectional view of a plurality thruster regions showing the heating effect of adjacent regions when a thruster region is activated.

FIG. 46 is a top cross-sectional view of a plurality of distributed thruster devices such as one operated by temperature gradient devices 4603 arranged in horizontal and vertical rows in accordance with another exemplary embodiment. Current flow is supplied to each device by a plurality of power lines 4601 and 4602 from a power and control unit 4300 in a matrix type manner. The control unit may be formed of a processor, particularly a programmable processor that can selectively actuate particular sites, as explained above with respect to control electronics at the active sites when the power lines operate like read/write and address lines to control adjacent control electronics at the active site, or simply by adding current to horizontal and vertical power lines such that at cross points enough current is present to create a temperature gradient. A source of electrical energy may be formed of a battery, or any other source of carriers, whether AC or DC, depending on implementation. Also, the section entitled "Fault Tolerant Control System", above, is incorporated herein With reference again to FIG. 46, if an adjacent temperature gradient device 4603 is activated before the first temperature gradient device 4603 is allowed to fully cool, the temperature gradient of the newly activated device may not be the expected gradient. Depending on the application, this may not be optimal. Such a condition is illustrated in FIG. 47 (and similarly in FIGS. 40a, 40b and 40c, for instance) where a temperature gradient device 4703 is activated by power lines 4704 and 4705. As shown in FIG. 47, the generated heat radiates to a primary area 4701 and further to a secondary area 4702. Note that the radiated area encroaches upon other adjacent temperature gradient devices and could cause those devices not to produce the proper temperature gradient when they are activated. This potential problem can be mitigated or resolved by the selective activation of thermal gradient devices.

For example, the control unit 4600 shown in FIG. 46 avoids activation of those temperature gradient devices that are adjacent previously activated temperature gradient devices for a predetermined period of time. Doing so allows the previously activated temperature gradient device to fully cool, or at least cool to a satisfactory temperature, so that no residual heat interferes with the operation of adjacent temperature gradient devices. Further, the temperature gradient devices can be selectively addressed, either individually or in clusters, by read and address lines in a manner similar to the manner in which pixels on a digital display or memory sites in a memory array are addressed and controlled.

Figure 48:
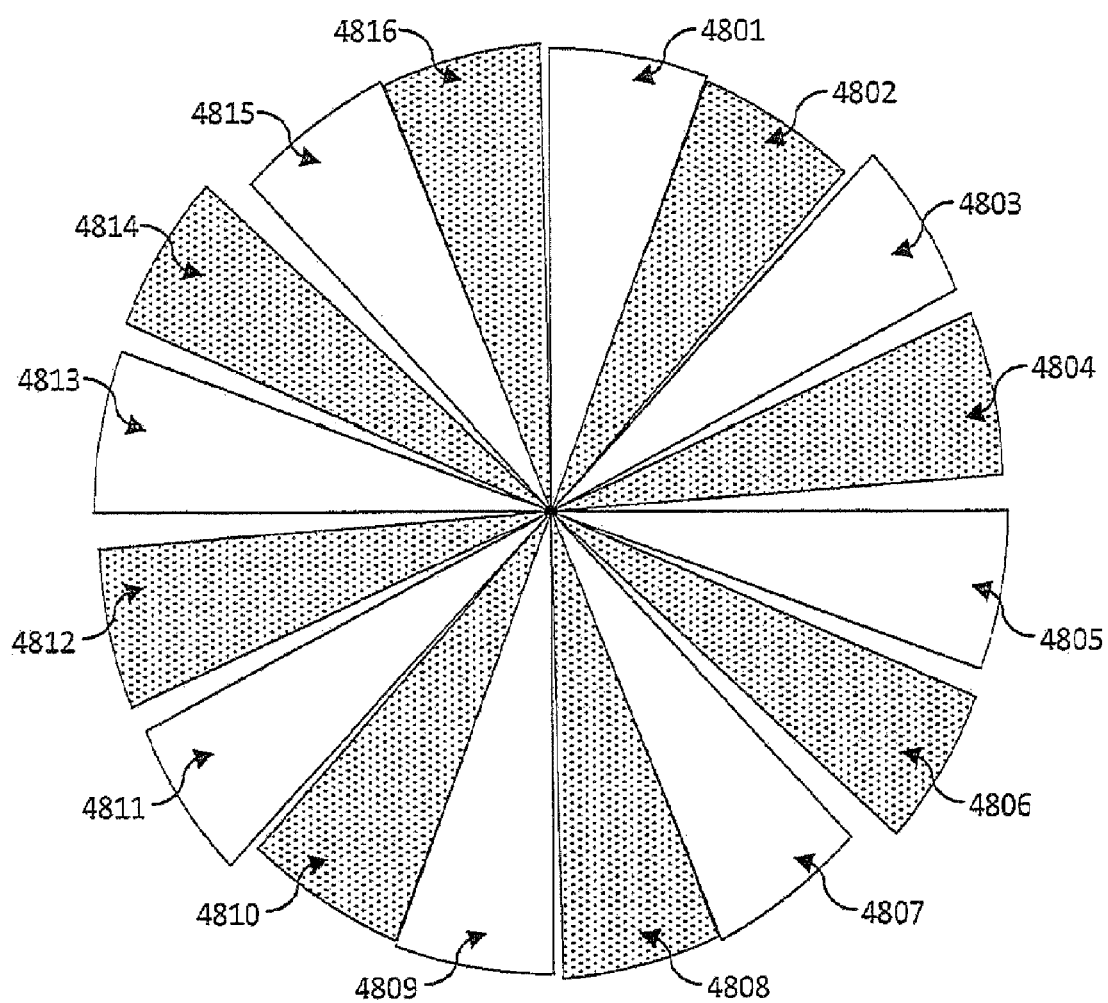
FIG. 48 illustrates an activation sequence for temperature gradient devices among a plurality of temperature gradient devices in accordance with the present disclosure.

FIG. 48 illustrates one embodiment of an activation sequence of temperature gradient devices in an array of temperature gradient devices in accordance with this embodiment. Reference number 4801 represents a temperature gradient device in an array of such devices as illustrated in FIG. 46. Reference number 4802 represents an adjacent temperature gradient device, or an adjacent array of such devices. The pattern repeats as indicated by reference numbers 4803-4816 for a total of 16 temperature gradient devices, or arrays of such devices as illustrated, though of course in most embodiments involving NMSET devices there would be more.

Using FIG. 48, one of ordinary skill in the art will readily understand that an activation sequence for individual or sets of temperature gradient devices can be determined which avoids or mitigates thermal interference from a previously activated adjacent device. This is so because enough time has elapsed for the previously activated adjacent device to sufficiently cool. For example, temperature gradient device pairs (4801, 4809), (4803, 4811), (4805, 4813) and (4807, 4815) may be activated followed by pairs (4802, 4810), (4804, 4812), (4806, 4814) and (4808, 4816) without significant causing thermal interference to any previously activated adjacent devices. Other activation sequences will become known to those skilled in the art from a review of FIG. 48.

As can be seen, the disclosed embodiments can have many applications for creating and maintaining thermal gradients. In particular, though not limited thereto, the thermal gradient structures can be in heat pumps to drive distributed thrusters, and even more particularly distributed thrusters driven by NMSET of many forms and variations disclosed elsewhere herein.

While the foregoing specification teaches the principles of the present invention, with examples provided for the purpose of illustration only, it will be appreciated by one skilled in the art from reading this disclosure that various changes and modifications in form and detail can be made, and equivalents employed, without departing from scope of the appended claims, which are to be given their full breadth.

What is claimed is:

1. A thermal transpiration device comprising:
   at least one of a heating means and a cooling means;
   a first membrane having a first predetermined thickness and being heated or cooled, by the at least one of the heating means and the cooling means, to a first temperature, a first portion of the first membrane having a first reduced thickness that is less than said first predetermined thickness;
   a second membrane having a second predetermined thickness and being heated or cooled, by the at least one of the heating means and the cooling means, to a second temperature, different from said first temperature of the first membrane, a second portion of the second membrane having a second reduced thickness that is less than said second predetermined thickness, wherein the second portion of the second membrane is opposed to the first portion of the first membrane; and
   a thermal insulator disposed between said first membrane and said second membrane, said thermal insulator extending from a first end of the first and second membranes to a second end of the first and second membranes,
   wherein the combined thickness of the first reduced thickness, the second reduced thickness and the thermal insulator is less than a predetermined total thickness, and
   wherein at least one aperture is defined through the first membrane, the second membrane and the thermal insulator, a center axis of said defined aperture being perpendicular to a center axis of said thermal insulator disposed between said first membrane and said second membrane.

2. The thermal transpiration device of claim 1, wherein the predetermined total thickness is less than 500 nm.

3. The thermal transpiration device of claim 1, wherein the predetermined total thickness is less than 100 nm.

4. The thermal transpiration device of claim 1, wherein the first membrane comprises nickel.

5. The thermal transpiration device of claim 1, wherein the second membrane comprises aluminum.

6. The thermal transpiration device of claim 1, wherein the thermal transpiration device comprises a Nano Molecular Solid-state Electrodynamic Thruster (NMSet) device.

7. A method of making a thermal transpiration device, said method comprising the steps of:
- providing a first membrane having a first predetermined thickness;
- forming a first portion of the first membrane with a first reduced thickness that is less than the first predetermined thickness, wherein the first membrane is configured to be heated or cooled, by at least one of a heating means or a cooling means, to a first temperature;
- providing a second membrane having a second predetermined thickness, wherein the second membrane is configured to be heated or cooled, by the at least one of the heating mea ns and the cooling means, to a second temperature different from the first temperature of the first membrane;
- forming a second portion of the second membrane with a second reduced thickness that is less than the second predetermined thickness;
- positioning the second portion of the second membrane opposed to the first portion of the first membrane;
- providing a thermal insulator between the first membrane and the second membrane, said thermal insulator extending from a first end of the first and second membranes to a second end of the first and second membranes;
- defining at least one aperture through the first membrane, the second membrane, and the thermal insulator such that a center axis of said aperture is perpendicular to a center axis of said thermal insulator provided between the first membrane and the second membrane; and
- limiting the combined thickness of the first reduced thickness, the second reduced thickness and the thermal insulator to less than a predetermined total thickness.

8. The method of claim 7, wherein the predetermined total thickness is less than 500 nm.

9. The method of claim 7, wherein the predetermined total thickness is less than 100 nm.

10. The method of claim 7, wherein the first membrane comprises nickel.

11. The method of claim 7, wherein the second membrane comprises aluminum.

12. A thermal transpiration device comprising:
- at least one of a heating means and a cooling means;
- a first membrane having a first thickness and being heated or cooled, by the at least one of the heating means and the cooling means, to a first temperature;
- a second membrane having a second thickness and being heated or cooled, by the at least one of the heating means and the cooling means, to a second temperature different from said first temperature of said first membrane; and
- a thermal insulator provided between the first and second membranes, the thermal insulator having a third thickness,
- wherein a total thickness of the thermal transpiration device is defined by the first, second and third thicknesses,
- wherein the first membrane, second membrane and thermal insulator are arranged in a stack and define at least one aperture extending through the stack, and
- wherein at least one of the first and second membranes include angled walls forming the at least one aperture and
- wherein an active region, where thermal transpiration occurs, (i) is defined by a region of said thermal transpiration device where the first membrane and the second membrane are in contact with said thermal insulator, and (ii) has a thickness less than the total thickness.

13. The thermal transpiration device of claim 12, wherein the total thickness is less than 500 nm.

14. The thermal transpiration device of claim 12, wherein the third thickness is less than 100 nm.

15. The thermal transpiration device of claim 12, wherein the total thickness is less than 100 nm.

16. The thermal transpiration device of claim 12, wherein the first membrane comprises nickel.

17. The thermal transpiration device of claim 12, wherein the second membrane comprises aluminum.

18. The thermal transpiration device of claim 12, wherein a support region is formed adjacent the active region for the at least one first and second membrane including the angled walls forming the at least one aperture.

19. The thermal transpiration device of claim 12, wherein the thermal insulator comprised a vacuum.

20. The thermal transpiration device of claim 12, wherein the thermal transpiration device comprises a Nano Molecular Solid-state Electrodynamic Thruster (NMSet) device.

* * * * *